(12) United States Patent
Oikawa et al.

(10) Patent No.: US 9,419,064 B2
(45) Date of Patent: Aug. 16, 2016

(54) METHOD FOR MANUFACTURING DISPLAY DEVICE

(71) Applicant: SEMICONDUCTOR ENERGY LABORATORY CO., LTD., Atsugi-shi, Kanagawa-ken (JP)

(72) Inventors: Yoshiaki Oikawa, Tochigi (JP); Kengo Akimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/661,031

(22) Filed: Mar. 18, 2015

(65) Prior Publication Data

US 2015/0194476 A1 Jul. 9, 2015

Related U.S. Application Data

(62) Division of application No. 11/382,420, filed on May 9, 2006, now Pat. No. 8,999,836.

(30) Foreign Application Priority Data

May 13, 2005 (JP) ................................ 2005-141899

(51) Int. Cl.
*H01L 27/32* (2006.01)
*H01L 51/52* (2006.01)
(Continued)

(52) U.S. Cl.
CPC ........ *H01L 27/3258* (2013.01); *H01L 27/3248* (2013.01); *H01L 51/5206* (2013.01);
(Continued)

(58) Field of Classification Search
CPC .............. H01L 2227/323; H01L 2251/306; H01L 2251/308; H01L 27/3258
USPC ....................................................... 257/59, 72
See application file for complete search history.

(56) References Cited

U.S. PATENT DOCUMENTS 5,917,279 A * 6/1999 Elschner ............... B82Y 20/00
                                                        313/502
6,056,614 A   5/2000 Adachi
(Continued)

FOREIGN PATENT DOCUMENTS

CN    001503604 A   6/2004
CN    001604696 A   4/2005
(Continued)

OTHER PUBLICATIONS

Office Action (Application No. 200610081967.2) Dated Oct. 24, 2008.
(Continued)

*Primary Examiner* — Mark Tornow
(74) *Attorney, Agent, or Firm* — Fish & Richardson P.C.

(57) ABSTRACT

It is an object of the present invention to provide a technique for manufacturing a highly reliable display device at low cost with high yield. A first electrode layer is formed by a sputtering method using a gas containing hydrogen or $H_2O$, an electroluminescent layer is formed over the first electrode layer, and a second electrode layer is formed over the electroluminescent layer. According to one aspect of the present invention, a display device is manufactured to include a first electrode layer including indium zinc oxide containing silicon oxide and tungsten oxide, an electroluminescent layer over the first electrode layer, and a second electrode layer over the electroluminescent layer, where the electroluminescent layer includes a layer containing an organic compound and an inorganic compound to be in contact with the first electrode layer.

10 Claims, 30 Drawing Sheets

(51) Int. Cl.
*H05B 33/10* (2006.01)
*H01L 51/50* (2006.01)

(52) U.S. Cl.
CPC ........ *H01L51/5215* (2013.01); *H01L 51/5218* (2013.01); *H01L 51/5221* (2013.01); *H01L 51/5234* (2013.01); *H05B 33/10* (2013.01); *H01L 51/506* (2013.01); *H01L 51/5076* (2013.01); *H01L 2227/323* (2013.01); *H01L 2251/306* (2013.01); *H01L 2251/308* (2013.01)

(56) References Cited

U.S. PATENT DOCUMENTS

| | | | |
|---|---|---|---|
| 6,222,314 | B1 | 4/2001 | Arai et al. |
| 6,512,504 | B1 | 1/2003 | Yamauchi et al. |
| 6,617,056 | B1 * | 9/2003 | Hara .................. C23C 14/0036 204/192.14 |
| 6,743,476 | B2 | 6/2004 | Hishida |
| 7,897,067 | B2 | 3/2011 | Inoue |
| 2001/0055841 | A1 | 12/2001 | Yamazaki et al. |
| 2002/0113241 | A1 | 8/2002 | Kubota et al. |
| 2002/0117962 | A1 | 8/2002 | Beierlein et al. |
| 2002/0153831 | A1 | 10/2002 | Sakakura et al. |
| 2003/0134149 | A1 | 7/2003 | Miyashita et al. |
| 2004/0040414 | A1 | 3/2004 | Abe |
| 2004/0072444 | A1 | 4/2004 | Park et al. |
| 2004/0171200 | A1 | 9/2004 | Maeda et al. |
| 2005/0052127 | A1 * | 3/2005 | Sakata ................ H01L 51/5088 313/506 |
| 2005/0073247 | A1 | 4/2005 | Yamazaki et al. |
| 2005/0093432 | A1 | 5/2005 | Yamazaki et al. |
| 2005/0230684 | A1 * | 10/2005 | Seo ..................... H01L 27/3248 257/72 |
| 2006/0091397 | A1 | 5/2006 | Akimoto et al. |
| 2007/0170434 | A1 | 7/2007 | Inoue et al. |
| 2007/0262705 | A1 | 11/2007 | Fukuda et al. |

FOREIGN PATENT DOCUMENTS

| | | |
|---|---|---|
| EP | 1626416 A | 2/2006 |
| EP | 1724790 A | 11/2006 |
| JP | 2000-056321 A | 2/2000 |
| JP | 2002-057162 A | 2/2002 |
| JP | 2003-016858 A | 1/2003 |
| JP | 2003-100154 A | 4/2003 |
| JP | 2005-258115 A | 9/2005 |
| WO | WO-2004/105054 | 12/2004 |

OTHER PUBLICATIONS

Zeng.K et al., "Investigation of mechanical properties of transparent conducting oxide thin films", Thin Solid Films, 2003, vol. 443, No. 1-2, pp. 60-65, Elsevier.

* cited by examiner

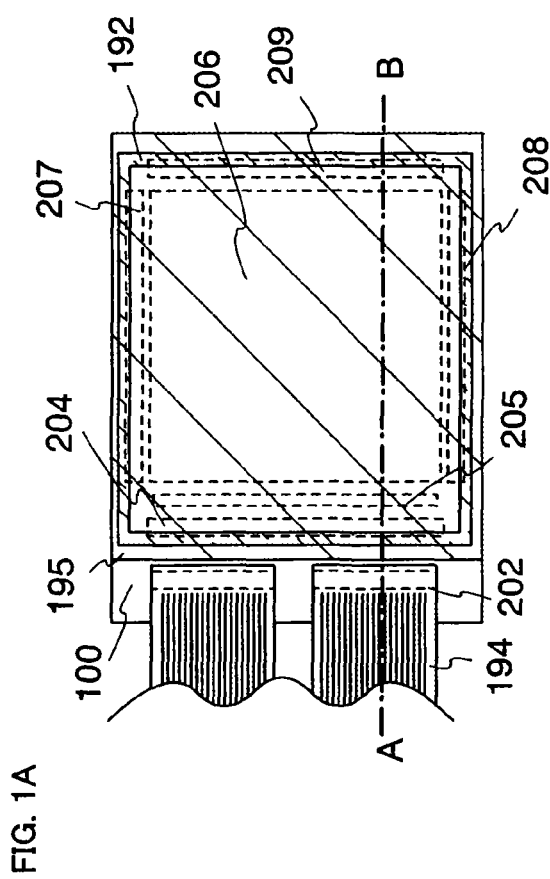
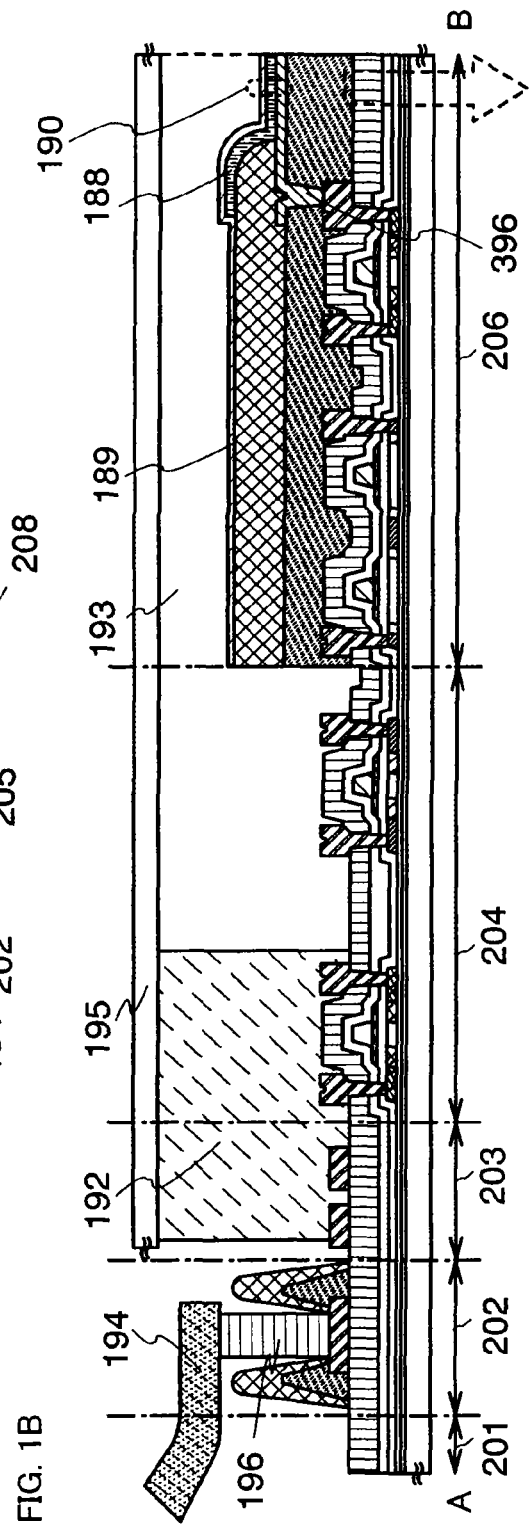
FIG. 1A
FIG. 1B

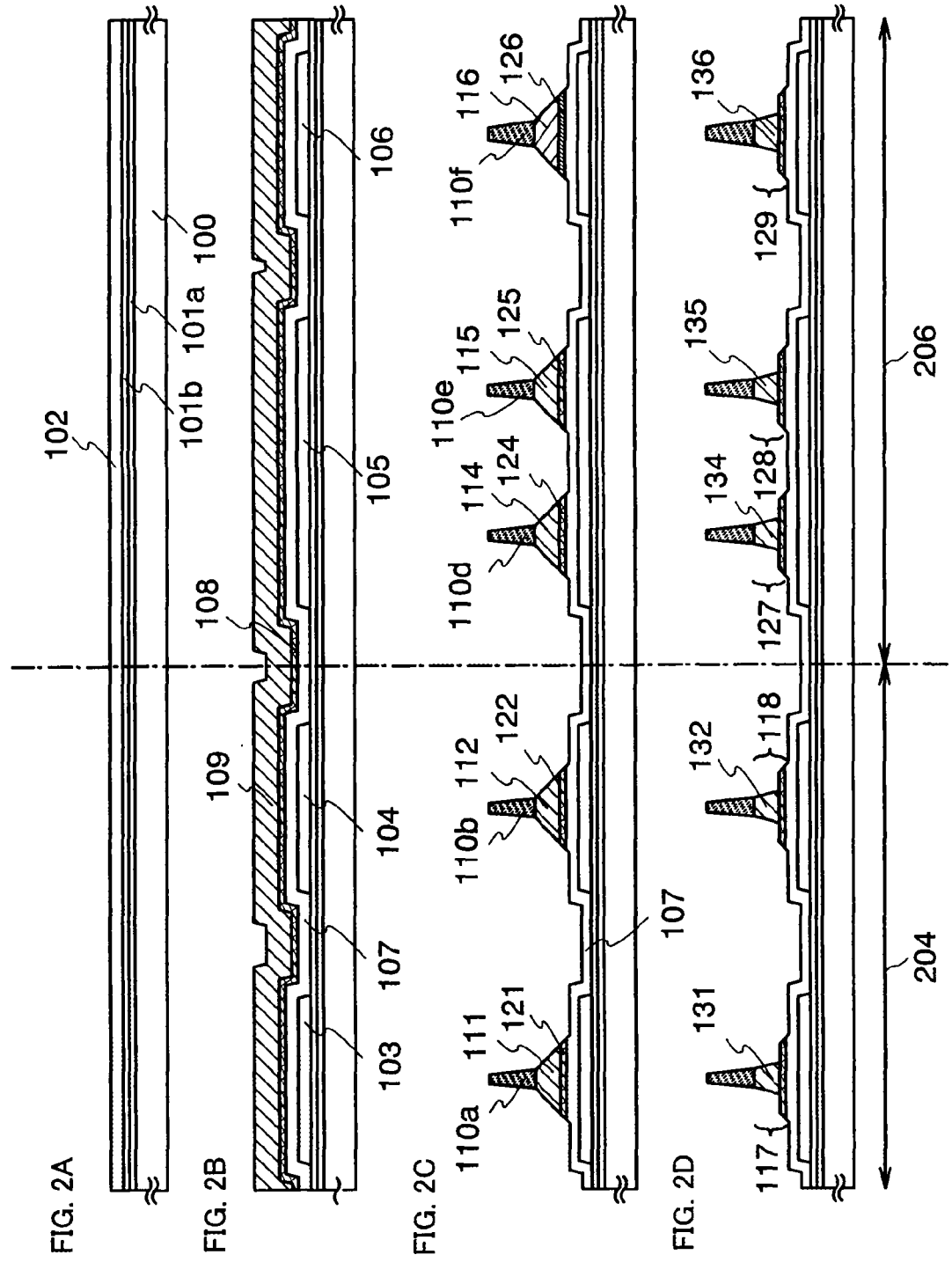

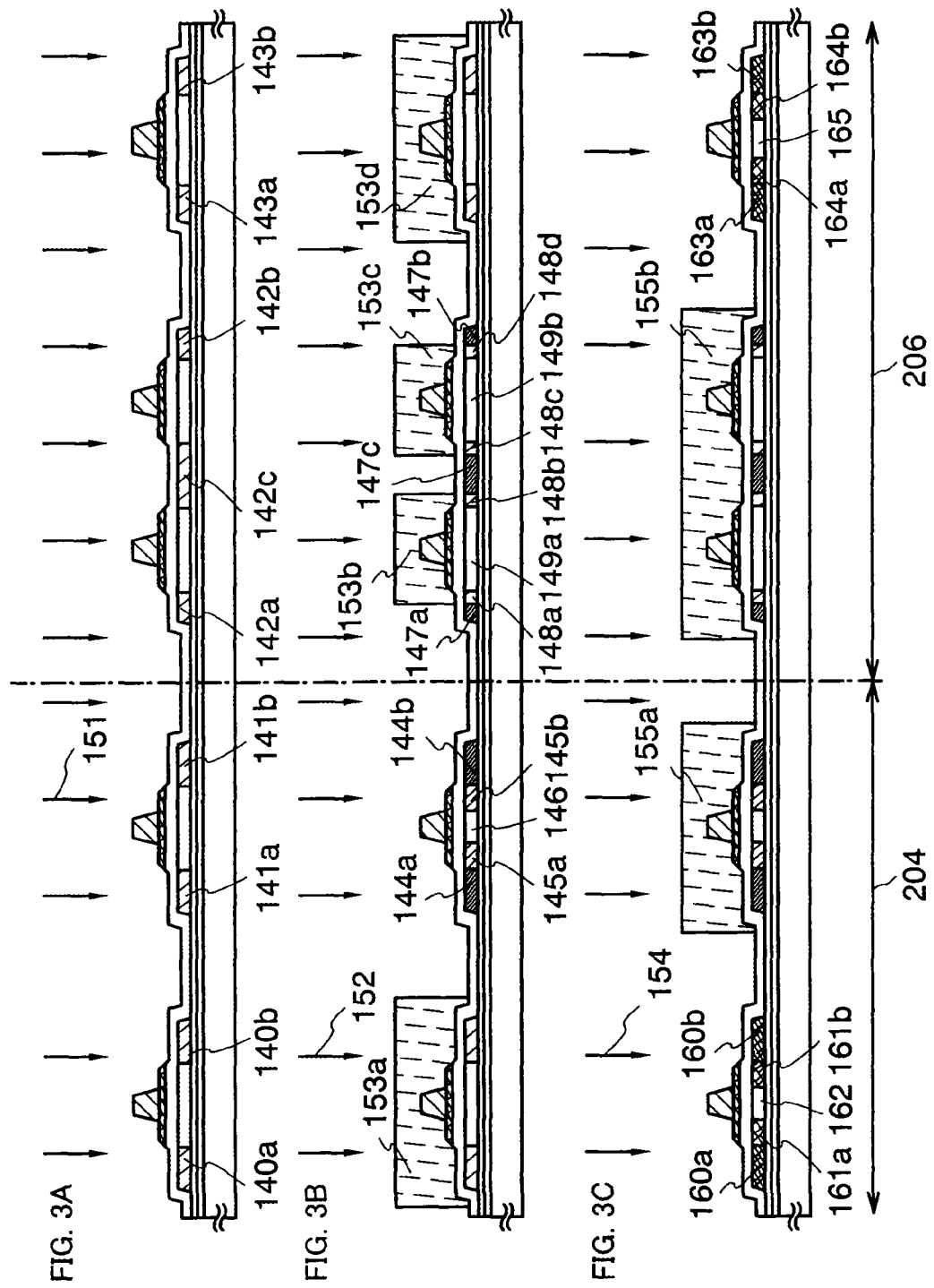

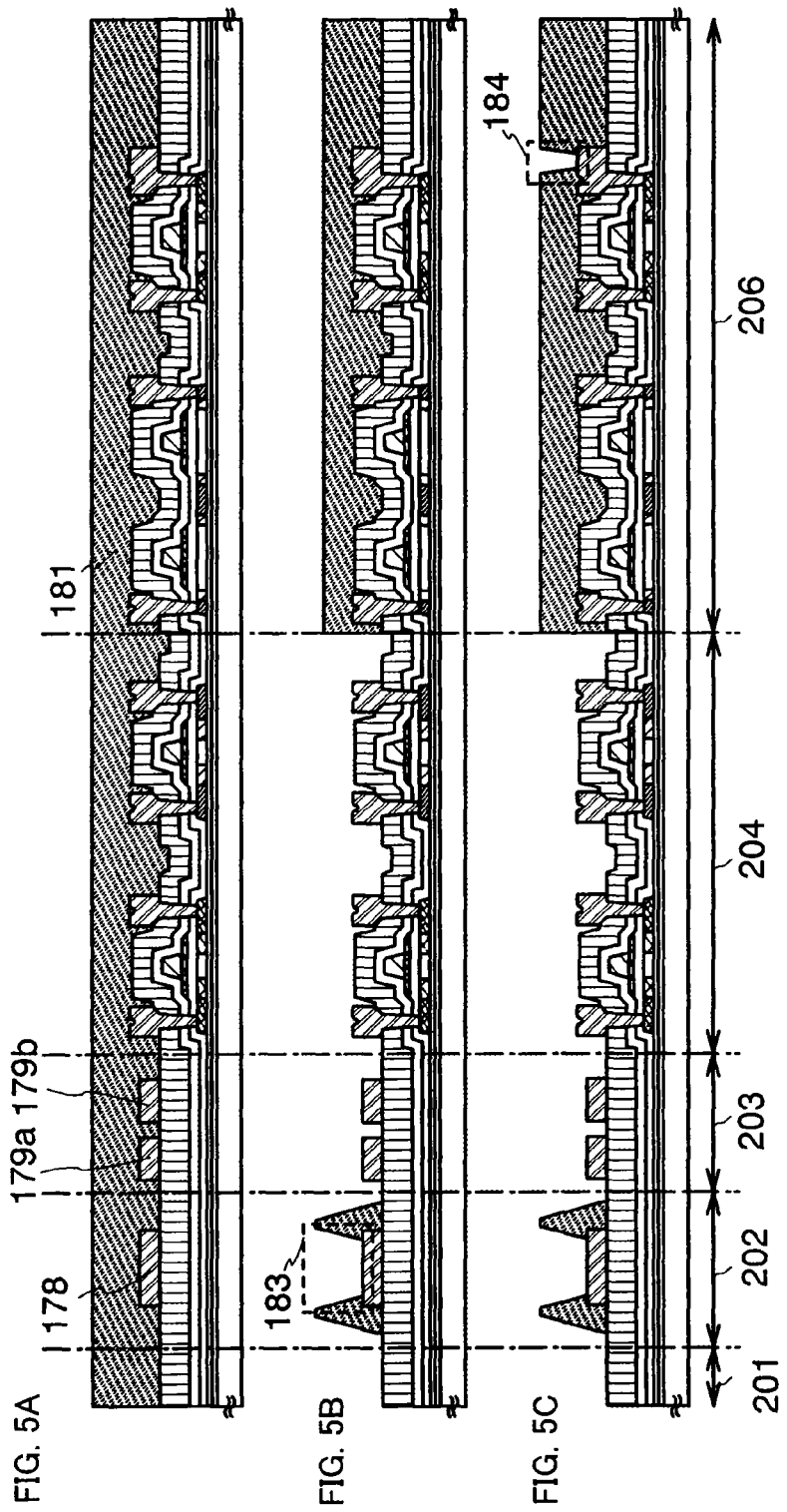

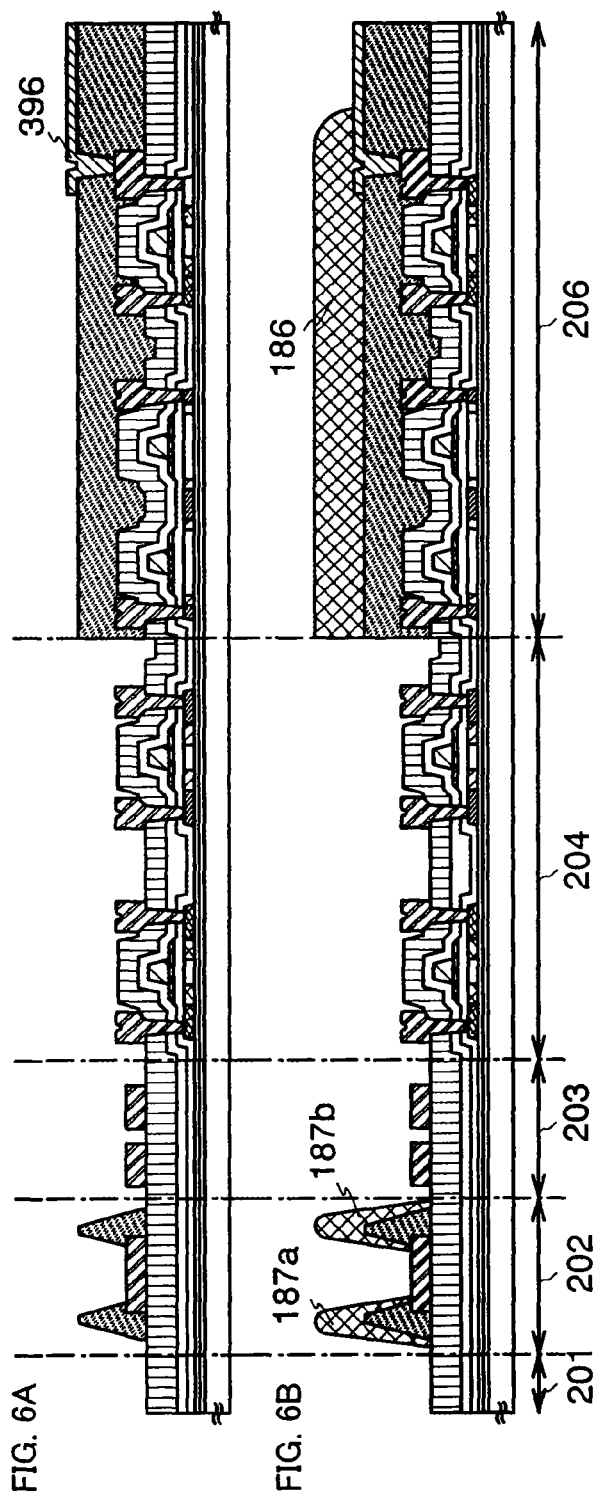

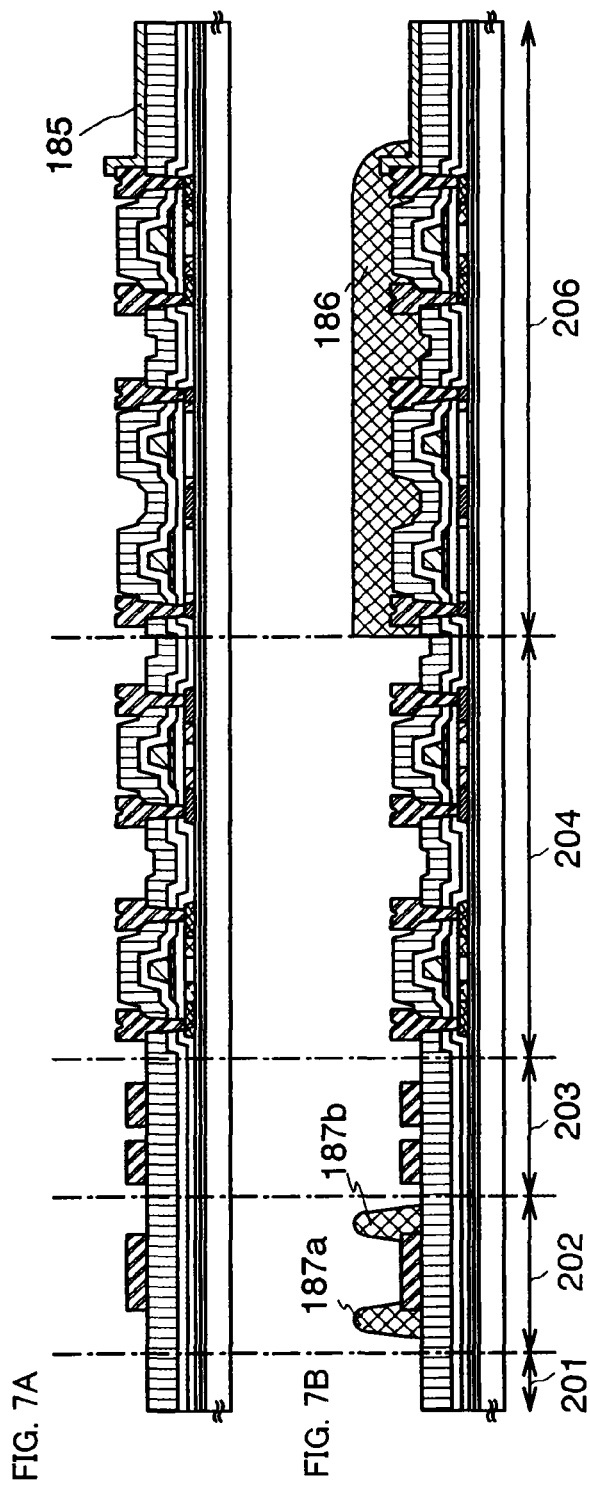

METHOD FOR MANUFACTURING DISPLAY DEVICE

CROSS-REFERENCE TO RELATED APPLICATIONS

This application is a divisional of U.S. application Ser. No. 11/382,420, filed May 9, 2006, now allowed, which claims the benefit of a foreign priority application filed in Japan as Serial No. 2005-141899 on May 13, 2005, both of which are incorporated by reference.

BACKGROUND OF THE INVENTION

1. Field of the Invention

The present invention relates to a method for manufacturing a display device.

2. Description of the Related Art

In recent years, a liquid crystal display device and an electroluminescence display device, in which a thin film transistor (hereinafter also referred to as a TFT) is integrated over a glass substrate, have been developed. In each of these display devices, a thin film transistor is formed over a glass substrate by using a technique for forming a thin film, and a liquid crystal element or a light-emitting element (an electroluminescence element, hereinafter also referred to as an EL element) is formed as a display element over various circuits composed of the thin film transistors so that the device functions as a display device.

A TFT and a display element are electrically connected to each other by stacking a pixel electrode of the display element and a wiring connected to a source region or a drain region of the TFT. Further, in order to transmit light emitted from a display device, a light-transmitting electrode is used as a pixel electrode (see, for example, the Patent Document 1).

[Patent Document 1]

Japanese Patent Application Laid-Open No.: 2002-57162

SUMMARY OF THE INVENTION

It is an object of the present invention to provide a technique for manufacturing a display device having high reliability and excellent electric characteristics with high yield without complicating steps and apparatuses.

In the present invention, as a light-transmitting electrode, an indium zinc oxide film containing tungsten oxide is formed by using a gas containing an $H_2O$ gas or an $H_2$ gas, and thus, a film can be obtained, which has high transmittance in a visible light region, low resistivity, and favorable processability. In addition, silicon oxide may be contained in the indium zinc oxide film containing tungsten oxide in the present invention. By using such a film for a pixel electrode of a display device, a highly reliable display device can be manufactured, in which light extraction efficiency of a light-emitting element is favorable and defects due to an etching defect of an electrode or the like are suppressed.

As a display device to which the present invention can be applied, a light-emitting display device is given, in which a light-emitting element and a TFT are connected, where the light-emitting element includes a layer containing an organic material or an inorganic material exhibiting light emission called electroluminescence (hereafter also referred to as EL), or a mixture of an organic material and an inorganic material interposed between electrodes. In addition, a light-transmitting electrode layer shown in the present invention can also be applied to a liquid crystal display device using a liquid crystal material as a display element.

According to one aspect of the present invention, a method for manufacturing a display device includes the steps of forming a first electrode layer by a sputtering method using a gas containing hydrogen, forming an electroluminescent layer over the first electrode layer, and forming a second electrode layer over the electroluminescent layer.

According to another aspect of the present invention, a method for manufacturing a display device includes the steps of forming a first electrode layer by a sputtering method using a gas containing water, forming an electroluminescent layer over the first electrode layer, and forming a second electrode layer over the electroluminescent layer.

According to another aspect of the present invention, a method for manufacturing a display device includes the steps of forming an indium zinc oxide film containing tungsten oxide by a sputtering method using a gas containing hydrogen, forming a first electrode layer by processing the indium zinc oxide film containing tungsten oxide, forming an electroluminescent layer over the first electrode layer, and forming a second electrode layer over the electroluminescent layer.

According to another aspect of the present invention, a method for manufacturing a display device includes the steps of forming an indium zinc oxide film containing tungsten oxide by a sputtering method using a gas containing water, forming a first electrode layer by processing the indium zinc oxide film containing tungsten oxide, forming an electroluminescent layer over the first electrode layer, and forming a second electrode layer over the electroluminescent layer.

According to another aspect of the present invention, a method for manufacturing a display device includes the steps of forming an indium zinc oxide film containing silicon oxide and tungsten oxide by a sputtering method using a gas containing hydrogen, forming a first electrode layer by processing the indium zinc oxide film containing silicon oxide and tungsten oxide, forming an electroluminescent layer over the first electrode layer, and forming a second electrode layer over the electroluminescent layer.

According to another aspect of the present invention, a method for manufacturing a display device includes the steps of forming an indium zinc oxide film containing silicon oxide and tungsten oxide by a sputtering method using a gas containing water, forming a first electrode layer by processing the indium zinc oxide film containing silicon oxide and tungsten oxide, forming an electroluminescent layer over the first electrode layer, and forming a second electrode layer over the electroluminescent layer.

According to another aspect of the present invention, a method for manufacturing a display device includes the steps of forming a first electrode layer, forming an electroluminescent layer over the first electrode layer, and forming a second electrode layer over the electroluminescent layer by a sputtering method using a gas containing hydrogen.

According to another aspect of the present invention, a method for manufacturing a display device includes the steps of forming a first electrode layer, forming an electroluminescent layer over the first electrode layer, and forming a second electrode layer over the electroluminescent layer by a sputtering method using a gas containing water.

According to another aspect of the present invention, a method for manufacturing a display device includes the steps of forming a first electrode layer, forming an electroluminescent layer over the first electrode layer, forming an indium zinc oxide film containing tungsten oxide over the electroluminescent layer by a sputtering method using a gas containing hydrogen, and forming a second electrode layer by processing the indium zinc oxide film containing tungsten oxide.

According to another aspect of the present invention, a method for manufacturing a display device includes the steps of forming a first electrode layer, forming an electroluminescent layer over the first electrode layer, forming an indium zinc oxide film containing tungsten oxide over the electroluminescent layer by a sputtering method using a gas containing water, and forming a second electrode layer by processing the indium zinc oxide film containing tungsten oxide.

According to another aspect of the present invention, a method for manufacturing a display device includes the steps of forming a first electrode layer, forming an electroluminescent layer over the first electrode layer, forming an indium zinc oxide film containing silicon oxide and tungsten oxide over the electroluminescent layer by a sputtering method using a gas containing hydrogen, and forming a second electrode layer by processing the indium zinc oxide film containing silicon oxide and tungsten oxide.

According to another aspect of the present invention, a method for manufacturing a display device includes the steps of forming a first electrode layer, forming an electroluminescent layer over the first electrode layer, forming an indium zinc oxide film containing silicon oxide and tungsten oxide over the electroluminescent layer by a sputtering method using a gas containing water, and forming a second electrode layer by processing the indium zinc oxide film containing silicon oxide and tungsten oxide.

According to another aspect of the present invention, a display device includes a first electrode layer including indium zinc oxide containing silicon oxide and tungsten oxide, an electroluminescent layer over the first electrode layer, and a second electrode layer over the electroluminescent layer, where the electroluminescent layer includes a layer containing an organic compound and an inorganic compound to be in contact with the first electrode layer.

According to another aspect of the present invention, a display device includes a first electrode layer, an electroluminescent layer over the first electrode layer, and a second electrode layer including indium zinc oxide containing silicon oxide and tungsten oxide over the electroluminescent layer, where the electroluminescent layer includes a layer containing an organic compound and an inorganic compound to be in contact with the first electrode layer.

According to another aspect of the present invention, a display device includes a conductive film having reflectivity, a first electrode layer including indium zinc oxide containing silicon oxide and tungsten oxide over the conductive film, an electroluminescent layer over the first electrode layer including indium zinc oxide containing silicon oxide and tungsten oxide, and a second electrode layer having a light-transmitting property over the electroluminescent layer, where the electroluminescent layer includes a layer containing an organic compound and an inorganic compound to be in contact with the first electrode layer.

By applying the present invention, a highly reliable display device can be manufactured. Therefore, a high-definition and high-image quality display device can be manufactured with high yield.

These and other objects, features and advantages of the present invention will become more apparent upon reading of the following detailed description along with the accompanied drawings.

BRIEF DESCRIPTION OF THE DRAWINGS

In the accompanying drawings:
FIGS. 1A and 1B are views each illustrating a display device according to the present invention;

FIGS. 2A to 2D are views each illustrating a manufacturing method of a display device according to the present invention;

FIGS. 3A to 3C are views each illustrating a manufacturing method of a display device according to the present invention;

FIGS. 5A to 5C are views each illustrating a manufacturing method of a display device according to the present invention;

FIGS. 6A and 6B are views each illustrating a manufacturing method of a display device according to the present invention;

FIGS. 7A and 7B are views each illustrating a manufacturing method of a display device according to the present invention;

DETAILED DESCRIPTION OF THE INVENTION

Figure 4A:
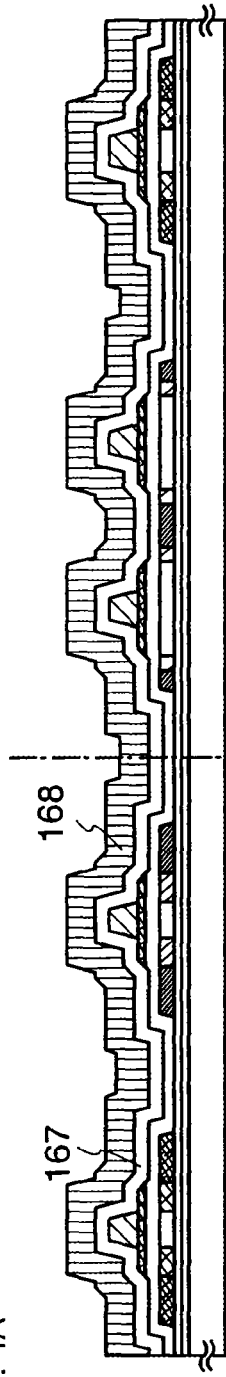
FIGS. 4A and 4B are views each illustrating a manufacturing method of a display device according to the present invention.

Embodiment Modes of the present invention will be described in detail with reference to the accompanying drawings. It is to be noted that the present invention is not limited to a following description, and it is to be easily understood by those skilled in the art that modes and details thereof can be modified in various ways without departing from the spirit and the scope of the invention. Therefore, the present invention should not be interpreted as being limited to the description of the embodiment modes to be given below. Further, in the structure of the present invention, the same reference numerals are used for the same portions or portions having the same functions in different drawings, and a repeated explanation thereof will be omitted.

Embodiment Mode 1

A method for manufacturing a display device in this embodiment mode will be described in detail with reference to FIGS. 1A and 1B, 2A to 2D, 3A to 3C, 4A and 4B, 5A to 5C, 6A and 6B, 10, 16A to 16C, 17A and 17B, 18A to 18D, and 24.

Figure 16A:
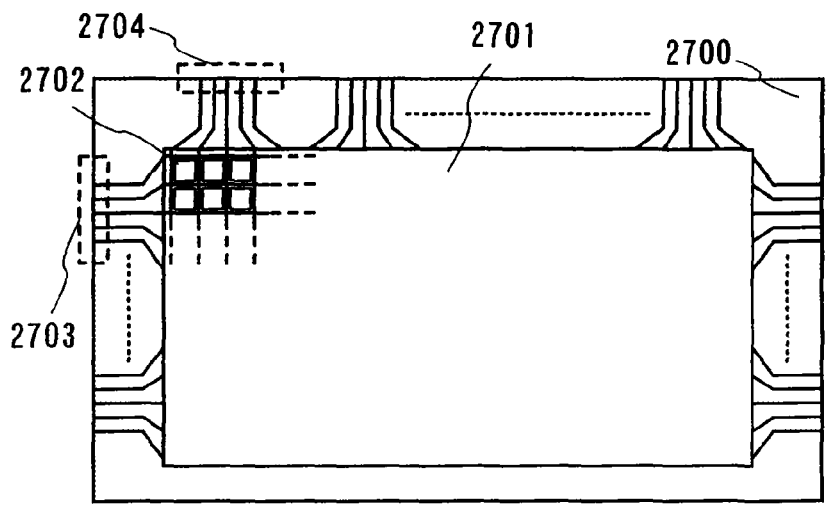
FIGS. 16A to 16C are top views of a display device according to the present invention.

FIG. 16A is a top view showing a structure of a display panel in accordance with the present invention, which includes a pixel portion 2701 in which pixels 2702 are arranged in matrix, a scanning line input terminal 2703, and a signal line input terminal 2704 over a substrate 2700 having an insulated surface. The number of pixels may be set depending on various standards, for example, 1024×768×3 (RGB) in a case of XGA, 1600×1200×3 (RGB) in a case of UXGA, and 1920×1080×3 (RGB) in a case of the use for a full spec high vision display.

The pixels 2702 are arranged in matrix by intersecting a scanning line extending from the scanning line input terminal 2703 and a signal line extending from the signal line input terminal 2704. Each of the pixels 2702 is provided with a switching element and a pixel electrode layer connected thereto. A typical example of the switching element is a TFT. A gate electrode layer side of the TFT is connected to the scanning line, and a source or drain side of the TFT is connected to the signal line, and thus, each pixel can be controlled independently by a signal inputted from the outside.

A TFT includes a semiconductor layer, a gate insulating layer and a gate electrode layer as its major components. Wiring layers connected to a source region and a drain region formed in the semiconductor layer are further provided. Typically known are a top gate structure in which, a semiconductor layer, a gate insulating layer, and a gate electrode layer are provided in this order from a substrate side, a bottom gate structure in which a gate electrode layer, a gate insulating layer, and a semiconductor layer are provided in this order from a substrate side, and the like, and the present invention may employ any of these structures.

Figure 17A:
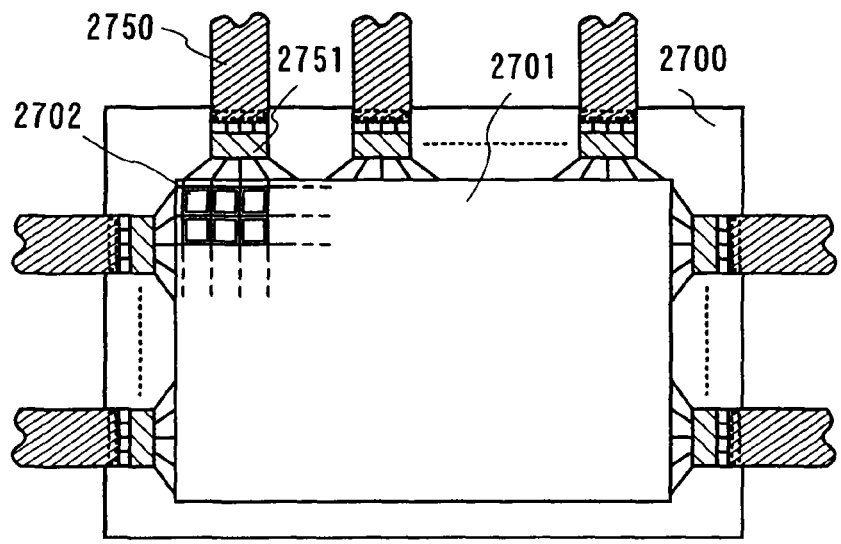
FIGS. 17A and 17B are top views of a display device according to the present invention.
Figure 17B:
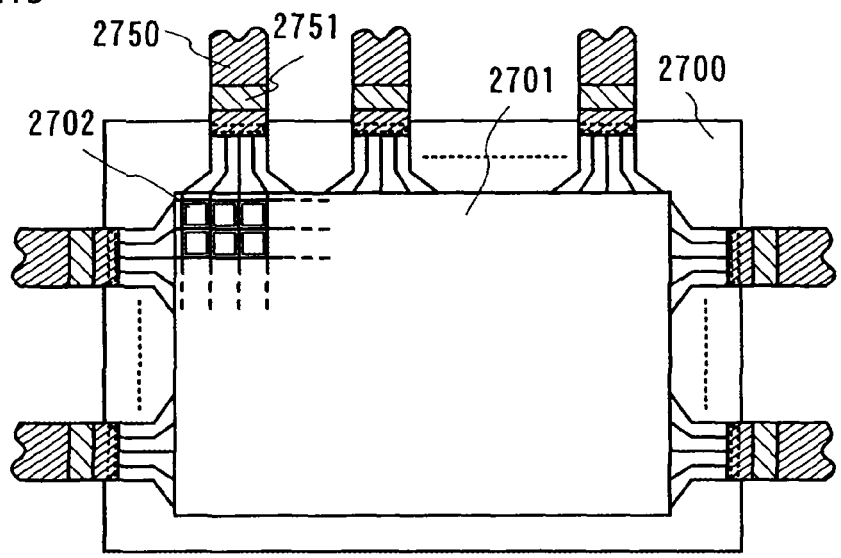

FIG. 16A shows a structure of a display panel in which a signal to be inputted to the scanning line and the signal line is controlled by an external driver circuit; however, a driver IC 2751 may also be mounted over the substrate 2700 by a COG (Chip On Glass) method as shown in FIG. 17A. Further, as another mode, a TAB (Tape Automated Bonding) method as shown in FIG. 17B may also be employed. A driver IC may be formed over a single crystal semiconductor substrate or a glass substrate by using a TFT. In FIGS. 17A and 17B, the driver IC 2751 is connected to an FPC (Flexible Printed Circuit) 2750.

Figure 16B:
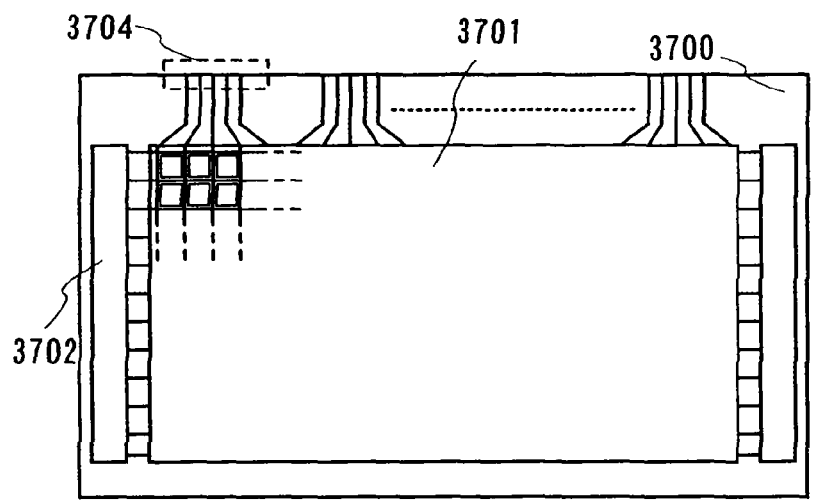
Figure 16C:
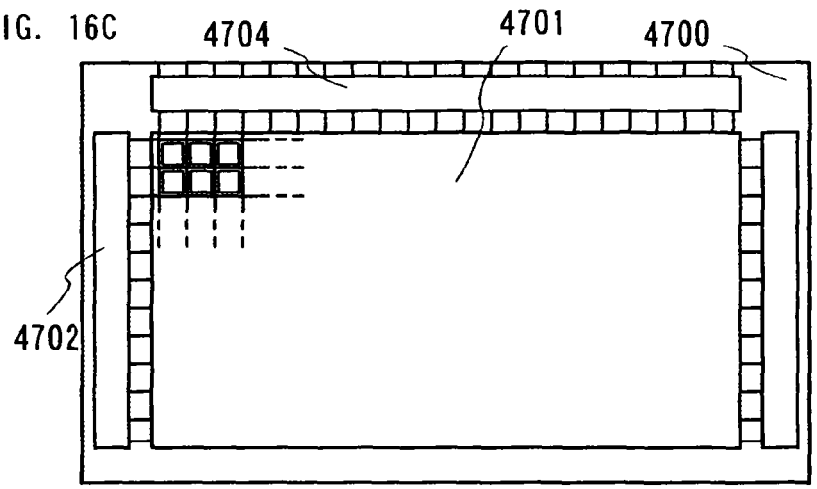

Further, in a case of forming a TFT provided in a pixel by using a crystalline semiconductor, a scanning line driver circuit 3702 may be formed over a substrate 3700 as shown in FIG. 16B. In FIG. 16B, a pixel portion 3701 is controlled by an external driver circuit, to which a signal line input terminal 3704 is connected, similarly to FIG. 16A. In a case of forming a TFT provided in a pixel by using a polycrystalline (microcrystalline) semiconductor, a single crystal semiconductor and the like with high mobility, a pixel portion 4701, a scanning line driver circuit 4702, and a signal line driver circuit 4704 can be formed to be integrated over a substrate 4700 as shown in FIG. 16C.

As shown in FIG. 2A, over a substrate 100 having an insulated surface, as a base film, a base film 101a is formed by using a silicon nitride oxide (SiNO) film to be 10 to 200 nm thick (preferably, 50 to 100 nm thick) and a base film 101b is stacked thereover by using a silicon oxynitride (SiON) film to be 50 to 200 nm thick (preferably, 100 to 150 nm thick) by a sputtering method, a PVD method (Physical Vapor Deposition), a CVD method (Chemical Vapor Deposition) such as a low pressure CVD method (LPCVD method) or a plasma CVD method, or the like. Alternatively, acrylic acid, methacrylic acid, or a derivative thereof, a heat-resistant high-molecular material such as polyimide, aromatic polyamide, or polybenzimidazole, or a siloxane resin may be used. Further, the following resin material may also be used: a vinyl resin such as poly(vinyl alcohol) or poly(vinyl butyral), an epoxy resin, a phenol resin, a novolac resin, an acrylic resin, a melamine resin, an urethane resin, or the like. In addition, an organic material such as benzocyclobutene, parylene, fluorinated arylene ether, or polyimide; a composite material containing a water-soluble homopolymer and a water-soluble copolymer; or the like may be used. As a method, a droplet-discharge method, a printing method (a method for forming a pattern, such as screen printing or offset printing), a coating method such as a spin coating method, a dipping method, or the like may also be used. In this embodiment mode, the base films 101a and 101b are formed by a plasma CVD method. The substrate 100 may be a glass substrate, a quartz substrate, a silicon substrate, a metal substrate, or a stainless steel substrate having a surface covered with an insulating film. Further, a plastic substrate having a heat resistant property or a flexible substrate such as a film which can resist a processing temperature of this embodiment mode may also be used. As a plastic substrate, a substrate formed of PET (polyethylene terephthalate), PEN (polyethylene naphthalate), or PES (polyether sulfone) may be used, and as a flexible substrate, a synthetic resin such as acrylic can be used. Since a display device manufactured in this embodiment mode has a structure in which light from a light-emitting element is extracted through the substrate 100, the substrate 100 is required to have a light-transmitting property.

As the base film, silicon oxide, silicon nitride, silicon oxynitride, silicon nitride oxide and the like may be used in a single layer structure or a stacked structure of two or three layers. It is to be noted that, in this specification, silicon oxynitride is a substance in which the composition ratio of oxygen is higher than that of nitrogen and can also be referred to as silicon oxide containing nitrogen. Similarly, silicon nitride oxide is a substance in which the composition ratio of nitrogen is higher than that of oxygen and can also be referred to as silicon nitride containing oxygen. In this embodiment mode, over the substrate, a silicon nitride oxide film is formed to be 50 nm thick using $SiH_4$, $NH_3$, $N_2O$, $N_2$, and $H_2$ as a reaction gas, and a silicon oxynitride film is formed to be 100 nm thick using $SiH_4$ and $N_2O$ as a reaction gas. Further, the silicon nitride oxide film may be formed to be 140 nm thick and the silicon oxynitride film to be stacked may be formed to be 100 nm thick.

Subsequently, a semiconductor film is formed over the base film. The semiconductor film may be formed by a sputtering method, an LPCVD method, a plasma CVD method or the like to be 25 to 200 nm thick (preferably, 30 to 150 nm thick). In this embodiment mode, it is preferable to use a crystalline semiconductor film formed by crystallizing an amorphous semiconductor film by laser irradiation.

A material for forming the semiconductor film can be an amorphous semiconductor (hereinafter also referred to as "AS") formed by a vapor deposition method or a sputtering method by using a semiconductor material gas typified by silane or germane, a polycrystalline semiconductor formed by crystallizing the amorphous semiconductor by using light energy or thermal energy, a semi-amorphous semiconductor (also referred to as microcrystal and hereinafter also referred to as "SAS"), or the like.

An SAS is a semiconductor having an intermediate structure between amorphous and crystalline (including single crystal and polycrystalline) structures and a third state which is stable in free energy. Moreover, an SAS includes a crystalline region with a short-distance order and lattice distortion. A crystal grain having a diameter of 0.5 to 20 nm can be observed at least in a portion of a film. In a case of containing silicon as a main component, Raman spectrum is shifted to the wave number side lower than 520 $cm^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and in addition, $Si_2H_6$, $SiH_2Cl_2$, $SiHCl_3$, $SiCl_4$, $SiF_4$ and the like can also be used. Further, $F_2$ and $GeF_4$ may be mixed. The gas containing silicon may be diluted with $H_2$, or $H_2$ and one or a plurality of rare gas elements selected from He, Ar, Kr, and Ne. The dilution ratio is 1:2 to 1:1000, pressure is approximately 0.1 to 133 Pa, and power supply frequency is 1 to 120 MHz, preferably, 13 to 60 MHz. A temperature for heating the substrate is preferably 300° C. or lower, and an SAS can also be formed at 100 to 200° C. It is preferable that a concentration of impurities of atmospheric components such as oxygen, nitrogen, and carbon as impurity elements in the film be $1 \times 10^{20}$ $cm^{-3}$ or lower. In particular, an oxygen concentration is preferably $5 \times 10^{19}$/$cm^3$ or lower, and more preferably, $1 \times 10^{19}$/$cm^3$ or lower. Further, when a rare gas element such as helium, argon, krypton, or neon is contained to further increase the lattice distortion, stability can be enhanced, and a favorable SAS can be obtained. Further, as the semiconductor film, an SAS layer formed by using a hydrogen-based gas may be stacked over an SAS layer formed by using a fluorine-based gas.

As an amorphous semiconductor, hydrogenated amorphous silicon may be typically used while polysilicon and the like may be typically used as a crystalline semiconductor. Polysilicon (polycrystalline silicon) includes so-called high temperature polysilicon formed by using polysilicon as a main material, which is formed at a processing temperature of 800° C. or higher; so-called low temperature polysilicon formed by using polysilicon as a main material, which is formed at a processing temperature of 600° C. or lower; polysilicon crystallized by adding an element which promotes crystallization; and the like. It is needless to say that a semi-amorphous semiconductor or a semiconductor containing a crystal phase in a portion of a semiconductor film may also be used as described above.

In a case of using a crystalline semiconductor film for the semiconductor film, the crystalline semiconductor film may be formed by various methods such as a laser crystallization method, a thermal crystallization method, and a thermal crystallization method using an element such as nickel which promotes crystallization. Further, a microcrystalline semiconductor that is an SAS may be crystallized by laser irradiation to enhance crystallinity. In a case where an element which promotes crystallization is not used, before irradiating the amorphous semiconductor film with laser light, the amorphous semiconductor film is heated for one hour in a nitrogen atmosphere at 500° C. to discharge hydrogen so that a hydrogen concentration in the amorphous semiconductor film becomes $1 \times 10^{20}$ atoms/$cm^3$ or lower. This is because, if the amorphous semiconductor film contains much hydrogen, the amorphous semiconductor film may be broken by laser light irradiation. Heat treatment for crystallization may be performed by using a heating furnace, laser irradiation, irradiation of light emitted from a lamp (also referred to as a lamp annealing), or the like. As a heating method, an RTA method such as a GRTA (Gas Rapid Thermal Anneal) method or an LRTA (Lamp Rapid Thermal Anneal) method may be used.

A method for introducing a metal element into the amorphous semiconductor film is not particularly limited as long as it is a method for introducing the metal element over a surface of or inside the amorphous semiconductor film. For example, a sputtering method, a CVD method, a plasma treatment method (including a plasma CVD method), an absorption method, or a method of coating a solution of metal salt can be used. Among them, a method of using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor film so as to diffuse an aqueous solution over the entire surface of the amorphous semiconductor film.

In order to obtain crystals having a large grain size, a continuous wave solid state laser is used, and irradiation of laser light of a second to fourth harmonic of the fundamental wave is performed. Typically, a second harmonic (532 nm) or a third harmonic (355 nm) of an Nd:$YVO_4$ laser (fundamental wave is 1064 nm) is desirably used. Specifically, laser light of the continuous wave $YVO_4$ laser is converted into a harmonic by using a non-linear optical element, thereby obtaining laser light having output of several W or more. It is preferable to form laser light into a rectangular or elliptical shape on an irradiated surface by an optical system for irradiating the semiconductor film. An energy density at this time is required to be about 0.001 to 100 MW/$cm^2$ (preferably, 0.1 to 10 MW/$cm^2$). The semiconductor film is irradiated with the laser light at a scanning rate of about 05 to 2000 cm/sec (preferably 10 to 200 cm/sec).

It is preferable that a shape of a laser beam be linear. Accordingly, throughput can be improved. Further, the semiconductor film may be irradiated with laser at an incident angle θ (0<θ<90°) with respect to the semiconductor film, thereby preventing an interference of the laser.

By scanning such laser and the semiconductor film relatively, laser irradiation can be performed. Further, in the laser irradiation, a marker may be formed to overlap beams with high precision and control positions for starting and finishing laser irradiation. The marker may be formed over the substrate at the same time when an amorphous semiconductor film is formed.

It is to be noted that the laser may be a continuous wave or pulsed gas laser, solid state laser, copper vapor laser, gold vapor laser, or the like. The gas laser includes an excimer laser, an Ar laser, a Kr laser, a He—Cd laser, and the like while the solid state laser includes a YAG laser, a $YVO_4$ laser, a YLF laser, a YAlO$_3$ laser, a Y$_2$O$_3$ laser, a glass laser, a ruby laser, an alexandrite laser, a Ti: sapphire laser, and the like.

The laser crystallization may be performed by a pulsed laser at a repetition rate of 0.5 MHz or higher, which is a drastically higher range of repetition rates than a generally used range of repetition rates of several ten to several hundred Hz. It is said that the time between irradiation of laser light to the semiconductor film and complete solidification of the semiconductor film is several ten to several hundred nsec in a pulsed laser. Therefore, the semiconductor film can be irradiated with the following pulsed laser light during the period from melting of the semiconductor film by laser light to solidification of the semiconductor film by using the foregoing range of repetition rates, Hence, since a solid-liquid interface can be continuously moved in the semiconductor film, a semiconductor film having crystal grains that have grown continuously in the scanning direction is formed. Specifically, an aggregate of crystal grains having a width of 10 to 30 μm in the scanning direction and a width of about 1 to 5 μm in a direction perpendicular to the scanning direction can be formed. By forming crystal grains of a single crystal extended long along the scanning direction, a semiconductor film which has almost no crystal boundary at least in a channel direction of a thin film transistor can be formed.

The semiconductor film may be irradiated with laser light in an inert gas atmosphere such as a rare gas or nitrogen as well. Accordingly, roughness of the surface of the semiconductor film can be prevented by laser irradiation, and variation of a threshold voltage due to variation of interface state density can be prevented.

An amorphous semiconductor film may be crystallized by a combination of heat treatment and laser light irradiation, or one of heat treatment and laser light irradiation may be performed plural times.

In this embodiment mode, a crystalline semiconductor film is formed by forming an amorphous semiconductor film over the base film 101b and crystallizing the amorphous semiconductor film. As the amorphous semiconductor film, amorphous silicon formed by using a reaction gas of SiH$_4$ and H$_2$ is used. In this embodiment mode, the base films 101a and 101b, and the amorphous semiconductor film are continuously formed by changing a reaction gas without breaking vacuum in the same chamber at the same temperature of 330° C.

After removing an oxide film formed over the amorphous semiconductor film, an oxide film is formed to be 1 to 5 nm thick by UV light irradiation in an oxygen atmosphere, a thermal oxidization method, treatment with ozone water containing hydroxyl radical or hydrogen peroxide solution, or the like. In this embodiment mode, Ni is used as an element which promotes crystallization. An aqueous solution containing 10 ppm of nickel acetate is coated by a spin coating method.

In this embodiment mode, after performing heat treatment by an RTA method at 750° C. for three minutes, the oxide film formed over the semiconductor film is removed and laser irradiation is performed. The amorphous semiconductor film is crystallized by the aforementioned crystallization treatment to form the crystalline semiconductor film.

In a case of performing crystallization by using a metal element, a gettering step is performed to reduce or remove the metal element. In this embodiment mode, the metal element is captured by using an amorphous semiconductor film as a gettering sink. First, an oxide film is formed over the crystalline semiconductor film by UV light irradiation in an oxygen atmosphere, a thermal oxidation method, treatment with ozone water containing hydroxyl radical or hydrogen peroxide, or the like. The oxide film is preferably made thick by heat treatment. Then, the amorphous semiconductor film is formed to be 50 nm thick by a plasma CVD method (a condition of this embodiment mode: 350 W and 35 Pa).

Thereafter, heat treatment is performed at 744° C. for three minutes by an RTA method to reduce or remove the metal element. Heat treatment may also be performed in a nitrogen atmosphere. Then, the amorphous semiconductor film as a gettering sink and an oxide film formed over the amorphous semiconductor film are removed by hydrofluoric acid or the like, thereby obtaining a crystalline semiconductor film 102 in which the metal element is reduced or removed (see FIG. 2A). In this embodiment mode, the amorphous semiconductor film as a gettering sink is removed by using TMAH (Tetramethyl Ammonium Hydroxide).

The semiconductor film obtained as described above may be doped with a slight amount of impurity elements (boron or phosphorus) for controlling a threshold voltage of a thin film transistor. This doping of impurity elements may be performed to the amorphous semiconductor film before the crystallization step. When the amorphous semiconductor film is doped with impurity elements, the impurities can also be activated by subsequent heat treatment for crystallization. Further, a defect and the like caused in doping can be improved as well.

Subsequently, the crystalline semiconductor film 102 is processed into a desired shape by using a mask. In this embodiment mode, after removing an oxide film formed over the crystalline semiconductor film 102, another oxide film is formed. Then, a photo mask is formed, and semiconductor layers 103, 104, 105, and 106 are formed by processing with a photolithography method.

An etching process may employ either plasma etching (dry etching) or wet etching. In a case of processing a large area substrate, plasma etching is more suitable. As an etching gas, a fluorine based gas or a chlorine based gas such as CF$_4$, NF$_3$, Cl$_2$, or BCl$_3$ is used, to which an inert gas such as He or Ar may be appropriately added. When an etching process by atmospheric pressure discharge is employed, local electric discharge can also be realized, which does not require a mask layer to be formed over the entire surface of the substrate.

In the present invention, a conductive layer for forming a wiring layer or an electrode layer, a mask layer for forming a predetermined pattern, or the like may be formed by a method capable of selectively forming a pattern, such as a droplet-discharge method. In the droplet-discharge (eject) method (also referred to as an inkjet method in accordance with the system thereof), liquid of a composition prepared for a specific purpose is selectively discharged (ejected) to form a predetermined pattern (a conductive layer, an insulating layer, or the like). At that time, treatment for controlling wettability or adhesion may be performed in a formation region. Additionally, a method for transferring or describing a pattern, for example, a printing method (a method for forming a pattern such as screen printing or offset printing) or the like can also be used.

In this embodiment mode, a resin material such as an epoxy resin, an acrylic resin, a phenol resin, a novolac resin, a melamine resin, or a urethane resin is used as a mask to be used. Alternatively, an organic material such as benzocyclobutene, parylene, fluorinated arylene ether, or polyimide having a light transmitting property; a compound material formed by polymerization of siloxane-based polymers or the like; a composition material containing a water-soluble homopolymer and a water-soluble copolymer; and the like can also be used. In addition, a commercially available resist material including a photosensitive agent may also be used.

For example, it is possible to use a typical positive resist, namely, a novolac resin and a naphthoquinonediazide compound that is a photosensitive agent; or a negative resist, namely, a base resin, diphenylsilanediol, and an acid generating agent. When a droplet-discharge method is used, the surface tension and the viscosity of a material are appropriately adjusted by controlling the solvent concentration, adding a surfactant, and the like.

The oxide film over the semiconductor layer is removed, and a gate insulating layer 107 covering the semiconductor layers 103, 104, 105, and 106 is formed. The gate insulating layer 107 is formed of an insulating film containing silicon in a thickness of 10 to 150 nm by a plasma CVD method, a sputtering method, or the like. The gate insulating layer 107 may be formed by using a material such as an oxide material or nitride material of silicon, typified by silicon nitride, silicon oxide, silicon oxynitride, and silicon nitride oxide, and may have a stacked layer structure or a single layer structure. Further, the insulating layer may be a stacked layer of three layers including a silicon nitride film, a silicon oxide film, and a silicon nitride film. A single layer or a stacked layer of two layers of a silicon oxynitride film may be employed as well. Preferably, a silicon nitride film with dense film quality may be used. A thin silicon oxide film may be formed between the semiconductor layer and the gate insulating layer, in a thickness of 1 to 100 nm, preferably 1 to 10 nm, and more preferably 2 to 5 nm. As a method for forming a thin silicon oxide film, the surface of the semiconductor region is oxidized by a GRTA method, an LRTA method, or the like to form a thermal oxide film, thereby forming a silicon oxide film in a thin thickness. It is to be noted that a rare gas element such as argon may be contained in a reaction gas and be mixed into an insulating film to be formed in order to form a dense insulating film having little gate leak current at a low film formation temperature. In this embodiment mode, a silicon oxynitride film is formed to be 115 nm thick as the gate insulating layer 107.

Subsequently, a first conductive film 108 having a thickness of 20 to 100 nm and a second conductive film 109 having a thickness of 100 to 400 nm, each of which serves as a gate electrode layer, are stacked over the gate insulating layer 107 (see FIG. 2B). The first conductive film 108 and the second conductive film 109 can be formed by a sputtering method, an evaporation method, a CVD method, or the like. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the element as a main component. A semiconductor film typified by a polycrystalline silicon film that is doped with an impurity element such as phosphorus or an AgPdCu alloy may also be used as the first conductive film 108 and the second conductive film 109. The conductive film is not limited to the two-layer structure, and for example, may have a three-layer structure in which a tungsten film of 50 nm thick as a first conductive film, an aluminum-silicon alloy (Al—Si) film of 500 nm thick as a second conductive film, and a titanium nitride film of 30 nm thick as a third conductive film are sequentially stacked. In a case of the three-layer structure, tungsten nitride may be used instead of tungsten as the first conductive film; an aluminum-titanium alloy (Al—Ti) film may be used instead of an aluminum-silicon (Al—Si) alloy film as the second conductive film; or a titanium film may be used instead of a titanium nitride film as the third conductive film as well. Further, a single-layer structure may also be used. In this embodiment mode, tantalum nitride (TaN) of 30 nm thick is formed as the first conductive film 108 and tungsten (W) of 370 nm thick is formed as the second conductive film 109.

Then, masks 110a, 110b, 110d, 110e and 110f are formed of a resist by a photolithography method, and the first conductive film 108 and the second conductive film 109 are processed into a desired shape to form first gate electrode layers 121, 122, 124, 125 and 126, and conductive layers 111, 112, 114, 115, and 116 (see FIG. 2C). The first gate electrode layers 121, 122, 124, 125, and 126, and the conductive layers 111, 112, 114, 115, and 116 can be etched to have a desired taper shape by appropriately adjusting an etching condition (the amount of electric power applied to a coil-shaped electrode, the amount of electric power applied to an electrode on a substrate side, an electrode temperature on a substrate side, and the like) by an ICP (Inductively Coupled Plasma) etching method. Further, an angle and the like of the taper shape can also be controlled by the shapes of the masks 110a, 110b, 110d, 110e and 110f. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used. In this embodiment mode, the second conductive film 109 is etched using an etching gas containing $CF_4$, $Cl_2$, and $O_2$, and then, the first conductive film 108 is continuously etched using an etching gas containing $CF_4$ and $Cl_2$.

Subsequently, the conductive layers 111, 112, 114, 115, and 116 are processed into a desired shape using the masks 110a, 110b, 110d, 110e and 110f. At this time, the conductive layers are etched with an etching condition of high selection ratio of the second conductive film 109 which forms the conductive layers with respect to the first conductive film 108 which forms the first gate electrode layers. By this etching, the conductive layers 111, 112, 114, 115, and 116 are etched to form second gate electrode layers 131, 132, 134, 135, and 136. In this embodiment mode, the second gate electrode layers also have a taper shape, in which a taper angle is larger than that of the first gate electrode layers 121, 122, 124, 125, and 126. It is to be noted that the taper angle is an angle of the side surface with respect to the surface of the first gate electrode layer, the second gate electrode layer, and the conductive layer. Accordingly, when the taper angle is increased to 90°, the conductive layer has a perpendicular side surface. In this embodiment mode, the second gate electrode is formed by using an etching gas of $Cl_2$, $SF_6$, and $O_2$.

In this embodiment mode, each of the first gate electrode layers, the conductive layers, and the second gate electrode layers is formed to have a taper shape, and thus, both of the two gate electrode layers have taper shapes. However, the present invention is not limited thereto, and one of the gate electrode layers may have a taper shape while the other has a perpendicular side surface by anisotropic etching. As described in this embodiment mode, the taper angles may be different or the same between the stacked gate electrode layers. With a taper shape, coverage of a film to be stacked thereover is improved and a defect is reduced, and thus, reliability is enhanced.

Through the aforementioned steps, a gate electrode layer 117 formed of the first gate electrode layer 121 and the second gate electrode layer 131, and a gate electrode layer 118 formed of the first gate electrode layer 122 and the second gate electrode layer 132 can be formed in a peripheral driver circuit region 204; and a gate electrode layer 127 formed of the first gate electrode layer 124 and the second gate electrode layer 134, a gate electrode layer 128 formed of the first gate electrode layer 125 and the second gate electrode layer 135, and a gate electrode layer 129 formed of the first gate electrode layer 126 and the second gate electrode layer 136 can be formed in a pixel region 206 (see FIG. 2D). In this embodiment mode, the gate electrode layers are formed by dry etching; however, wet etching may also be employed.

The gate insulating layer 107 may be etched to some extent and reduced in thickness (so-called film decrease) by the etching step for forming the gate electrode layers.

By forming a width of the gate electrode layer to be narrow, a thin film transistor capable of high speed operation can be formed. Two methods for forming a width of the gate electrode layer in a channel direction to be narrow will be described below.

A first method is to form a mask for a gate electrode layer and then slim the mask in a width direction by etching, asking or the like to form a mask with a narrower width. By using the mask formed with a narrower width in advance, the gate electrode layer can also be formed in a shape with a narrower width.

A second method is to form a normal mask and then form a gate electrode layer using the mask. Then, the obtained gate electrode layer is narrowed in a width direction by conducting a side-etching. Accordingly, a gate electrode layer with a narrower width can be finally formed. Through the aforementioned steps, a thin film transistor with a short channel length can be formed, which can realize a thin film transistor capable of high speed operation.

Next, an impurity element 151 which imparts n-type conductivity is added using the gate electrode layers 117, 118, 127, 128, and 129 as masks to form first n-type impurity regions 140a, 140b, 141a, 141b, 142a, 142b, 142c, 143a, and 143b (see FIG. 3A). In this embodiment mode, doping is performed by using phosphine ($PH_3$) as a doping gas containing an impurity element (in the doping gas, $PH_3$ is diluted with hydrogen ($H_2$), and the ratio of $PH_3$ in the gas is 5%) with a gas flow rate of 80 sccm, a beam current of 54 µA/cm, an acceleration voltage of 50 kV, and a dose amount of $7.0 \times 10^{13}$ ions/cm$^2$. Here, doping is performed so that the impurity element which imparts n-type conductivity is contained in a concentration of about $1 \times 10^{17}$ to $5 \times 10^{18}$/cm$^3$ in the first n-type impurity regions 140a, 140b, 141a, 141b, 142a, 142b, 142c, 143a, and 143h. In this embodiment mode, phosphorus (P) is used as the impurity element which imparts n-type conductivity.

In this embodiment mode, regions of the impurity regions, which overlap with the gate electrode layers with the gate insulating layer interposed therebetween, are denoted as Lov regions. Further, regions of the impurity regions, which do not overlap with the gate electrode layers with the gate insulating layer interposed therebetween, are denoted as Loff regions. In FIGS. 3A to 3C, these regions are shown by hatching and blank spaces in the impurity regions. This does not mean that the blank spaces are not doped with impurity elements, but makes it easy to understand that the concentration distribution of the impurity element in these regions reflects the mask and the doping condition. It is to be noted that this is the same in other drawings of this specification.

Subsequently, as shown in FIG. 3B, masks 153a, 153b, 153c, and 153d which cover the semiconductor layer 103, a part of the semiconductor layer 105, and the semiconductor layer 106 are formed. By using the masks 153a, 153b, 153c, and 153d, and the second gate electrode layer 132 as masks, an impurity element 152 which imparts n-type conductivity is added to form second n-type impurity regions 144a and 144b, third n-type impurity regions 145a and 145b, second n-type impurity regions 147a, 147b and 147c, third n-type impurity regions 148a, 148b, 148c, and 148d. In this embodiment mode, doping is performed by using $PH_3$ as a doping gas containing an impurity element (in the doping gas, $PH_3$ is diluted with hydrogen ($H_2$), and the ratio of $PH_3$ in the gas is 5%) with a gas flow rate of 80 sccm, a beam current of 540 µA/cm, an acceleration voltage of 70 kV, and a dose amount of $5.0 \times 10^{15}$ ions/cm$^2$. Here, doping is performed so that each of the second n-type impurity regions 144a and 144b contains the impurity element which imparts n-type conductivity in a concentration of about $5 \times 10^{19}$ to $5 \times 10^{20}$/cm$^3$. The third n-type impurity regions 145a and 145b are formed to contain the impurity element which imparts n-type conductivity in almost the same concentration as the third n-type impurity regions 148a, 148b, 148c, and 148d, or a little higher concentration. Further, a channel formation region 146 is formed in the semiconductor layer 104, and channel formation regions 149a and 149b are formed in the semiconductor layer 105.

The second n-type impurity regions 144a, 144b, 147a, 147b, and 147c are high concentration n-type impurity regions which function as sources and drains. On the other hand, the third n-type impurity regions 145a, 145b, 148a, 148b, 148c, and 148d are low concentration impurity regions which function as LDD (Lightly Doped Drain) regions. The n-type impurity regions 145a and 145b overlapped with the first gate electrode layer 122 with the gate insulating layer 107 interposed therebetween are Lov regions which can relieve an electric field around a drain and suppress deterioration of an on current due to hot carriers. As a result, a thin film transistor capable of high speed operation can be formed. On the other hand, the third n-type impurity regions 148a, 148b, 148c, and 148d are formed in Loff regions which are not overlapped with the gate electrode layers 127 and 128, and can relieve an electric field around a drain and suppress deterioration due to hot carrier injection as well as reduce an off current. As a result, a semiconductor device with high reliability and low power consumption can be manufactured.

Subsequently, as shown in FIG. 3C, the masks 153a, 153b, 153c, and 153d are removed, and masks 155a and 155b which cover the semiconductor layers 104 and 105 are formed. An impurity element 154 which imparts p-type conductivity is added using the masks 155a and 155b, the gate electrode layers 117 and 129 as masks to form first p-type impurity regions 160a, 160b, 163a and 163b, and second p-type impurity regions 161a, 161b, 164a, and 164b. In this embodiment mode, boron (B) is used as an impurity element, and doping is performed using diborane ($B_2H_6$) as a doping gas containing an impurity element (in the doping gas, $B_2H_6$ is diluted with hydrogen ($H_2$), and the ratio of $B_2H_6$ in the gas is 15%) with a gas flow rate of 70 sccm, a beam current of 180 µA/cm, an acceleration voltage of 80 kV, and a dose amount of $2.0 \times 10^{15}$ ions/cm$^2$. Here, doping is performed so that the first p-type impurity regions 160a, 160b, 163a and 163b and the second p-type impurity regions 161a, 161b, 164a, and 164b contain the impurity element which imparts p-type conductivity in a concentration of about $1 \times 10^{20}$ to $5 \times 10^{21}$/cm$^3$. In this embodiment mode, the second p-type impurity regions 161a, 161b, 164a, and 164b are formed in a self-alignment manner by reflecting the shapes of the gate electrode layers 117 and 129 to contain the impurity element in a lower concentration than that of the first p-type impurity regions 160a, 160b, 163a, and 163b. Further, a channel formation region 162 is formed in the semiconductor layer 103 and a channel formation region 165 is formed in the semiconductor layer 106.

The first p-type impurity regions 160a, 160b, 163a, and 163b are high concentration p-type impurity regions and serve as sources and drains. On the other hand, the second p-type impurity regions 161a, 161b, 164a, and 164b are low concentration impurity regions which function as LDD (Lightly Doped Drain) regions. The second p-type impurity regions 161a, 161b, 164a, and 164b overlapped with the first gate electrode layers 121 and 126 with the gate insulating layer 107 interposed therebetween are Lov regions which can relieve an electric field around a drain and suppress deterioration of an on current due to hot carriers.

The masks 155a and 155b are removed by $O_2$ ashing or using a resist stripping solution, and the oxide film is also removed. After that, an insulating film, namely, a so-called sidewall may be formed so as to cover side surfaces of the gate electrode layers. The sidewall can be formed of an insulating film containing silicon by a plasma CVD method or a low pressure CVD (LPCVD) method.

In order to activate the impurity element, heat treatment, strong light irradiation, or laser light irradiation may be performed. At the same time as the activation, plasma damage to the gate insulating layer and plasma damage to an interface between the gate insulating layer and the semiconductor layer can be recovered.

Subsequently, an interlayer insulating layer which covers the gate electrode layers and the gate insulating layer is formed. In this embodiment mode, a stacked-layer structure of insulating films 167 and 168 is employed (see FIG. 4A). A silicon nitride oxide film is formed as the insulating film 167 to be 100 nm thick, and a silicon oxynitride film is formed as the insulating film 168 to be 900 nm thick to form a stacked-layer structure. Further, a stacked-layer structure of three layers may be employed by forming a silicon oxynitride film to be 30 nm thick, a silicon nitride oxide film to be 140 nm thick, and a silicon oxynitride film to be 800 nm thick to cover the gate electrode layers and the gate insulating layer. In this embodiment mode, the insulating films 167 and 168 are continuously formed by a plasma CVD method similarly to the base film. The insulating films 167 and 168 are not limited to the above materials and may be formed by using a silicon nitride film, a silicon nitride oxide film, a silicon oxynitride film, or a silicon oxide film by a sputtering method or a plasma CVD method. Alternatively, a single layer structure or a stacked-layer structure of three or more layers of other insulating film containing silicon may also be employed.

Further, heat treatment is performed in a nitrogen atmosphere at 300 to 550° C. for 1 to 12 hours, and the semiconductor layer is hydrogenated. Preferably, this step is performed at 400 to 500° C. Through this step, dangling bonds in the semiconductor layer are terminated by hydrogen contained in the insulating film 167 that is an interlayer insulating layer. In this embodiment mode, heat treatment is performed at 410° C. for one hour.

In addition, the insulating films 167 and 168 can also be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), and other substance containing an inorganic insulating material. A siloxane resin may also be used. The siloxane resin is a resin including a Si—O—Si bond. Siloxane has a skeleton structure formed of a bond of silicon (Si) and oxygen (O). As a substituent, an organic group containing at least hydrogen (for example, an alkyl group or aromatic hydrocarbon) or a fluoro group may be used. In addition, as a substituent, both of an organic group containing at least hydrogen and a fluoro group may also be used. Further, an organic insulating material such as polyimide, acrylic, polyamide, polyimide amide, resist, benzocyclobutene, or polysilazane may also be used. A coated film with a favorable planarity formed by a coating method may also be used.

Subsequently, contact holes (openings), which reach the semiconductor layers, are formed in the insulating films 167 and 168, and the gate insulating layer 107 using a mask made of a resist. Etching may be performed once or plural times in accordance with a selection ratio of a material to be used. In this embodiment mode, a first etching is performed to remove the insulating film 168 with a condition where a selection ratio of the insulating film 168 that is a silicon oxynitride film to the insulating film 167 that is a silicon nitride oxide film and the gate insulating layer 107 is high. Then, the insulating film 167 and the gate insulating layer 107 are removed by second etching to form openings, which reach the first p-type impurity regions 160a, 160b, 163a and 163b and the second n-type impurity regions 144a, 144b, 147a and 147b as source regions or drain regions. In this embodiment mode, the first etching is performed by wet etching whereas the second etching is performed by dry etching. A hydrofluoric acid-based solution such as a mixed solution of ammonium hydrogen fluoride and ammonium fluoride may be used as an etchant of wet etching. As an etching gas, $CHF_3$, $C_2F_6$, $C_2F_8$, $C_4F_8$, $C_5F_8$ or the like can be appropriately used, in addition to a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$. Further, an inert gas may be added to an etching gas to be used. As an inert element to be added, one or a plurality of elements selected from He, Ne, Ar, Kr, and Xe can be used.

A conductive film is formed so as to cover the openings, and the conductive film is etched to form source electrode layers or drain electrode layers 169a, 169b, 170a, 170b, 171a, 171b, 172a, and 172b, each of which is electrically connected to a part of each source region or drain region. The source electrode layer or the drain electrode layer can be formed by forming a conductive film by a PVD method, a CVD method, an evaporation method, or the like, and then, etching the conductive film into a desired shape. Further, a conductive film can be selectively formed in a predetermined position by a droplet-discharge method, a printing method, an electroplating method, or the like. Moreover, a reflow method or a damascene method may also be used. As a material for the source electrode layer or the drain electrode layer, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. A stacked structure of these materials may also be employed. In this embodiment mode, titanium (Ti) is formed to be 60 nm thick, a titanium nitride film is formed to be 40 nm thick, aluminum is formed to be 700 nm thick, and titanium (Ti) is formed to be 200 nm thick, and then, the stacked film is processed into a desired shape.

Figure 4B:
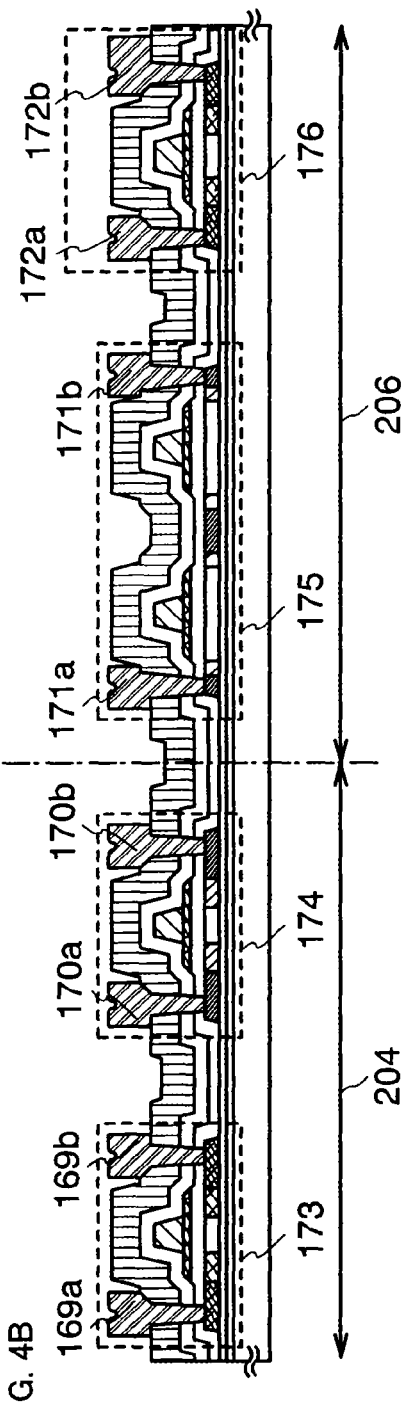
Figure 8:
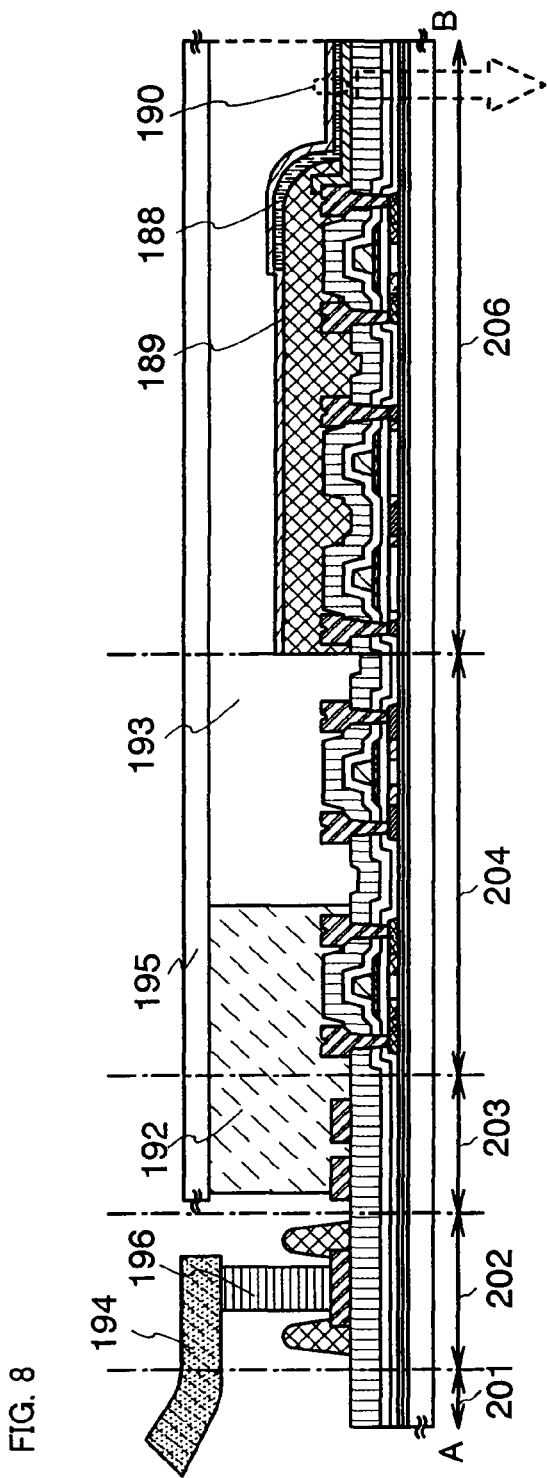
FIG. 8 is a view illustrating a display device according to the present invention.

Through the above steps, an active matrix substrate can be manufactured, in which a p-channel thin film transistor 173 having a p-type impurity region in a Lov region and an n-channel thin film transistor 174 having an n-type impurity region in a Lov region are provided in the peripheral driver circuit region 204; and a multi-channel type n-channel thin film transistor 175 having an n-type impurity region in a Loff region and a p-channel thin film transistor 176 having a p-type impurity region in a Lov region are provided in the pixel region 206 (see FIG. 4B).

The active matrix substrate can be used for a light-emitting device having a light-emitting element, a liquid crystal display device having a liquid crystal, and other display devices.

A structure of the thin film transistor in the pixel portion is not limited to this embodiment mode, and a single gate structure in which one channel formation region is formed, a double gate structure in which two channel formation regions are formed, or a triple gate structure in which three channel formation regions are formed may be employed. Further, the thin film transistor in the peripheral driver circuit region may also employ a single gate structure, a double gate structure, or a triple gate structure.

The present invention is not limited to be applied to a manufacturing method of the thin film transistor shown in this embodiment mode, and it may also be applied to a top gate type (a planar type), a bottom gate type (a reverse staggered type), or a dual gate type having two gate electrode layers which are arranged above and below a channel region with a gate insulating film interposed therebetween, or other structure.

Next, an insulating layer 181 is formed as a second interlayer insulating layer (see FIG. 5A). FIGS. 5A to 5C each show a manufacturing step of the display device, in which a separation region 201 for separation by scribing, an external terminal connection region 202 that is a portion where an FPC is attached, a wiring region 203 that is a lead wiring region for the peripheral region, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating layer 181 can be formed by using a material selected from silicon oxide, silicon nitride, silicon oxynitride, silicon nitride oxide, aluminum nitride (AlN), aluminum oxynitride (AlON), aluminum nitride oxide (AlNO) containing more nitrogen than oxygen, aluminium oxide, diamond like carbon (DLC), nitrogen-containing carbon (CN) film, PSG (phosphorus glass), BPSG (boron phosphorus glass), an alumina film, and other substance containing an inorganic insulating material. In addition, a siloxane resin may also be used. Further, a photosensitive or non-photosensitive organic insulating material such as polyimide, acrylic, polyamide, polyimide amide, resist, benzocyclobutene, polysilazane, or a Low-k material having a low dielectric constant may also be used.

In this embodiment mode, the interlayer insulating layer provided for planarization is required to have a high heat resistant property, a high insulating property, and high planarity. Thus, the insulating layer 181 is preferably formed by using a coating method typified by a spin coating method.

In this embodiment mode, as a material for the insulating layer 181, a coated film using a siloxane resin is used. The siloxane resin film after baking can resist heat treatment at 300° C. or higher.

The insulating layer 181 can be formed by using dipping, spray coating, a doctor knife, a roll coater, a curtain coater, a knife coater, a CVD method, an evaporation method, or the like. The insulating layer 181 may also be formed by a droplet-discharge method. In a case of using a droplet-discharge method, a material solution can be saved. In addition, a method capable of transferring or describing a pattern similarly to a droplet-discharge method, for example, a printing method (a method of forming a pattern such as screen printing or offset printing) can also be used.

Then, as shown in FIGS. 5B and 5C, an opening is formed in the insulating layer 181 that is the second interlayer insulating layer. The insulating layer 181 is required to be etched widely in a connection region (not shown in the drawing), the wiring region 203, the external terminal connection region 202, the separation region 201, and the like. However, in the pixel region 206, an opening area is much smaller compared with an opening area in the connection region and the like, and is minute. Therefore, by carrying out both of a photolithography step for forming the opening in the pixel region and a photolithography step for forming the opening in the connection region and the like, a margin of an etching condition can be wide. As a result, yield can be improved. Further, by a wide margin of the etching condition, the contact hole formed in the pixel region can be formed with high precision.

Specifically, a large area opening is formed in the insulating layer 181 provided in the connection region, the wiring region 203, the external terminal connection region 202, the separation region 201, and the peripheral driver circuit region 204. Therefore, a mask is formed to cover at least the insulating layer 181 in the pixel region 206. Etching can be performed by using a parallel plate RIE apparatus or an ICP etching apparatus. It is to be noted that etching time may be determined so that the wiring layer and the first interlayer insulating layer are over-etched. Under the condition where the wiring layer and the first interlayer insulating layer are over-etched, variation in thickness in the substrate and variation in etching rate can be reduced. In this manner, an opening 183 is formed in the external terminal connection region 202.

Thereafter, a minute opening, that is, a contact hole is formed in the insulating layer 181 in the pixel region 206 (see FIG. 5C). At this time, a mask for forming an opening in the pixel region 206 provided with a minute opening in a predetermined position is formed. As such a mask, for example, a resist mask can be used.

Then, the insulating layer 181 is etched by using a parallel plate RIE apparatus. It is to be noted that etching time may be determined so that the wiring layer and the first interlayer insulating layer are over-etched. Under the condition where the wiring layer and the first interlayer insulating layer are over-etched, variation in thickness in the substrate and variation in etching rate can be reduced.

Further, an ICP apparatus may also be used as the etching apparatus. Through the above steps, an opening 184 that reaches the source electrode layer or the drain electrode layer 172a is formed in the pixel region 206. In addition, the source electrode layer or the drain electrode layer connected to a first electrode layer can also be formed in a region in which many thin films are stacked and a total thickness is thick. In the thin film transistor in this embodiment mode, the source electrode layer or the drain electrode layer may be formed over the gate electrode layer. In this case, the opening 184 is not required to be opened with a deep thickness, thereby an opening step can be shortened to improve controllability. Further, since an electrode layer formed in the opening is not required to widely cover an opening with a large angle either, the electrode can be formed with excellent coverage and reliability can be improved.

In this embodiment mode, the case where the insulating layer 181 in the wiring region 203, the external terminal connection region 202, the separation region 201, and the insulating layer 181 in the peripheral driver circuit region 204 and the insulating layer 181 in the pixel region 206 are each processed by performing one etching step; however, the present invention is not limited thereto. For example, since the opening of the connection region has a large area, an amount of etching is large. Such an opening with a large area may be formed by performing etching plural times. Further, in the case of forming a deeper opening compared with other opening, etching may be performed plural times, similarly.

Further, in this embodiment mode, although the openings are formed in the insulating layer 181 by performing etchings separately plural times as shown in FIGS. 5B and 5C, the openings may also be formed by performing one etching step. In this case, etching is performed using an ICP apparatus with an ICP power of 7000 W, a bias power of 1000 W, pressure of 0.8 Pascal (Pa), and 240 sccm of $CF_4$ and 160 sccm $O_2$ as an etching gas. The bias power is preferably 1000 to 4000 W.

Since the openings can be formed by one etching step, there is an advantage that a step can be simplified.

Subsequently, a first electrode layer 396 (also referred to as a pixel electrode layer) is formed so as to be in contact with the source electrode layer or the drain electrode layer 172*a* or 172*b*.

In this embodiment mode, a light-emitting element is used as a display element, and the first electrode layer 396 has a light-transmitting property because light from the light-emitting element is extracted from the first electrode layer 396 side. The first electrode layer 396 is formed by using a light-transmitting conductive material.

In the present invention, the first electrode layer 396 that is a light-transmitting electrode layer may be specifically formed by using a transparent conductive film formed of a light-transmitting conductive material, and indium oxide containing tungsten oxide, indium zinc oxide containing tungsten oxide (hereinafter also referred to as an IWZO film), indium oxide containing titanium oxide, indium tin oxide containing titanium oxide, and the like can be used. (FIG. 6A)

Further, silicon oxide may be added into indium oxide containing tungsten oxide, indium zinc oxide containing tungsten oxide, indium oxide containing titanium oxide, and indium tin oxide containing titanium oxide. In a sputtering method where a thin film is formed by sputtering a target, unevenness called a nodule is generated on a target surface to which sputtering is performed. When a target having an uneven shape is used, a film with uniform composition cannot be formed, a large lump of a material is generated like a dust in the film, and a dense film cannot be obtained. When sputtering is performed by using a target in which silicon oxide is added into a transparent conductive material as described above, unevenness on the target surface can be reduced, and a uniform and dense film can be obtained. The ratio of the added silicon oxide is about 5 to 10 wt %.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

The first electrode layer 396 can be formed by an evaporation method, a sputtering method, or the like. In a case of using a sputtering method, a gas containing water (water vapor ($H_2O$)) or $H_2$ may be used as a gas. In this embodiment mode, as the first electrode layer 396, an indium zinc oxide film containing silicon oxide and tungsten oxide is formed by using indium zinc oxide containing tungsten oxide into which silicon oxide is added as a target by a sputtering method using a gas containing water ($H_2O$) or $H_2$. In this embodiment mode, silicon oxide is added into indium zinc oxide containing tungsten oxide by 10 wt %. The first electrode layer 396 may be formed in a total thickness range of 100 to 800 nm, and is 185 nm in this embodiment mode. In this embodiment mode, a gas containing 50 sccm of argon (Ar), 1.0 sccm of oxygen ($O_2$), and 0.2 sccm of $H_2$ is used. The gas containing water (vapor water ($H_2O$)) used in the present invention does not mean a gas containing water to some extent depending on a manufacturing method or a storage method, but a gas containing water as one of the main components. In case of using an $H_2O$ gas, the flow rate is preferably 0.5 sccm or less. The indium zinc oxide film containing silicon oxide and tungsten oxide formed in this embodiment mode has favorable processability, and can be etched without leaving a residue by wet etching using weak acid. When such a film is used for a pixel electrode of a display device, a highly reliable display device can be manufactured, in which light extraction efficiency of a light-emitting element is favorable, and defects due to an etching defect of an electrode or the like are suppressed. In addition, the first electrode layer 396 functions as an etching stopper in etching to form an insulating layer 186 functioning as a partition wall.

The surface of the first electrode layer 396 may be polished by a CMP method or by cleaning with a poly(vinyl alcohol) based porous body to be planarized. After polishing by a CMP method, ultraviolet ray irradiation, oxygen plasma treatment, or the like may be performed to the surface of the first electrode layer 396 so that the surface is reformed.

Heat treatment may be performed after forming the first electrode layer 396. By the heat treatment, moisture contained in the first electrode layer 396 is discharged. Accordingly, degasification or the like is not caused in the first electrode layer 396. Thus, even when a light-emitting material which is easily deteriorated by moisture is formed over the first electrode layer, the light-emitting material is not deteriorated; therefore, a highly reliable display device can be manufactured. In this embodiment mode, light is emitted by flowing a current through a layer containing an organic compound used as an electroluminescent layer, and thus, the layer is required to be thin to some extent. In this embodiment mode, the indium zinc oxide film containing silicon oxide and tungsten oxide is used for the first electrode layer 396 so that it is hardly crystallized even when baking is performed, and an amorphous state is kept. Hence, the first electrode layer 396 has high planarity, and short-circuit with a second electrode layer is hardly caused even when the layer containing an organic compound is thin.

In this embodiment mode, photosensitive polyimide is used for the insulating layer 186. When the insulating layer 186 is formed by using the same material and through the same step as the insulating layer 181, a manufacturing cost can be reduced. In addition, the cost can also be reduced when apparatuses such as a coating film forming apparatus and an etching apparatus can be used in common. (FIG. 6B)

The insulating layer 186 can be formed by using silicon oxide, silicon nitride, silicon oxynitride, aluminum oxide, aluminum nitride, aluminum oxynitride, or other inorganic insulating material; acrylic acid, methacrylic acid, or a derivative thereof; a heat-resistant high-molecular material such as polyimide, aromatic polyamide, or polybenzimidazole; or an insulating material such as a siloxane resin. Alternatively, the insulating layer 186 may be formed by using a photosensitive or non-photosensitive material such as acrylic or polyimide. The insulating layer 186 preferably has a shape where a radius of curvature continuously changes. Accordingly, coverage of an electroluminescent layer 188 and a second electrode layer 189 which are formed thereover is improved.

In a connection region 205 shown in FIG. 1A, a wiring layer formed by the same material and through the same step as the second electrode layer is electrically connected to a wiring layer formed by the same material and through the same step as the gate electrode layer. For this connection, an opening is formed to expose the wiring layer formed by the same material and through the same step as the gate electrode layer. A step around the opening is covered with the insulating layer 186 to be a gentle sloping, and thus, the coverage of the second electrode layer 189 to be stacked thereover can be improved.

Further, in order to further improve reliability, it is preferable to perform degasification of the substrate by vacuum heating before forming the electroluminescent layer 188. For example, before performing evaporation of an organic compound material, it is desirable to perform heat treatment for removing a gas contained in the substrate in a reduced pressure atmosphere or an inert gas atmosphere at 200 to 400° C., preferably 250 to 350° C. Further, it is preferable to form the electroluminescent layer 188 by a vacuum evaporation method or a droplet-discharge method under a reduced pressure without exposing the substrate to atmospheric air. By this heat treatment, moisture contained in or attached to a conductive film to be the first electrode layer or an insulating layer (partition wall) can be discharged. This heat treatment can be combined with a prior heating step as long as the substrate can be transferred in a vacuum chamber without breaking the vacuum, and only the prior heat treatment may be required to be performed once after forming an insulating layer (partition wall). Here, by forming the interlayer insulating film and the insulating layer (partition wall) using a highly heat resistant substance, a heat treatment step for improving the reliability can be sufficiently carried out.

The electroluminescent layer 188 is formed over the first electrode layer 396. Although only one pixel is shown in FIG. 1B, an electroluminescent layer corresponding to each color of R (red), G (green) and B (blue) is separately formed in this embodiment mode. The electroluminescent layer 188 may be manufactured as will be described later. By mixing an organic compound and an inorganic compound, layers having functions of a high carrier injecting property and a high carrier transporting property, which cannot be obtained when only one of an organic compound and an inorganic compound is used, are provided over the first electrode layer 396.

Materials (a low-molecular material, a high-molecular material, or the like), which show light-emission of red (R), green (G), and blue (B), can also be formed by a droplet-discharge method.

Subsequently, the second electrode layer 189 formed of a conductive film is provided over the electroluminescent layer 188. As the second electrode layer 189, a material having a low work function (In, Al, Ag, Li, Ca, or an alloy containing these metals such as MgAg, MgIn, AlLi, or $CaF_2$ or calcium nitride) may be used. In this manner, a light-emitting element 190 formed of the first electrode layer 396, the electroluminescent layer 188, and the second electrode layer 189 is formed.

A structure of the light-emitting element 190 which can be employed in this embodiment mode will be described in detail with reference to FIGS. 18A to 18D. In FIGS. 18A to 18D, a first electrode layer 870 corresponds to the first electrode layer 396 in FIG. 1B, an electroluminescent layer 860 corresponds to the electroluminescent layer 188, and a second electrode layer 850 corresponds to the second electrode layer 189.

FIGS. 18A to 18D show an element structure of the light-emitting element, in which the electroluminescent layer 860 formed by mixing an organic compound and an inorganic compound is interposed between the first electrode layer 870 and the second electrode layer 850. As shown in the drawings, the electroluminescent layer 860 is formed of a first layer 804, a second layer 803, and a third layer 802, and in particular, the first layer 804 and the third layer 802 have remarkable features.

The first layer 804 is a layer which has a function of transporting holes to the second layer 803, and includes at least a first organic compound and a first inorganic compound having an electron-accepting property with respect to the first organic compound. What is important is that the first organic compound and the first inorganic compound are not only simply mixed, but the first inorganic compound has an electron-accepting property with respect to the first organic compound. This structure generates a lot of hole-carriers in the first organic compound, which originally has almost no inherent carriers, and a highly excellent hole-injecting property and hole-transporting property can be obtained.

Therefore, as for the first layer 804, not only advantageous effect that is considered to be obtained by mixing an inorganic compound (such as improvement in a heat resistant property) but also excellent conductivity (in particular, a hole-injecting property and a hole-transporting property in the first layer 804) can be obtained. This excellent conductivity is advantageous effect that cannot be obtained in a conventional hole-transporting layer in which an organic compound and an inorganic compound that do not electronically interact with each other are simply mixed. This advantageous effect can make a drive voltage lower than conventionally. In addition, since the first layer 804 can be made thicker without causing increase in a drive voltage, short circuit of the element due to a dust and the like can be suppressed.

It is preferable to use a hole-transporting organic compound as the first organic compound since hole-carriers are generated in the first organic compound as described above. Examples of the hole-transporting organic compound include, but are not limited to, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. In addition, among the compounds mentioned above, aromatic amine compounds as typified by TDATA, MTDATA, m-MTDAB, TPD, NPB, DNTPD, and TCATA can easily generate hole-carriers, and are a suitable group of compounds for the first organic compound.

On the other hand, the first inorganic compound may be any material as long as the material can easily accept electrons from the first organic compound, and various kinds of metal oxide and metal nitride can be used. Transition metal oxide having a transition metal that belongs to any of Groups 4 to 12 of the periodic table is preferable since an electron-accepting property is easily provided. Specifically, titanium oxide, zirconium oxide, vanadium oxide, molybdenum oxide, tungsten oxide, rhenium oxide, ruthenium oxide, zinc oxide, and the like can be used. In addition, of the metal oxide mentioned above, many kinds of transition metal oxide having a transition metal that belongs to any of Groups 4 to 8 have a higher electron-accepting property, which are preferable groups of compounds. In particular, vanadium oxide, molybdenum oxide, tungsten oxide, and rhenium oxide are preferable since they can be formed by vacuum evaporation and can be easily used.

It is to be noted that the first layer 804 may be formed by stacking a plurality of layers each including a combination of the organic compound and the inorganic compound as described above, or may further include another organic compound or inorganic compound.

Next, the third layer 802 will be described. The third layer 802 is a layer which has a function of transporting electrons to the second layer 803, and includes at least a third organic compound and a third inorganic compound having an electron-donating property with respect to the third organic compound. What is important is that the third organic compound and the third inorganic compound are not only simply mixed but also the third inorganic compound has an electron-donating property with respect to the third organic compound. This structure generates a lot of electron-carriers in the third organic compound which has originally almost no inherent carriers, and a highly excellent electron-injecting and electron-transporting property can be obtained.

Therefore, as for the third layer 802, not only advantageous effect that is considered to be obtained by mixing an inorganic compound (such as improvement in a heat resistant property) but also excellent conductivity (in particular, an electron-injecting property and an electron-transporting property in the third layer 802) can also be obtained. This excellent conductivity is advantageous effect that cannot be obtained in a conventional electron-transporting layer in which an organic compound and an inorganic compound that do not electronically interact with each other are simply mixed. This advantageous effect can make a drive voltage lower than conventionally. In addition, since the third layer 802 can be made thick without causing increase in a drive voltage, short circuit of the element due to a dust and the like can be suppressed.

It is preferable to use an electron-transporting organic compound as the third organic compound since electron-carriers are generated in the third organic compound as described above. Examples of the electron-transporting organic compound include, but are not limited to, tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)(4-phenylphenolato)aluminum (abbreviation: BAlq), bis[2-(2'-hydroxyphenyl)benzoxazolato]zinc (abbreviation: Zn(BOX)$_2$), bis[2-(2'-hydroxyphenyl)benzothiazolato]zinc (abbreviation: Zn(BTZ)$_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. In addition, among the compounds mentioned above, chelate metal complexes having a chelate ligand including an aromatic ring as typified by Alq$_3$, Almq$_3$, BeBq$_2$, BAlq, Zn(BOX)$_2$, and Zn(BTZ)$_2$, organic compounds having a phenanthroline skeleton as typified by BPhen and BCP, and organic compounds having an oxadiazole skeleton as typified by PBD and OXD-7 can easily generate electron-carriers, and are suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable since an electron-donating property is easily provided. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable since they can be formed by vacuum evaporation and can be easily used.

It is to be noted that the third layer 802 may be formed by stacking a plurality of layers each including a combination of the organic compound and the inorganic compound as described above, or may further include another organic compound or inorganic compound.

Next, the second layer 803 will be described. The second layer 803 is a layer which has a function of emitting light, and includes a second organic compound that has a light-emitting property. A second inorganic compound may also be included. The second layer 803 can be formed by using various light-emitting organic compounds and inorganic compounds. However, since it is believed to be hard to flow a current through the second layer 803 as compared with the first layer 804 or the third layer 802, the thickness of the second layer 803 is preferably about 10 to 100 nm.

The second organic compound is not particularly limited as long as it is a light-emitting organic compound, and examples of the second organic compound include, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-N,C$^{2'}$]iridium(picolinate) (abbreviation: FIrpic), bis {2-[3',5'-bis(trifluoromethyl)phenyl]pyridinato-N,C$^{2'}$}iridium(picolinate) (abbreviation: Ir(CF$_3$ppy)$_2$(pic)), tris(2-phenylpyridinato-N,C$^{2'}$)iridium (abbreviation: Ir(ppy)$_3$), bis(2-phenylpyridinato-N,C$^{2'}$)iridium(acetylacetonate) (abbreviation: Ir(ppy)$_2$(acac)), bis[2-(2'-thienyl)pyridinato-N,C$^{3'}$]iridium(acetylacetonate) (abbreviation: Ir(thp)$_2$(acac)), bis(2-phenylquinolinato-N,C$^{2'}$)iridium (acetylacetonate) (abbreviation: Ir(pq)$_2$(acac)), or bis[2-(2'-benzothienyl)pyridinato-N,C$^{3'}$]iridium(acetylacetonate) (abbreviation: Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only small amount of current needs to be applied to a light-emitting element, and thus, reliability can be improved. A pixel emitting red light and a pixel emitting green light may be formed by using a triplet excitation light-emitting material and a pixel emitting blue light may be formed by using a singlet excitation light-emitting material to achieve low power consumption as well. Low power consumption can be further achieved by forming a light-emitting element emitting green light that has high visibility for human eyes by using a triplet excitation light-emitting material.

The second layer 803 may include not only the second organic compound as described above, which produces light-emission, but also another organic compound may also be added thereto. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl)phenyl]benzene (abbreviation: TCPB), and the like. It is preferable that the organic compound, which is added in addition to the second organic compound, have larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light and the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) by providing the light-emission side of the pixel with a filter which transmits light of an emission wavelength range of the light. By providing a filter, a circularly polarizing plate or the like that has been conventionally required can be omitted, and further, the loss of light emitted from the light-emitting layer can be eliminated. Moreover, change in a color tone, which occurs when a pixel portion (display screen) is obliquely seen, can be reduced.

Either a high-molecular organic light-emitting material or a low-molecular organic light-emitting material can be used for a material of the second layer 803. A high-molecular organic light-emitting material is physically stronger as compared with a low-molecular material and is superior in durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, or a polyfluorene-based material can be used.

As the polyparaphenylene-vinylene-based material, a derivative of poly(paraphenylenevinylene) [PPV] such as poly(2,5-dialkoxy-1,4-phenylenevinylene) [RO-PPV]; poly(2-(2'-ethyl-hexoxy)-5-methoxy-1,4-phenylenevinylene) [MEH-PPV]; or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP]; or poly(2,5-dihexoxy-1,4-phenylene) can be given. As the polythiophene-based material, a derivative of polythiophene [PT] such as poly(3-alkylthiophene) [PAT]; poly(3-hexylthiophene) [PHT]; poly(3-cyclohexylthiophen) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light-emission of the second organic compound is not easily quenched by the inorganic compound, and various kinds of metal oxide and metal nitride can be used. In particular, metal oxide having a metal that belongs to Group 13 or 14 of the periodic table is preferable since light-emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking a plurality of layers each including a combination of the organic compound and the inorganic compound as described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above described materials emits light by being forwardly biased. A pixel of a display device which is formed by using a light-emitting element can be driven by a simple matrix (passive matrix) mode or an active matrix mode. In any case, each pixel emits light by applying a forward bias thereto at a specific timing; however, the pixel is in a non-emitting state for a certain period. Reliability of a light-emitting element can be improved by applying a reverse bias in the non-emitting time. In a light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternating current driving where bias is applied forwardly and reversely, and thus, reliability of a light-emitting display device can be improved. Additionally, either digital driving or analog driving can be applied.

A color filter (colored layer) may be formed on a sealing substrate. The color filter (colored layer) can be formed by an evaporation method or a droplet-discharge method. With the use of the color filter (colored layer), high-definition display can be performed. This is because a broad peak can be modified to be sharp in an emission spectrum of each of R, G, and B by the color filter (colored layer).

Full color display can be performed by forming a material emitting light of a single color and combining with a color filter or a color conversion layer. The color filter (colored layer) or the color conversion layer may be formed over, for example, a second substrate (a sealing substrate) and may be attached to a substrate.

Obviously, display of a single color emission may also be performed. For example, an area color type display device may be manufactured by using single color emission. The area color type is suitable for a passive matrix display portion, and can mainly display characters and symbols.

Figure 18A:
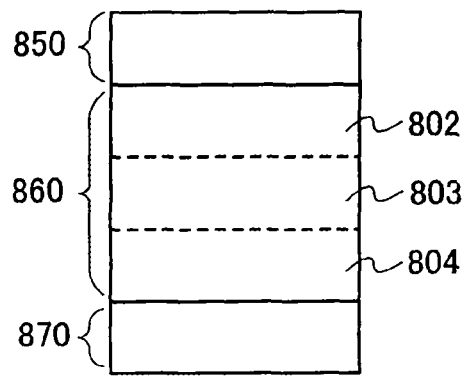
FIGS. 18A to 18D are views each illustrating a structure of a light-emitting element which can be applied to the present invention.
Figure 18B:
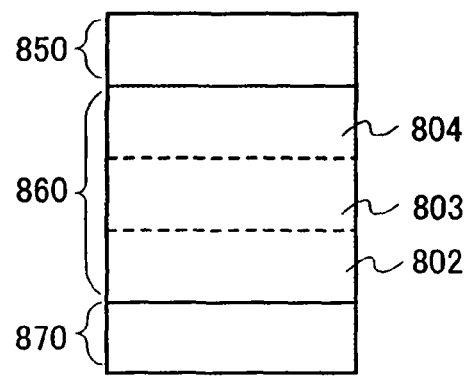

Materials of the first electrode layer 870 and the second electrode layer 850 are required to be selected considering the work function. The first electrode layer 870 and the second electrode layer 850 can be either an anode or a cathode depending on the pixel structure. In a case where polarity of a driving thin film transistor is a p-channel type, the first electrode layer 870 may serve as an anode and the second electrode layer 850 may serve as a cathode as shown in FIG. 18A. In a case where polarity of the driving thin film transistor is an n-channel type, the first electrode layer 870 may serve as a cathode and the second electrode layer 850 may serve as an anode as shown in FIG. 18B. Materials that can be used for the first electrode layer 870 and the second electrode layer 850 will be described. It is preferable to use a material having a higher work function (specifically, a material having a work function of 4.5 eV or higher) for one of the first electrode layer 870 and the second electrode layer 850, which serve as an anode, and a material having a lower work function (specifically, a material having a work function of 3.5 eV or lower) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 18A and 18B have a structure in which light is extracted from the first electrode layer 870, and thus, the second electrode layer 850 is not always required to have a light-transmitting property. The second electrode layer 850 may be formed of a film mainly including an element selected from Ti, TiN, TiSi$_x$N$_y$, Ni, W, WSi$_x$, WN$_x$, WSi$_x$N$_y$, NbN, Cr, Pt, Zn, Sn, In, Ta, Al, Cu, Au, Ag, Mg, Ca, Li and Mo, or an alloy material or a compound material containing the element as its main component, or a stacked film thereof in a total thickness range of 100 to 800 nm.

The second electrode layer 850 can be formed by an evaporation method, a sputtering method, a CVD method, a printing method, a droplet-discharge method, or the like.

In addition, when the second electrode layer 850 is formed by using a light-transmitting conductive material similarly to the material used for the first electrode layer 870, light is also extracted from the second electrode layer 850, and a dual emission structure can be obtained, in which light emitted from the light-emitting element is emitted from both of the first electrode layer 870 side and the second electrode layer 850 side.

It is to be noted that the light-emitting element according to the present invention has variations by changing types of the first electrode layer 870 and the second electrode layer 850.

FIG. 18B shows a case where the third layer 802, the second layer 803, and the first layer 804 are provided in this order from the first electrode layer 870 side in the electroluminescent layer 860.

As described above, in the light-emitting element according to the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound, where the functions are not obtainable from only either one of the organic compound or the inorganic compound. Further, the first layer 804 and the third layer 802 are particularly required to be layers in which an organic compound and an inorganic compound are combined when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, the electroluminescent layer may also be formed by a wet process.

Similarly, for the first electrode layer 870 and the second electrode layer 850, evaporation by resistance heating, EB evaporation, sputtering, a wet process, and the like can be used.

Figure 18C:
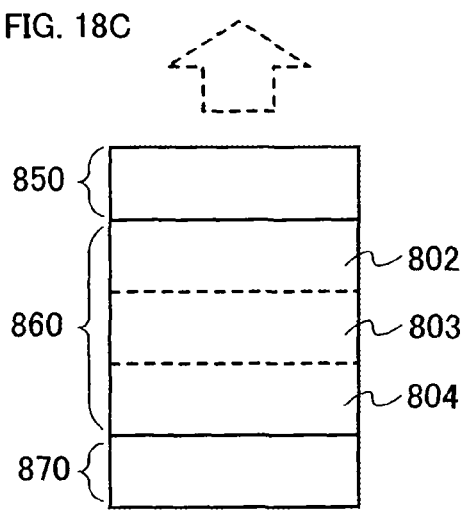
Figure 18D:
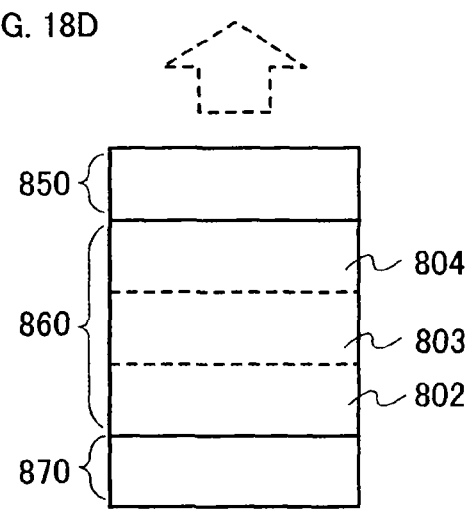

In FIG. 18C, an electrode layer having reflectivity is used for the first electrode layer 870, and an electrode layer having a light-transmitting property is used for the second electrode layer 850 in the structure of FIG. 18A. Light emitted from the light-emitting element is reflected by the first electrode layer 870, transmitted through the second electrode layer 850, and is emitted to outside. Similarly, in FIG. 18D, an electrode layer having reflectivity is used for the first electrode layer 870, and an electrode layer having a light-transmitting property is used for the second electrode layer 850 in the structure of FIG. 18B. Light emitted from the light-emitting element is reflected by the first electrode layer 870, transmitted through the second electrode layer 850, and is emitted to outside.

In the display device of this embodiment mode shown in FIG. 1B, light emitted from the light-emitting element 190 is transmitted and emitted from the first electrode layer 396 side in a direction indicated by an arrow in FIG. 1B.

It is effective to provide a passivation film so as to cover the second electrode layer 189. The passivation film can be formed by using an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) containing more nitrogen than oxygen, aluminum oxide, diamond-like carbon (DLC), or a nitrogen-containing carbon film (CN), and a single layer or a stacked layer of the insulating films can be used. Further, a siloxane resin may also be used.

At this time, it is preferable to form the passivation film by using a film with favorable coverage, for which a carbon film, particularly a DLC film is preferably used. A DLC film can be formed in a temperature range from a room temperature to 100° C. or lower; therefore, the DLC film can be easily formed above the electroluminescent layer 188 with a low heat resistant property. A DLC film can be formed by a plasma CVD method (typically, an RF plasma CVD method, a microwave CVD method, an electron cyclotron resonance (ECR) CVD method, a hot filament CVD method and the like), a combustion method, a sputtering method, an ion beam evaporation method, a laser evaporation method or the like. As a reaction gas for film formation, a hydrogen gas and a carbon hydride-based gas (for example, $CH_4$, $C_2H_2$, $C_6H_6$ and the like) are used to be ionized by glow discharge, and the ions are accelerated to impact against a cathode to which a negative self-bias voltage is applied, to form a film. Further, a CN film may be formed by using a $C_2H_2$ gas and a $N_2$ gas as a reaction gas. A DLC film has high blocking effect with respect to oxygen, thereby oxidization of the electroluminescent layer 188 can be suppressed. Therefore, a problem that the electroluminescent layer 188 is oxidized during a subsequent sealing step can be prevented.

By firmly fixing the substrate 100 over which the light-emitting element 190 is formed as described above and a sealing substrate 195 with a sealing material 192, the light-emitting element is sealed (see FIG. 1B). In the display device of the present invention, the sealing material 192 and the insulating layer 186 are formed apart so as not to contact with each other. By forming the sealing material 192 and the insulating layer 186 apart from each other, even when an insulating material using an organic material having a high moisture absorbing property is used for the insulating layer 186, moisture does not easily enter, and deterioration of the light-emitting element is prevented, thereby improving the reliability of the display device. As the sealing material 192, typically, a visible light curable resin, an ultraviolet ray curable resin, or a thermosetting resin is preferably used. For example, an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, or a modified epoxy resin can be used. It is to be noted that a region surrounded by a sealing material may be filled with a filler 193, and nitrogen or the like may be charged by sealing in a nitrogen atmosphere. Since a bottom emission type is employed in this embodiment mode, the filler 193 is not required to transmit light. However, in a case of extracting light through the filler 193, the filler is required to transmit light. Typically, a visible light curable, ultraviolet ray curable, or thermosetting epoxy resin may be used. By the aforementioned steps, a display device having a display function using a light-emitting element of this embodiment mode is completed. Further, the filler may be dropped in a liquid state to be filled in the display device.

Figure 24:
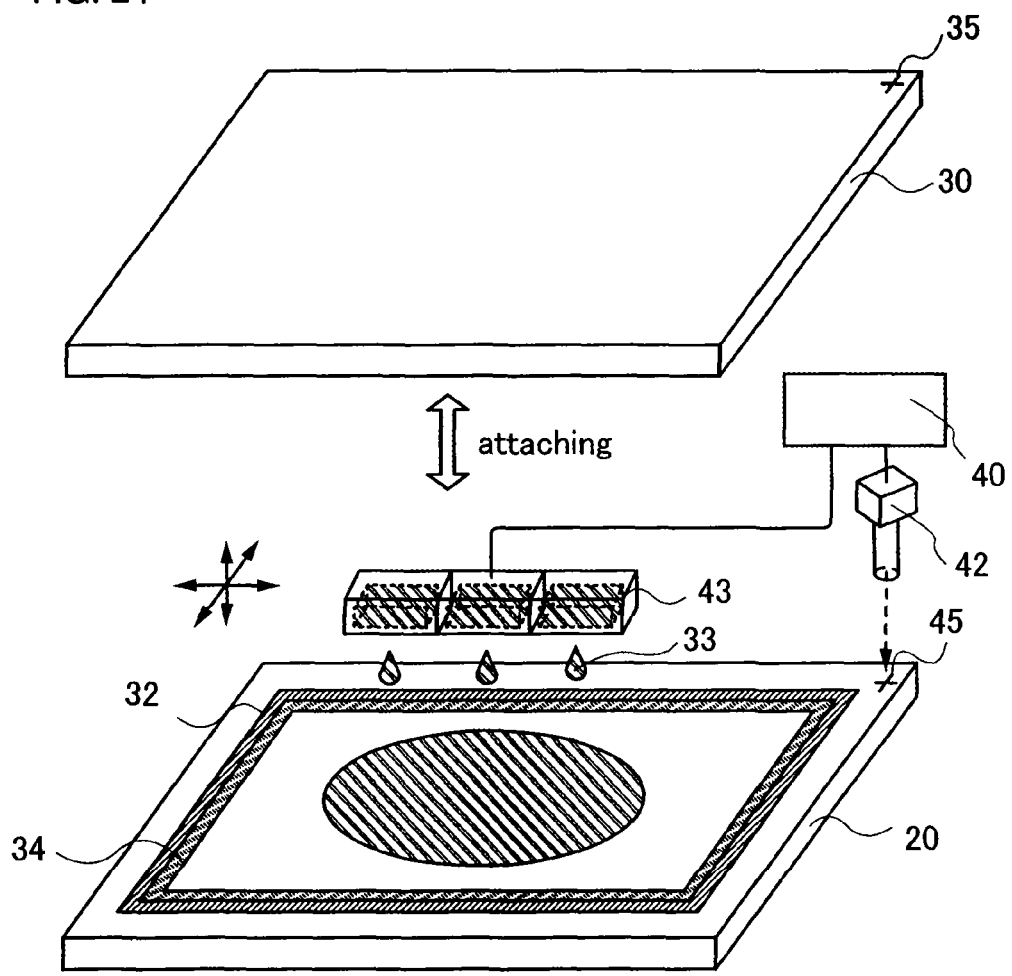
FIG. 24 is a view illustrating a droplet-discharge method which can be applied to the present invention.

A droplet-discharge method using a dispenser method is described with reference to FIG. 24. The droplet-discharge method shown in FIG. 24 uses a control device 40, an imaging means 42, a head 43, a filler 33, a marker 35, a marker 45, a barrier layer 34, a sealing material 32, a TFT substrate 30, and an opposing substrate 20. The filler 33 is dropped once or plural times from the head 43 in a closed loop formed by the sealing material 32. In a case where the filler material has high viscosity, the filler is continuously discharged and attached to a formation region in a connected state. In a case where the filler material has low viscosity, the filler is intermittently discharged and dropped as shown in FIG. 24. At this time, the barrier layer 34 may be provided to prevent that the sealing material 32 reacts with the filler 33. Subsequently, the substrates are attached to each other in vacuum and then cured by ultraviolet ray to make a state filled with the filler. When a substance having a moisture absorbing property such as a drying agent is used as the filler, much higher moisture absorbing effect can be obtained, thereby preventing deterioration of the element.

A drying agent is provided in an EL display panel to prevent deterioration of the element due to moisture. In this embodiment mode, a drying agent is provided in a concave portion that is formed so as to surround the pixel region in the sealing substrate so as not to hinder a thin design. Further, a drying agent is also formed in a region corresponding to a gate wiring layer so that a moisture absorbing area becomes wide, and thus, moisture can be effectively absorbed. In addition, a drying agent is formed over a gate wiring layer which does not emit light from itself, therefore, light extraction efficiency is not reduced, either.

A light-emitting element is sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet ray curable resin, and a method for sealing the light-emitting element by a thin film having a high barrier property such as metal oxide or metal nitride is used. As the cover material, glass, ceramics, a plastic, or metal can be used, but a material which transmits light is required to be used in a case where light is emitted to a cover material side. The cover material and the substrate over which the light-emitting element is formed are attached to each other with a sealing material such as a thermosetting resin or an ultraviolet ray curable resin, and a sealed space is formed by curing the resin using heat treatment or ultraviolet ray irradiation treatment. It is also effective to provide a moisture absorbing material typified by barium oxide in this sealed space. This moisture absorbing material may be provided over and in contact with the sealing material, or over the partition wall or in the periphery of the light-emitting element so as not to shield light from the light-emitting element. Further, the space between the cover material and the substrate over which the light-emitting element is formed can be filled with a thermosetting resin or an ultraviolet ray curable resin. In this case, it is effective to add a moisture absorbing material typified by barium oxide in the thermosetting resin or the ultraviolet ray curable resin.

Figure 10:
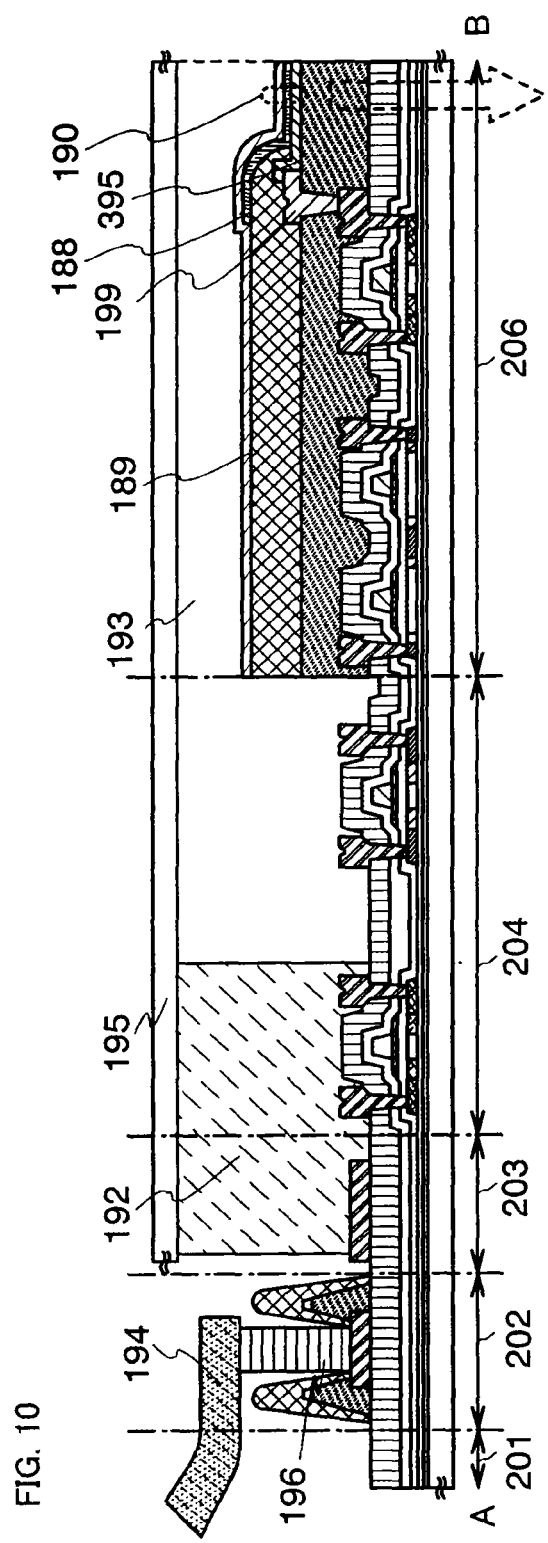
FIG. 10 is a view illustrating a display device according to the present invention.

FIG. 10 shows an example in which, in the display device shown in FIGS. 1A and 1B manufactured in this embodiment mode, the source electrode layer or the drain electrode layer and the first electrode layer are not directly in contact with each other to be electrically connected, and connected to each other with a wiring layer interposed therebetween. In a display device in FIG. 10, a source electrode layer or a drain electrode layer of a thin film transistor for driving a light-emitting element and a first electrode layer 395 are electrically connected to each other with a wiring layer 199 interposed therebetween. In FIG. 10, a part of the first electrode layer 395 is stacked over the wiring layer 199 to be connected; however, the first electrode layer 395 may be formed first, and then, the wiring layer 199 may be formed over the first electrode layer 395 to be in contact.

In this embodiment mode, the terminal electrode layer 178 is connected to an FPC 194 through an anisotropic conductive layer 196 in the external terminal connection region 202, and electrically connected to the outside. In addition, as shown in FIG. 1A that is a top view of the display device, the display device manufactured in this embodiment mode includes a peripheral driver circuit region 207 and a peripheral driver circuit region 208 having a scanning line driver circuit in addition to the peripheral driver circuit region 204 and the peripheral driver circuit region 209 having a signal line driver circuit.

The circuits as described above are formed in this embodiment mode; however, the present invention is not limited thereto. An IC chip may be mounted by the aforementioned COG method or TAB method as the peripheral driver circuit.

Further, each of the gate line driver circuit and the source line driver circuit may be provided in a single number or a plurality of numbers.

In the display device of the present invention, a driving method for image display is not particularly limited, and for example, a dot sequential driving method, a line sequential driving method, an area sequential driving method and the like may be used. Typically, the line sequential driving method may be used, and a time division gray scale driving method and an area gray scale driving method may also be appropriately used. Further, a video signal inputted to the source line of the display device may be an analog signal or a digital signal. The driver circuit and the like may be appropriately designed in accordance with the video signal.

Further, in a display device using a digital video signal, a video signal that is inputted into a pixel has a constant voltage (CV) or has a constant current (CC). As for a video signal with a constant voltage (CV), a voltage that is applied to a light-emitting element is constant (CVCV), or a current that is flowed through a light-emitting element is constant (CVCC). In addition, as for a video signal with a constant current (CC), a voltage that is applied to a light-emitting element is constant (CCCV), or a current that is flowed through a light-emitting element is constant (CCCC).

By applying the present invention, a highly reliable display device can be manufactured. Therefore, a high-definition and high-image quality display device can be manufactured with high yield.

Embodiment Mode 2

Another embodiment mode of the present invention will be described with reference to FIGS. 7A and 7B, 8, and 9. This embodiment mode shows an example in which a second interlayer insulating layer is not formed in the display device manufactured in Embodiment Mode 1. Therefore, explanations of the same portions or portions having the same functions will be omitted.

As described in Embodiment Mode 1, over a substrate 100, a p-channel thin film transistor 173, an n-channel thin film transistor 174, an n-channel thin film transistor 175, a p-channel thin film transistor 176, and an insulating film 168 are formed. In each of the thin film transistors, a source electrode layer or a drain electrode layer connected to a source region or a drain region of a semiconductor layer is formed. A first electrode layer 185 is formed to be in contact with a source electrode layer or a drain electrode layer 172b in the p-channel thin film transistor 176 provided in a pixel region 206 (see FIG. 7A).

The first electrode layer 185 functions as a pixel electrode, and may be formed by the same material and through the same step as the first electrode layer 396 in Embodiment Mode 1. The first electrode layer 185 that is a light-transmitting electrode layer may be specifically formed by using a transparent conductive film formed of a light-transmitting conductive material such as indium oxide containing tungsten oxide, indium zinc oxide containing tungsten oxide, indium oxide containing titanium oxide, indium tin oxide containing titanium oxide, or the like.

Further, silicon oxide may be added into indium oxide containing tungsten oxide, indium zinc oxide containing tungsten oxide, indium oxide containing titanium oxide, and indium tin oxide containing titanium oxide. In a sputtering method where a thin film is formed by sputtering a target, unevenness called a nodule is generated on a target surface to which sputtering is performed. When a target having such an uneven shape is used, a film with uniform composition cannot be formed, a large lump of a material is generated like a dust in the film, and a dense film cannot be obtained. When sputtering is performed by using a target in which silicon oxide is added into a transparent conductive material as described above, unevenness on the target surface can be reduced, and a uniform and dense film can be obtained.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

The first electrode layer 185 can be formed by an evaporation method, a sputtering method, or the like. In a case of using a sputtering method, a gas containing water ($H_2O$) or $H_2$ may be used as a gas. In this embodiment mode, the first electrode layer 185 is formed by using indium zinc oxide containing silicon oxide and tungsten oxide by a sputtering method using a gas containing water ($H_2O$) or $H_2$. The first electrode layer 185 may be preferably formed in a total thickness range of 100 to 800 nm, and is 185 nm in this embodiment mode. In this embodiment mode, a gas containing 50 sccm of argon (Ar), 1.0 sccm of oxygen ($O_2$), and 0.2 sccm of $H_2$ is used. In a case of using an $H_2O$ gas, the flow rate is preferably 0.5 sccm or less. The indium zinc oxide film containing silicon oxide and tungsten oxide formed in this embodiment mode has favorable processability, and can be etched without leaving a residue by wet etching using weak acid. When such a film is used for a pixel electrode of a display device, a highly reliable display device can be manufactured, in which light extraction efficiency of a light-emitting element is favorable, and defects due to an etching defect of an electrode or the like are suppressed.

An insulating layer 186 is formed so as to cover an end portion of the first electrode layer 185 and the thin film transistors (see FIG. 7B). Acrylic is used for the insulating layer 186 in this embodiment mode. An electroluminescent layer 188 is formed over the first electrode layer 185, a second electrode layer 189 is formed thereover, and a light-emitting element 190 is formed. A terminal electrode layer 178 is attached to an FPC 194 through an anisotropic conductive layer 196 in an external terminal connection region 202. The substrate 100 is attached to a sealing substrate 195 with a sealing material 192, and the inside of the display device is filled with a filler 193 (see FIG. 8). In the display device of the present invention, the sealing material 192 and the insulating layer 186 are formed apart so as not to be in contact with each other. When the sealing material 192 and the insulating layer 186 are formed apart as described above, moisture does not easily enter, deterioration of the light-emitting element is prevented, and reliability of the display device can be improved, even in a case where an insulating material using an organic material having a high moisture absorbing property is used for the insulating layer 186.

Figure 9:
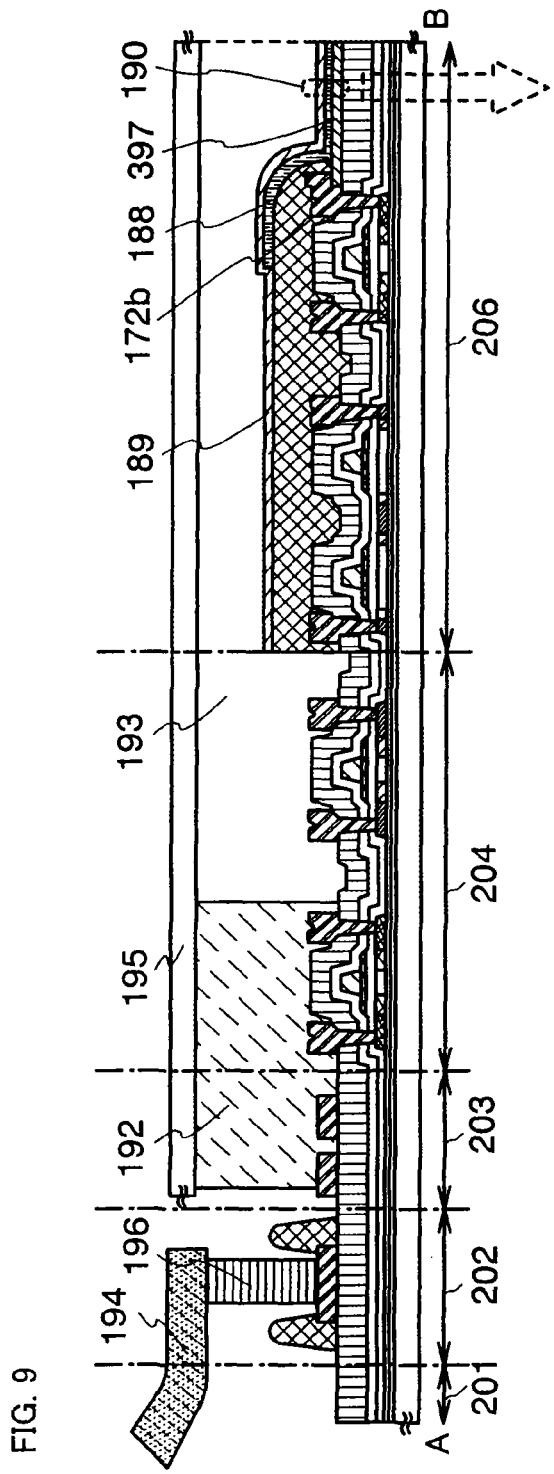
FIG. 9 is a view illustrating a display device according to the present invention.

In a display device shown in FIG. 9, a first electrode layer 397 is selectively formed over the insulating film 168 before forming the source electrode layer or the drain electrode layer 172*b* connected to the p-channel thin film transistor 176. In this case, the source electrode layer or the drain electrode layer 172*b* and the first electrode layer 397 are connected to each other so that the source electrode layer or the drain electrode layer 172*b* is stacked over the first electrode layer 397 in this embodiment mode. When the first electrode layer 397 is formed before the source electrode layer or the drain electrode layer 172*b*, the first electrode layer 397 can be formed over a flat formation region, and coverage is favorable. Moreover, there is an advantage that the first electrode layer 397 can be formed with favorable planarity because polishing treatment such as CMP can be sufficiently performed.

By applying the present invention, a highly reliable display device can be manufactured. Therefore, a high-definition and high-image quality display device can be manufactured with high yield.

Embodiment Mode 3

A display device in this embodiment mode will be described with reference to FIGS. 11A and 11B.

Figure 11A:
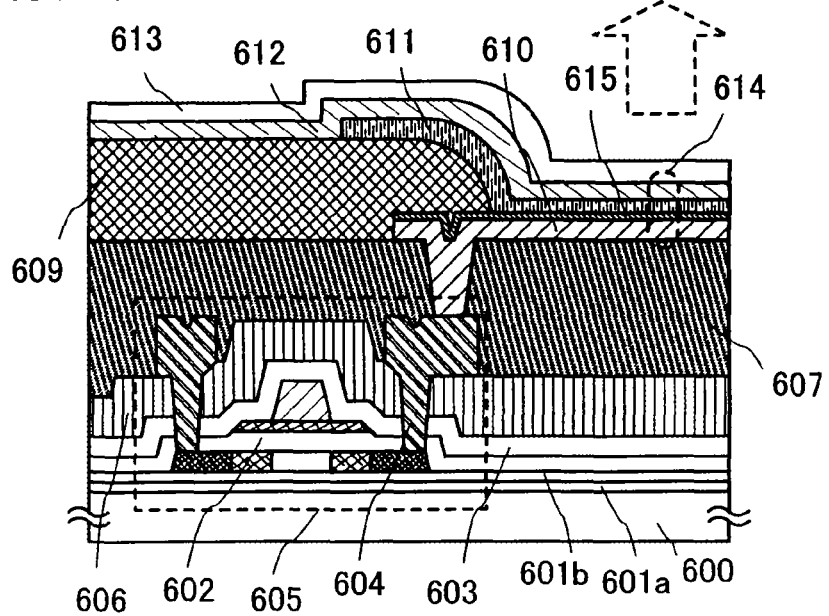
FIGS. 11A and 11B are views each illustrating a display device according to the present invention.
Figure 11B:
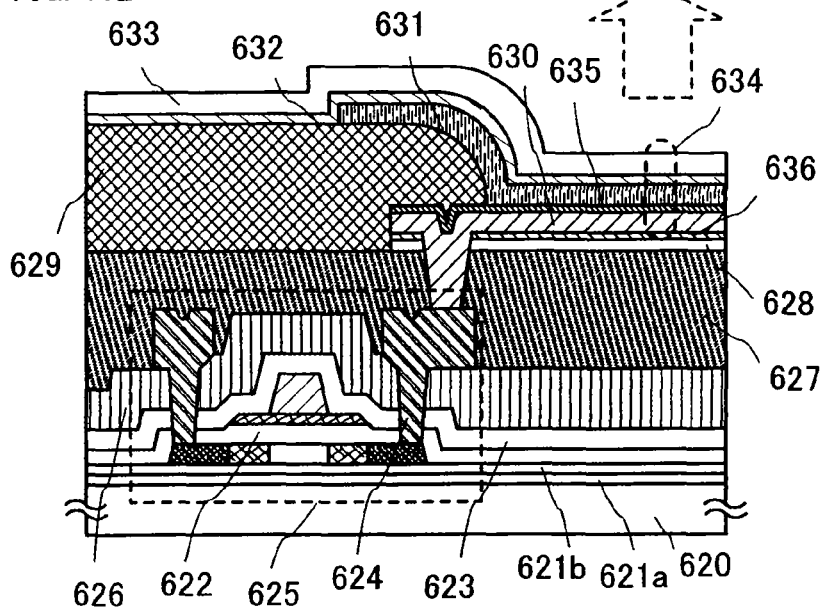

As shown in FIGS. 11A and 11B, a display device described in this embodiment mode is a top emission display device in which light is extracted through a sealing substrate. In display devices shown in FIGS. 11A and 11B, electrode structures of light-emitting elements are different from each other.

In the display device in FIG. 11A, over a substrate 600, base films 601*a* and 601*b*, a thin film transistor 605, a gate insulating layer 602, insulating layers 603, 606, and 607, an insulating layer 609 functioning as a partition wall, a first electrode layer 610, a transparent conductive film 615, an electroluminescent layer 611, a second electrode layer 612, and a protective film 613 are provided. The thin film transistor 605 includes a semiconductor layer, which has impurity regions functioning as a source region and a drain region, the gate insulating layer 602, a gate electrode layer having a stacked structure of two layers, and a source electrode layer and a drain electrode layer. The source electrode layer or the drain electrode layer is in contact with and electrically connected to the impurity region of the semiconductor layer and the first electrode layer 610.

In the display device of this embodiment mode, a reflective electrode layer having reflectivity is used for the first electrode layer 610, a light-transmitting electrode layer is used for the second electrode layer 612, and light emitted from a light-emitting element 614 is reflected. Therefore, light is emitted from a side of the second electrode layer 612 in a direction indicated by an arrow. As described above, a reflective electrode layer used for a pixel electrode layer of a light-emitting element is required to have high reflectivity and favorable planarity of a surface. The first electrode layer 610 and the transparent conductive film 615 form a stacked structure. The first electrode layer 610 is formed by using a reflective film, and the transparent conductive film 615 and the second electrode layer 612 are formed by using an IWZO film. As shown in FIG. 11A, by stacking the transparent conductive film 615, the first electrode layer 610 can be protected, and thus, there is an advantage that the yield can be improved.

In this embodiment mode, the substrate 600 is a glass substrate, the base film 601*a* is a silicon nitride oxide film, the base film 601*b* is a silicon oxynitride film, the gate insulating layer 602 is a silicon oxynitride film, the insulating layer 603 is a silicon nitride oxide film, the insulating layer 606 is a silicon oxide film, the insulating layer 607 is a siloxane resin film, the insulating layer 609 functioning as a partition wall is polyimide, and the protective film 613 is a silicon nitride oxide film.

In the display device shown in FIG. 11B, over a substrate 620, base films 621*a* and 621*b*, a thin film transistor 625, a gate insulating layer 622, insulating layers 623, 626, and 627, interlayer films 628 and 636, an insulating layer 629 functioning as a partition wall, a first electrode layer 630, a transparent conductive film 635, an electroluminescent layer 631, a second electrode layer 632, and a protective film 633 are provided. The thin film transistor 625 includes a semiconductor layer, which has impurity regions functioning as a source region and a drain region, the gate insulating layer 622, a gate electrode layer having a stacked structure of two layers, and a source electrode layer and a drain electrode layer. The source electrode layer or the drain electrode layer is in contact with and electrically connected to the impurity region of the semiconductor layer and the first electrode layer 630.

A light-emitting element 634 of the display device shown in FIG. 11B includes the first electrode layer 630, the transparent conductive film 635, the electroluminescent layer 631, and the second electrode layer 632. The first electrode layer 630 and the transparent conductive film 635 form a stacked structure. The first electrode layer 630 is formed by using a reflective film, and the transparent conductive film 635 is formed by using an IWZO film. As shown in FIG. 11B, by stacking the transparent conductive film 635, the first electrode layer 630 can be protected, and thus, there is an advantage that the yield can be improved. In addition, the second electrode layer 632 shown in FIG. 11B is formed by using a light-transmitting silver thin film that is thinned.

In this embodiment mode, the transparent conductive film 615, the second electrode layer 612, the transparent conductive film 635, and the second electrode layer 632 can be formed by the same material and through the same step as the first electrode layer 396 in Embodiment Mode 1. Specifically, a transparent conductive film formed of a light-transmitting conductive material such as indium oxide containing tungsten oxide, indium zinc oxide containing tungsten oxide, indium oxide containing titanium oxide, or indium tin oxide containing titanium oxide may be used.

Further, silicon oxide may be added into indium oxide containing tungsten oxide, indium zinc oxide containing tungsten oxide, indium oxide containing titanium oxide, and indium tin oxide containing titanium oxide. In a sputtering method where a thin film is formed by sputtering a target, unevenness called a nodule is generated on a target surface to which sputtering is performed. When a target having such an uneven shape is used, a film with uniform composition cannot be formed, a large lump of a material is generated like a dust in the film, and a dense film cannot be obtained. When sputtering is performed by using a target in which silicon oxide is added into a transparent conductive material as described above, unevenness on the target surface can be reduced, and a uniform and dense film can be obtained.

In this embodiment mode, the transparent conductive film 615, the second electrode layer 612, the transparent conductive film 635, and the second electrode layer 632 are formed by using indium zinc oxide containing silicon oxide and tungsten oxide by a sputtering method using a gas containing water ($H_2O$) or $H_2$. In this embodiment mode, a gas containing 50 sccm of argon (Ar), 1.0 sccm of oxygen ($O_2$), and 0.2 sccm of $H_2$ is used. In a case of using an $H_2O$ gas, the flow rate is preferably 0.5 sccm or less. The indium zinc oxide film containing silicon oxide and tungsten oxide formed in this embodiment mode has favorable processability, and can be etched without leaving a residue by wet etching using an etchant such as weak acid. When such a film is used for a pixel electrode of a display device, a highly reliable display device can be manufactured, in which light extraction efficiency of a light-emitting element is favorable, and defects due to an etching defect of an electrode or the like are suppressed.

The first electrode layers 610 and 630 having reflectivity can be formed by using a conductive film formed of titanium, tungsten, nickel, gold, platinum, silver, aluminum, magnesium, calcium, lithium, or alloy thereof.

Other components shown in FIG. 11B may be formed by the same material and the same step as those of FIG. 11A. Further, in the display device shown in FIG. 11B, the interlayer film 628 is a silicon nitride oxide film, and the interlayer film 636 is a titanium nitride film. When the interlayer films 628 and 636 are formed between the insulating layer 627 and the first electrode layer 630, adhesion of the insulating layer 627 and the first electrode layer 630 can be improved. Further, the titanium nitride film can also have a function of preventing static electricity. A siloxane resin film used for the insulating layer 627 may also be formed in a thickness thinner than the insulating layer 627 between the silicon nitride oxide film used as the interlayer film 628 and the titanium nitride film.

As described above, by applying the present invention, a highly reliable display device can be manufactured. Therefore, a high-definition and high-image quality display device can be manufactured with high yield.

Embodiment Mode 4

Another embodiment mode of the present invention will be described with reference to FIGS. 13A to 13C. This embodiment mode shows an example in which a structure of a gate electrode layer of a thin film transistor is different from the one of the display device manufactured in Embodiment Mode 1. Therefore, explanations of the same portions or portions having the same functions will be omitted.

Figure 13:
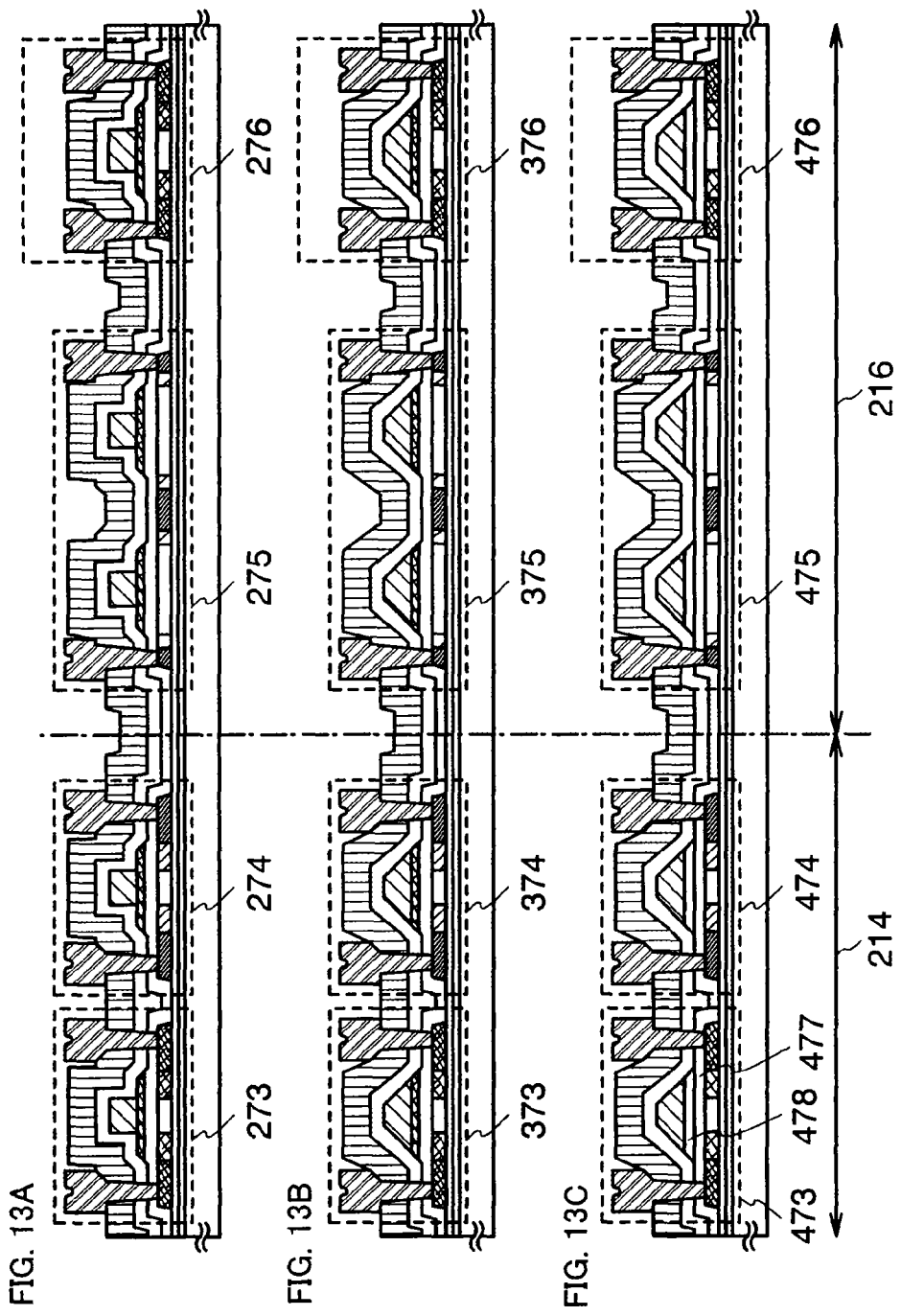
FIGS. 13A to 13C are views each illustrating a manufacturing method of a display device according to the present invention.

FIGS. 13A to 13C show display devices in a manufacturing step, which correspond to the display device of FIG. 4B shown in Embodiment Mode 1.

In FIG. 13A, thin film transistors 273 and 274 are provided in a peripheral driver circuit region 214, and thin film transistors 275 and 276 are provided in a pixel region 216. A gate electrode layer of the thin film transistor in FIG. 13A is formed by a stacked structure of two conductive films, and the upper gate electrode layer is processed to have a width narrower than that of the lower gate electrode layer. The lower gate electrode layer has a taper shape, and the upper gate electrode layer has a shape in which an angle of a side surface is almost perpendicular. As described here, the gate electrode layer may have a taper shape, or a shape without a taper portion, in which an angle of a side surface is almost perpendicular.

In FIG. 13B, thin film transistors 373 and 374 are provided in the peripheral driver circuit region 214, and thin film transistors 375 and 376 are provided in the pixel region 216. A gate electrode layer of the thin film transistor in FIG. 13B is also formed by a stacked structure of two conductive films, and the upper gate electrode layer and the lower gate electrode layer have a continuous taper shape.

In FIG. 13C, thin film transistors 473 and 474 are provided in the peripheral driver circuit region 214, and thin film transistors 475 and 476 are provided in the pixel region 216. A gate electrode layer of the thin film transistor in FIG. 13C has a single layer structure and a taper shape. The gate electrode layer may also have a single layer structure like this.

In the display device shown in FIG. 13C, a gate insulating layer is formed by a gate insulating layer 477 and a gate insulating layer 478 that is selectively provided over the gate insulating layer 477. In such a manner, the gate insulating layer 478 may be selectively provided below the gate electrode layer, and an end portion thereof may have a taper shape. In FIG. 13C, both of the end portion of the gate insulating layer 478 and an end portion of the gate electrode layer that is formed over the gate insulating layer 478 have a taper shape, and are formed continuously; however, they may also be formed discontinuously so as to have a step. In this embodiment mode, the gate insulating layer 477 is formed by using a silicon oxynitride film and the gate insulating layer 478 is formed by using a silicon nitride film.

As described above, the gate electrode layer can have various structures in accordance with a configuration and a shape thereof. Therefore, a display device to be manufactured has also various structures. When an impurity region in a semiconductor layer is formed in a self-alignment manner using the gate electrode layer as a mask, a structure or a concentration distribution of the impurity region is changed depending on the structure of the gate electrode layer. By designing in consideration with the above matters, a thin film transistor having a desired function can be manufactured.

This embodiment mode can be implemented in combination with each of Embodiment Modes 1 to 3.

Embodiment Mode 5

In this embodiment mode, an example of a dual emission display device will be described with reference to FIG. 12.

Figure 12:
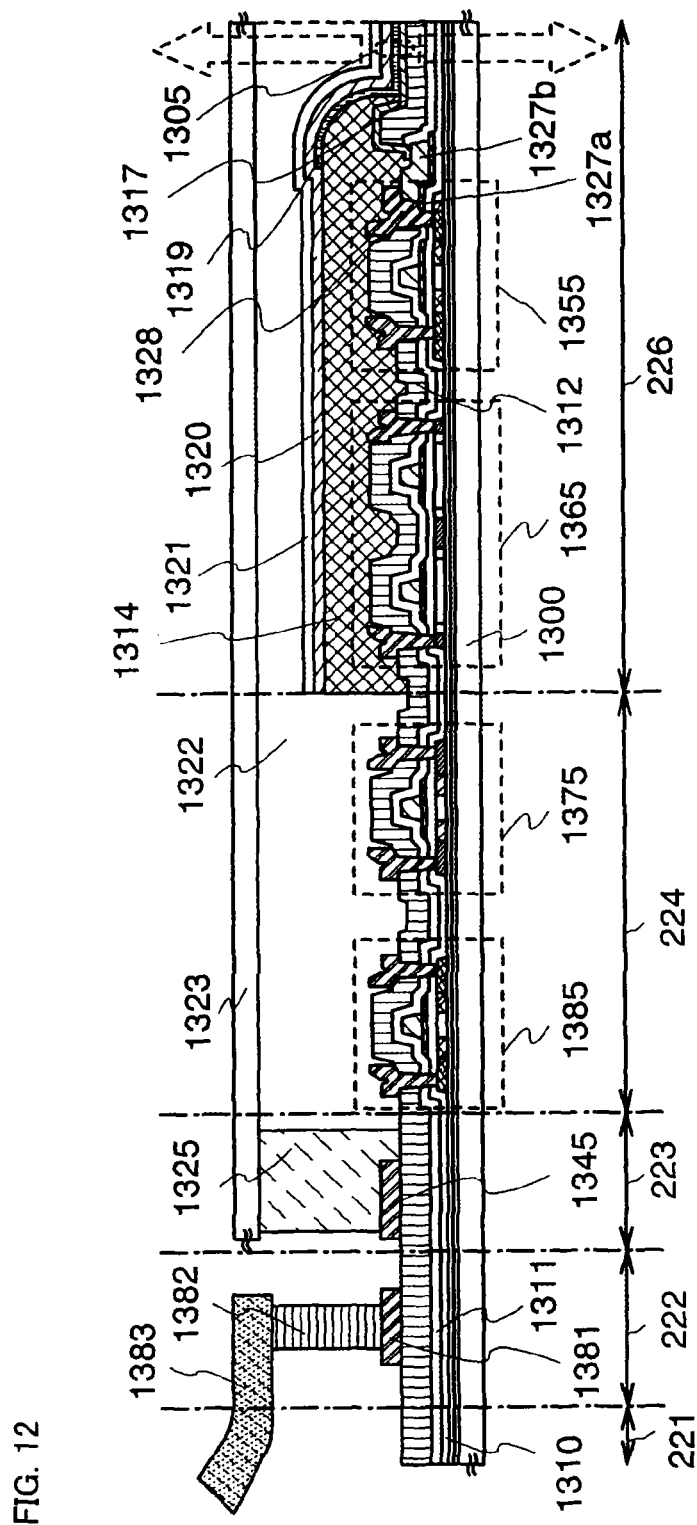
FIG. 12 is a view illustrating a display device according to the present invention.

FIG. 12 shows a display device, which includes an element substrate 1300, thin film transistors 1355, 1365, 1375 and 1385, a source electrode layer or a drain electrode layer 1328, conductive layers 1327a and 1327b, a first electrode layer 1317, an electroluminescent layer 1319, a second electrode layer 1320, a protective layer 1321, a filler 1322, a sealing material 1325, a gate insulating layer 1310, insulating layers 1311, 1312 and 1314, a sealing substrate 1323, a wiring layer 1345, a terminal electrode layer 1381, an anisotropic conductive layer 1382, and an FPC 1383. The display device also includes a separation region 221, an external terminal connection region 222, a wiring region 223, a peripheral driver circuit region 224, and a pixel region 226. The filler 1322 can be formed by a droplet-discharge method by being made into a liquid composition as in the droplet-discharge method shown in FIG. 24. The element substrate 1300 in which the filler is formed by a droplet-discharge method and the sealing substrate 1323 are attached to each other to seal the peripheral driver circuit region 224, the pixel region 226 and the like.

The display device in FIG. 12 is a dual emission type, in which light is emitted from both the element substrate 1300 side and the sealing substrate 1323 side in directions indicated by arrows. Therefore, a light-transmitting electrode layer is used for both the first electrode layer 1317 and the second electrode layer 1320.

In the present invention, the first electrode layer 1317 and the second electrode layer 1320, each of which is a light-transmitting electrode layer, may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, and the like can be used.

Further, silicon oxide may be added into indium oxide containing tungsten oxide, indium zinc oxide containing tungsten oxide, indium oxide containing titanium oxide, and indium tin oxide containing titanium oxide. In a sputtering method where a thin film is formed by sputtering a target, unevenness called a nodule is generated on a target surface to which sputtering is performed. When a target having such an uneven shape is used, a film with uniform composition cannot be formed, a large lump of a material is generated like a dust in the film, and a dense film cannot be obtained. When sputtering is performed by using a target in which silicon oxide is added into a transparent conductive material as described above, unevenness on the target surface can be reduced, and a uniform and dense film can be obtained.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

In this embodiment mode, the first electrode layer 1317 and the second electrode layer 1320 are formed by using indium zinc oxide containing silicon oxide and tungsten oxide by a sputtering method using a gas containing water ($H_2O$) or $H_2$. In this embodiment mode, a gas containing 50 scan of argon (Ar), 1.0 sccm of oxygen ($O_2$), and 0.2 sccm of $H_2$ is used. In a case of using an $H_2O$ gas, the flow rate is preferably 0.5 sccm or less. The indium zinc oxide film containing silicon oxide and tungsten oxide formed in this embodiment mode has favorable processability, and can be etched without leaving a residue by wet etching using an etchant such as weak acid.

In addition, even in a case of a non-light-transmitting material such as a metal film, when the thickness is made thin (preferably, about 5 to 30 nm) so as to be able to transmit light, light can be emitted from the first electrode layer 1317 and the second electrode layer 1320. As a metal thin film that can be used for the first electrode layer 1317 and the second electrode layer 1320, a conductive film formed of titanium, tungsten, nickel, gold, platinum, silver, aluminum, magnesium, calcium, lithium, and an alloy thereof can be used.

As described above, in the display device in FIG. 12, light emitted from the light-emitting element 1305 passes through both the first electrode layer 1317 and the second electrode layer 1320 to have a structure where light is emitted from both sides.

This embodiment mode can be implemented in combination with each of Embodiment Modes 1 to 4.

In the display device of this embodiment mode, the source electrode layer or the drain electrode layer 1328 of the thin film transistor 1355 and the first electrode layer 1317 of the light-emitting element 1305, which is a pixel electrode layer, are not directly stacked to be electrically connected, but the source electrode layer or the drain electrode layer 1328 and the first electrode layer 1317 are electrically connected to each other with the conductive layers 1327a and 1327b interposed therebetween. In such a structure, materials by which the source electrode layer or the drain electrode layer and the first electrode layer are not easily electrically connected to each other when both electrode layers are directly in contact with each other, or materials by which deterioration such as electric erosion is caused when both electrode layers are in contact with each other can also be used since a conductive layer is interposed between both electrode layers. Therefore, a range of a choice for materials that can be used for the source electrode layer or the drain electrode layer and the first electrode layer can be wide. Since it is not necessary to consider a problem which arises when the source electrode layer or the drain electrode layer and the first electrode layer are stacked, a material provided with a property required for each of the source electrode layer or the drain electrode layer and the first electrode layer can be freely selected. Therefore, a much higher-functional and reliable display device can be manufactured with high yield.

Embodiment Mode 6

Figure 15:
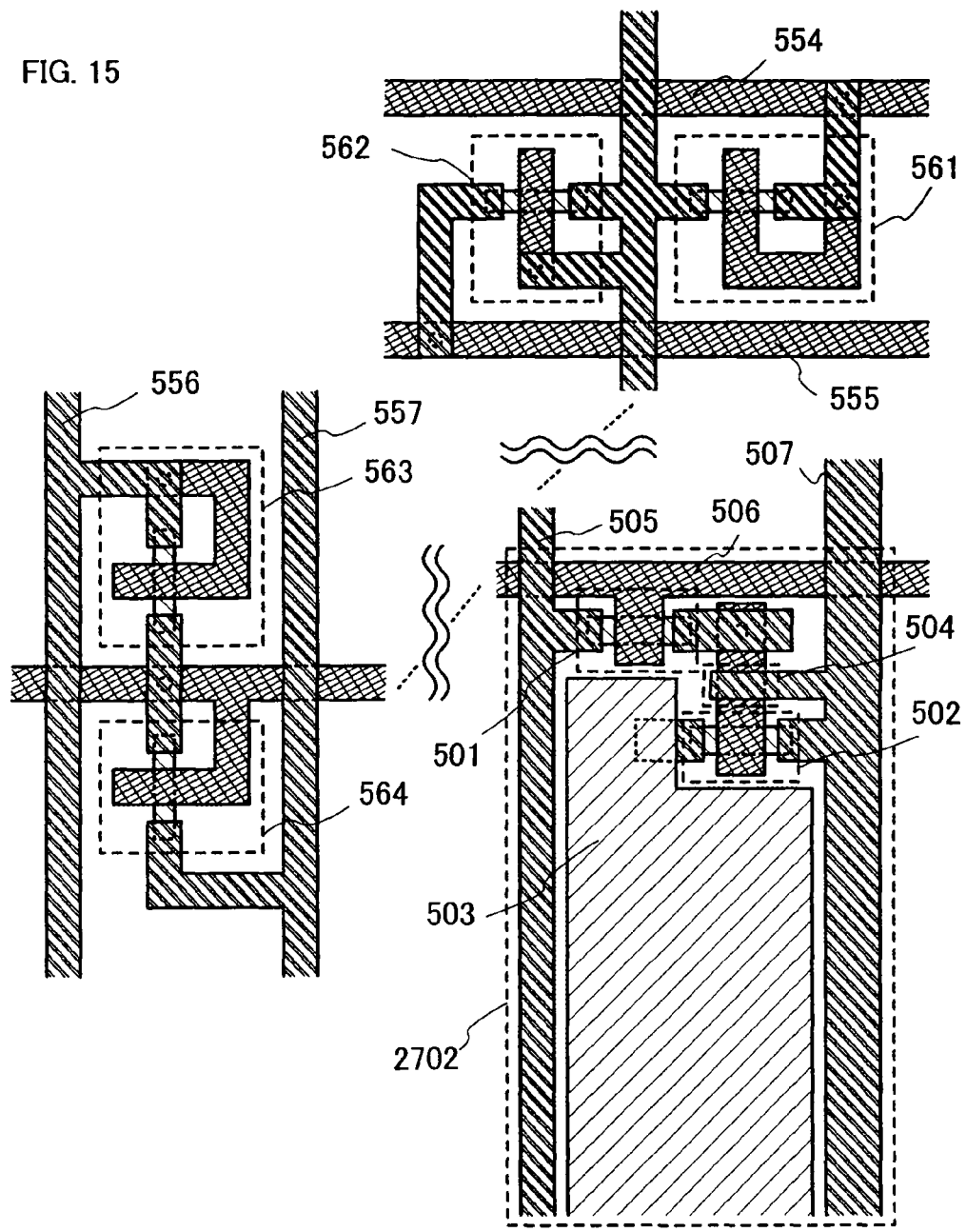
FIG. 15 is a top view illustrating a display device according to the present invention.

An example of providing a protective diode for a scanning line input terminal portion and a signal line input terminal portion will be described with reference to FIG. 15. In FIG. 15, a pixel 2702 is provided with TFTs 501 and 502, a capacitor element 504, and a light-emitting element 503. These TFTs have similar structures to those of Embodiment Mode 1.

Figure 14:
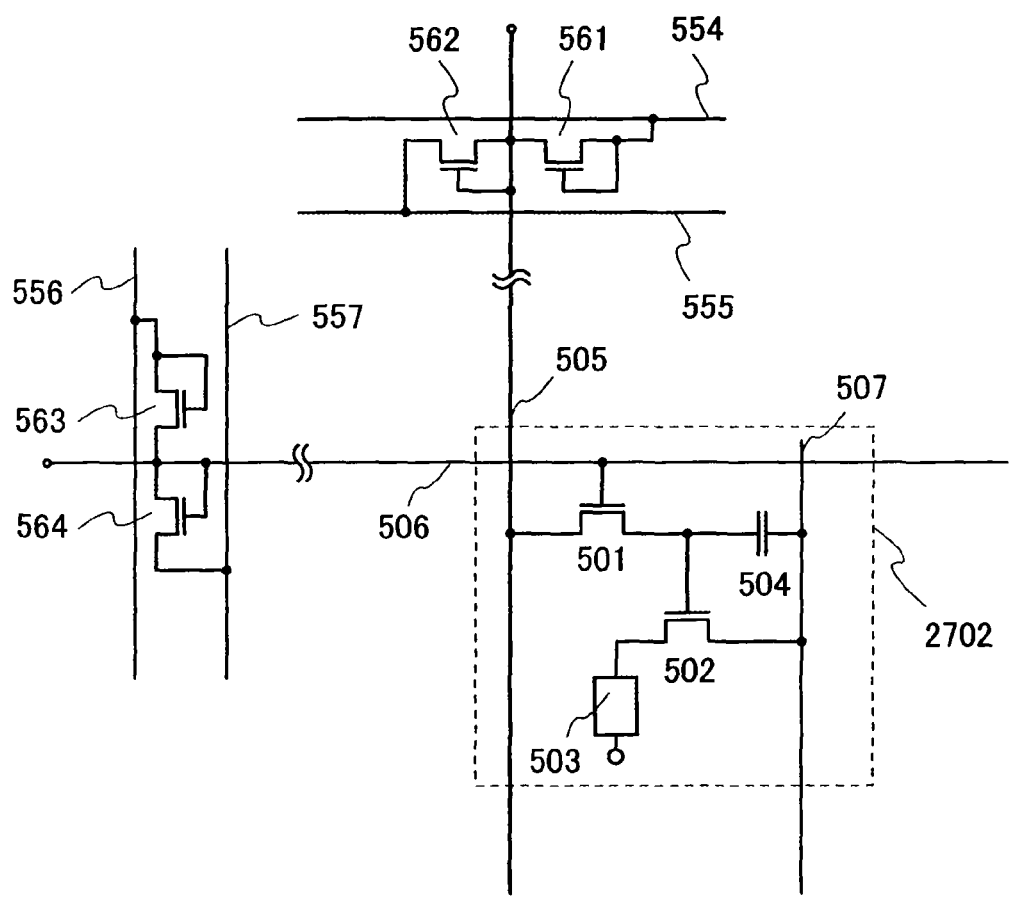
FIG. 14 is an equivalent circuit diagram of a display device that will be described in FIG. 15.

Protective diodes 561 and 562 are provided in the signal line input terminal portion. These protective diodes are manufactured through similar steps to the TFTs 501 and 502, and a gate is connected to one of a drain and a source to operate as a diode. FIG. 14 shows an equivalent circuit diagram of a top view of FIG. 15.

The protective diode 561 includes a gate electrode layer, a semiconductor layer, and a wiring layer. The protective diode 562 has a similar structure. Common potential lines 554 and 555 connected to these protective diodes are formed of the same layer as the gate electrode layer. Accordingly, a contact hole is required to be formed in an insulating layer so that the common potential line is electrically connected to the wiring layer.

A contact hole in the insulating layer may be formed by forming a mask layer and performing etching. In this case, by performing etching of atmospheric pressure discharge, local electric discharge can be performed, and a mask layer is not required to be formed over the entire surface of the substrate.

A signal wiring layer is formed of the same layer as a source and drain wiring layer 505 in the TFT 501, and the signal wiring layer connected to the source and drain wiring layer 505 and the source or drain side are connected to each other.

An input terminal portion on the scanning signal line side also has a similar structure. A protective diode 563 includes a gate electrode layer, a semiconductor layer, and a wiring layer. A protective diode 564 has a similar structure. Common potential lines 556 and 557 connected to these protective diodes are formed of the same layer as the source electrode layer and the drain electrode layer. The protective diodes provided in the input stage can be formed at the same time. It is to be noted that the protective diode is not limited to be arranged at a position shown in this embodiment mode, but may also be arranged between a driver circuit and a pixel.

Embodiment Mode 7

Figure 23:
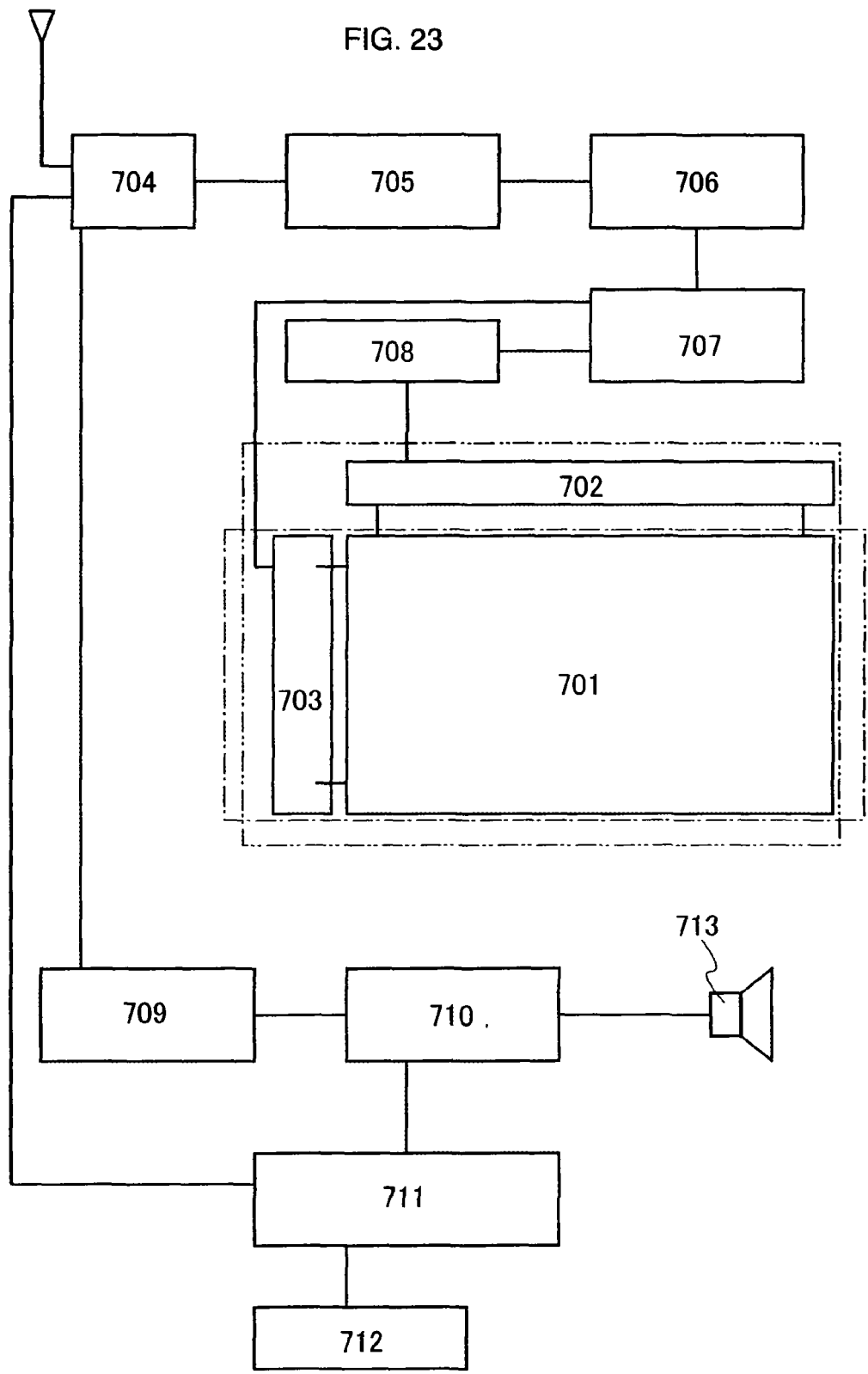
FIG. 23 is a block diagram showing a main structure of an electronic device to which the present invention is applied.

A television device can be completed by a display device formed in accordance with the present invention. FIG. 23 is a block diagram showing a main structure of the television device (EL television device in this embodiment mode). A display panel can be formed in any manner as follows: as the structure shown in FIG. 16A, only a pixel portion 701 is formed, and a scanning line driver circuit 703 and a signal line driver circuit 702 are mounted by a TAB method as shown in FIG. 17B or by a COG method as shown in FIG. 17A; a TFT is formed, and a pixel portion 701 and a scanning line driver circuit 703 are formed to be integrated over a substrate, and a signal line driver circuit 702 is separately mounted as a driver IC as shown in FIG. 16B; a pixel portion 701, a signal line driver circuit 702, and a scanning line driver circuit 703 are formed to be integrated over the substrate as shown in FIG. 16C; or the like.

Another structure of an external circuit includes, on the input side of the video signal, a video signal amplifier circuit 705 which amplifies a video signal among signals received by a tuner 704; a video signal processing circuit 706 which converts the signal output into a chrominance signal corresponding to each color of red, green, and blue; a control circuit 707 which converts the video signal into an input specification of a driver IC; and the like. The control circuit 707 outputs the signal into the scanning line side and the signal line side, respectively. In a case of digital driving, a signal dividing circuit 708 may be provided on the signal line side so that an input digital signal is supplied by dividing into m-pieces.

Among signals received by the tuner 704, an audio signal is transmitted to an audio signal amplifier circuit 709, and the output thereof is supplied to a speaker 713 through an audio signal processing circuit 710. The control circuit 711 receives control information on a receiving station (a receiving frequency) or sound volume from an input portion 712 and transmits the signal to the tuner 704 or the audio signal processing circuit 710.

Figure 20A:
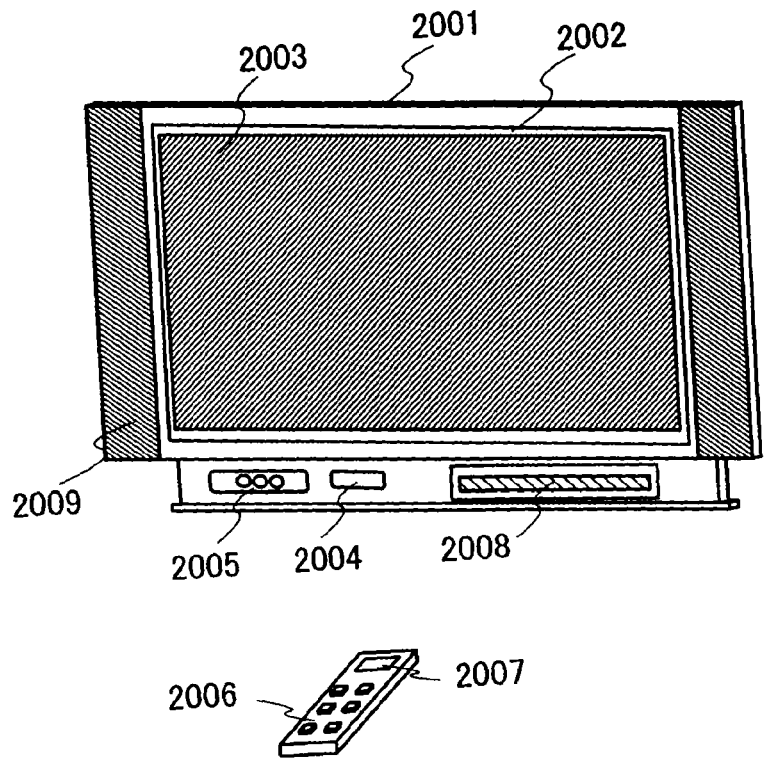
FIGS. 20A and 20B are views illustrating electronic devices to which the present invention is applied.
Figure 20B:
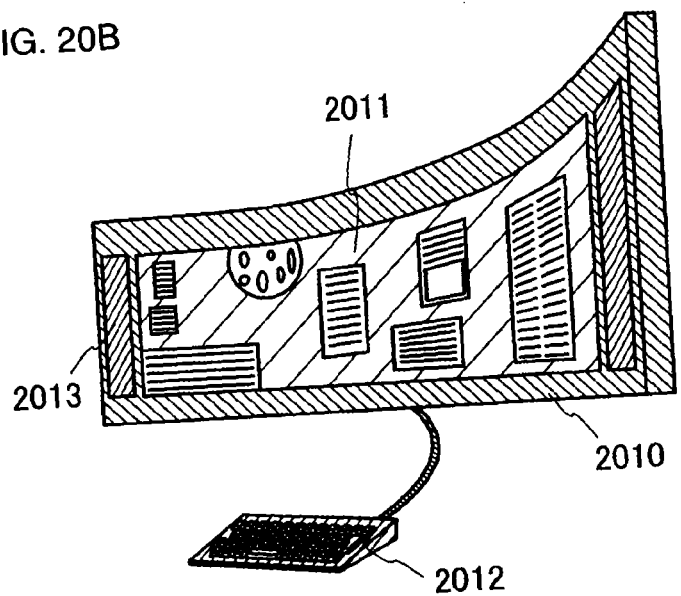

As shown in FIGS. 20A and 20B, a television device can be completed by incorporating a display module into a chassis. The display panel in which components up to an FPC are attached as shown in FIGS. 1A and 1B is generally called an EL display module. An EL television device can be completed when the EL display module as in FIGS. 1A and 1B is used. A main screen 2003 is formed by using the display module, and a speaker unit 2009, operation switches, and the like are provided as other attached equipments. In such a manner, the television device can be completed in accordance with the present invention.

In addition, reflected light of light entered from the outside may be shielded by using a wave plate or a polarizing plate. In a case of a top emission display device, an insulating layer to be a partition wall may be colored and used as a black matrix. The partition wall can be formed by a droplet-discharge method or the like, and a resin material such as a black pigment resin or polyimide may be mixed with carbon black or the like. A stacked layer thereof may also be used. Further, by a droplet-discharge method, different materials may be discharged on the same region plural times to form a partition wall. $\lambda/4$ and $\lambda/2$ plates may be used as wave plates and may be designed to be able to control light. As a structure, a TFT element substrate, a light-emitting element, a sealing substrate (sealing material), wave plates ($\lambda/4$ and $\lambda/2$ plates), a polarizing plate are stacked in this order, in which light emitted from the light-emitting element is emitted outside from the polarizing plate side through the above components. The wave plates or the polarizing plate may be provided on a side to which light is emitted or may be provided on both sides in a case of a dual emission type display device in which light is emitted to both sides. In addition, an anti-reflective film may be provided on the outer side of the polarizing plate. Consequently, a much higher-definition and accurate image can be displayed.

As shown in FIG. 20A, a display panel 2002 using a display element is incorporated into a chassis 2001. By using a receiver 2005, in addition to reception of general TV broadcast, information communication can also be carried out in one direction (from a transmitter to a receiver) or in both directions (between a transmitter and a receiver or between receivers) by connecting to a communication network by a fixed line or wirelessly through a modem 2004. The operation of the television device can be carried out by switches incorporated in the chassis or by a remote control device 2006, which is separated from the main body. A display portion 2007 that displays information to be outputted may also be provided in this remote control device.

In addition, in the television device, a structure for displaying a channel, sound volume, or the like may be additionally provided by forming a sub-screen 2008 with a second display panel in addition to the main screen 2003. In this structure, the main screen 2003 may be formed of an EL display panel superior in a viewing angle, and the sub-screen may be formed of a liquid crystal display panel capable of display with low power consumption. In order to prioritize low power consumption, a structure in which the main screen 2003 is formed of a liquid crystal display panel, the sub-screen is formed of an EL display panel, and the sub-screen is able to flash on and off may also be employed. Obviously, both of the main-screen and the sub-screen may be formed by using an EL display panel in accordance with the present invention. By the present invention, a highly reliable display device can be manufactured even by using such a large substrate with many TFTs and electronic parts.

FIG. 20B shows a television device having a large display portion of, for example, 20 to 80 inches, which includes a chassis 2010, a keyboard 2012 which is an operation portion, a display portion 2011, a speaker unit 2013, and the like. The present invention is applied to manufacture the display portion 2011. FIG. 20B shows a television device having a curved display portion because a bendable substance is used for the display portion. The shape of the display portion can be freely designed in this manner, and thus, a television device having a desired shape can be manufactured.

In accordance with the present invention, a display device can be manufactured through a simplified process, and thus, the cost can be reduced. Hence, even a television device with a large screen display portion can be formed at low cost by applying the present invention. Accordingly, a high-performance and highly reliable television device can be manufactured with high yield.

The present invention is not limited to the television device and is also applicable to various usages such as display mediums having a large area, for example, a monitor of a personal computer, an information display board at a train station, an airport, or the like, or an advertisement display board on the street.

Embodiment Mode 8

This embodiment mode will be described with reference to FIGS. 21A and 21B. This embodiment mode shows an example of a module to which a panel having a display device manufactured in Embodiment Modes 1 to 7 is applied.

Figure 21A:
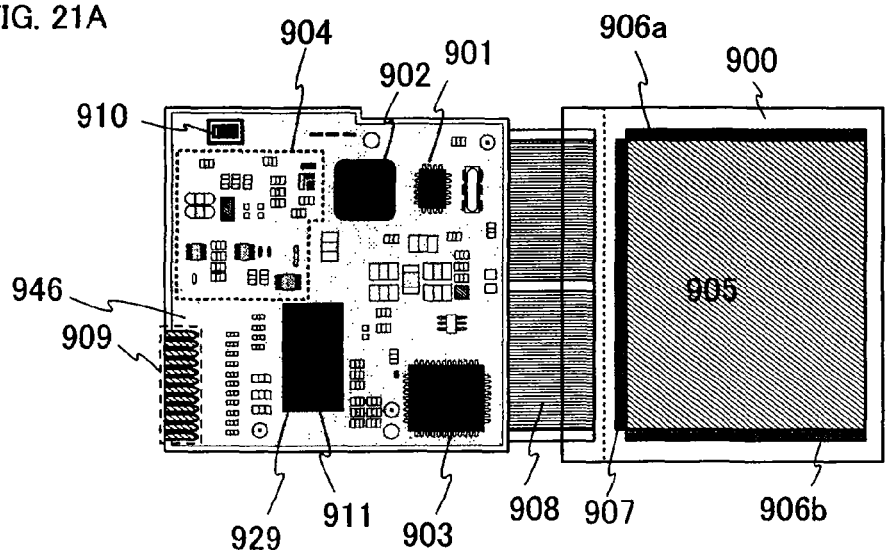
FIGS. 21A and 21B are views each illustrating an electronic device to which the present invention is applied.

An information terminal module shown in FIG. 21A includes a printed wiring board 946 over which a controller 901, a central processing unit (CPU) 902, a memory 911, a power source circuit 903, an audio processing circuit 929, a transmission/reception circuit 904, and other elements such as a resistor, a buffer, and a capacitor element are mounted. Further, a panel 900 is connected to the printed wiring board 946 through a flexible printed circuit (FPC) 908.

The panel 900 includes a pixel portion 905 in which each pixel has a light-emitting element, a first scanning line driver circuit 906*a* and a second scanning line driver circuit 906*b* which select a pixel in the pixel portion 905, and a signal line driver circuit 907 which supplies a video signal to the selected pixel.

Various control signals are inputted and outputted through an interface (I/F) 909 provided over the printed wiring board 946. An antenna port 910 for transmitting and receiving signals with an antenna is provided over the printed wiring board 946.

It is to be noted that the printed wiring board 946 is connected to the panel 900 through the FPC 908 in this embodiment mode; however, the present invention is not limited to this structure. The controller 901, the audio processing circuit 929, the memory 911, the CPU 902 or the power source circuit 903 may be directly mounted on the panel 900 by a COG (Chip on Glass) method. Further, various elements such as a capacitor element and a buffer are provided over the printed wiring board 946, thereby preventing a noise from occurring in the power source voltage and signals, and the signal rise time from becoming slow.

Figure 21B:
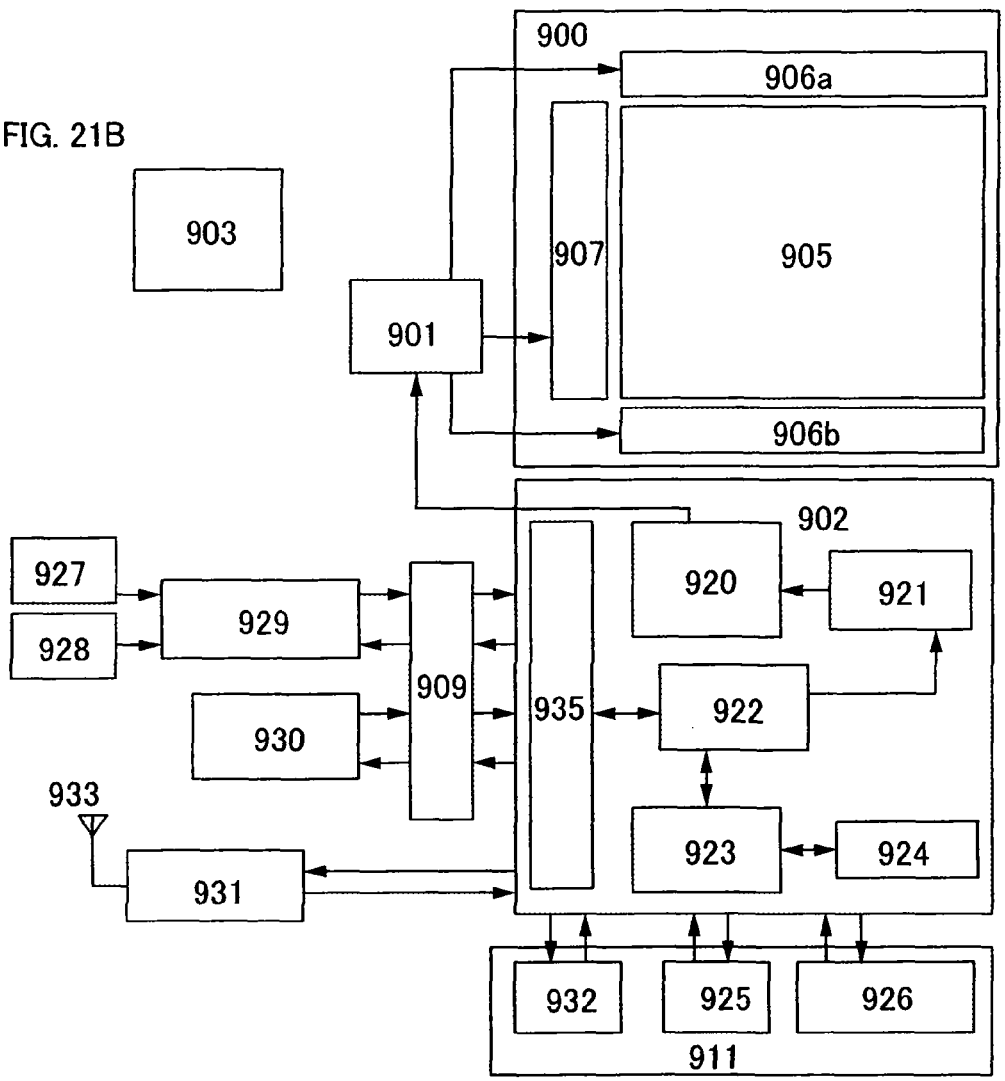

FIG. 21B is a block diagram of the module shown in FIG. 21A. This module 999 includes a VRAM 932, a DRAM 925, a flash memory 926 and the like as the memory 911. The VRAM 932 stores data on the image to be displayed on a panel, the DRAM 925 stores image data or audio data, and the flash memory 926 stores various programs.

The power source circuit 903 generates a power source voltage applied to the panel 900, the controller 901, the CPU 902, the audio processing circuit 929, the memory 911, and the transmission/reception circuit 931. There is a case where a current source is provided in the power source circuit 903 depending on the specifications of the panel.

The CPU 902 includes a control signal generating circuit 920, a decoder 921, a register 922, an arithmetic circuit 923, a RAM 924, an interface 935 for the CPU and the like. Various signals inputted to the CPU 902 through the interface 935 are held in the register 922, and then inputted to the arithmetic circuit 923, the decoder 921 and the like. In the arithmetic circuit 923, an arithmetic operation is performed based on the inputted signal, and the address of various instructions is determined. Meanwhile, a signal inputted to the decoder 921 is decoded and inputted to the control signal generating circuit 920. The control signal generating circuit 920 generates a signal containing various instructions based on the inputted signal, and then transmits the signals to the address determined by the arithmetic circuit 923, specifically, the memory 911, the transmission/reception circuit 931, the audio processing circuit 929, the controller 901 or the like.

Each of the memory 911, the transmission/reception circuit 931, the audio processing circuit 929, and the controller 901 operates in accordance with the received instruction. The operation thereof is briefly described below.

A signal inputted from an input means 930 is transmitted to the CPU 902 which is mounted on the printed wiring board 946 through the interface 909. The control signal generating circuit 920 converts the image data stored in the VRAM 932 into a predetermined format based on the signal transmitted from the input means 930 such as a pointing device or a keyboard, and transmits the data to the controller 901.

The controller 901 processes the signals containing image data transmitted from the CPU 902 in accordance with the specifications of the panel, and then transmits the signals to the panel 900. Further, the controller 901 generates an Hsync signal, a Vsync signal, a clock signal CLK, an alternating current voltage (AC Cont), and a switching signal L/R based on the power source voltage inputted from the power source circuit 903 and the various signals inputted from the CPU 902, and supplies the signals to the panel 900.

The transmission/reception circuit 904 processes signals which are transmitted and received as electromagnetic waves by an antenna 933. Specifically, the transmission/reception circuit 904 includes high frequency circuits such as an isolator, a band pass filter, a VCO (Voltage Controlled Oscillator), an LPF (Low Pass Filter), a coupler, and a balun. A signal containing audio information among the signals transmitted and received by the transmission/reception circuit 904 is transmitted to the audio processing circuit 929 in accordance with the instruction of the CPU 902.

The signal containing audio information transmitted in accordance with the instruction of the CPU 902 is demodulated into an audio signal by the audio processing circuit 929 and transmitted to a speaker 928. An audio signal transmitted from a microphone 927 is modulated by the audio processing circuit 929 and transmitted to the transmission/reception circuit 904 in accordance with the instruction of the CPU 902.

The controller 901, the CPU 902, the power source circuit 903, the audio processing circuit 929, and the memory 911 can be mounted as a package of this embodiment mode. This embodiment mode can be applied to any circuits but a high frequency circuit such as an isolator, a band pass filter, a VCO (Voltage Controlled Oscillator), an LPF (Low Pass Filter), a coupler, or a balun.

Embodiment Mode 9

Figure 22:
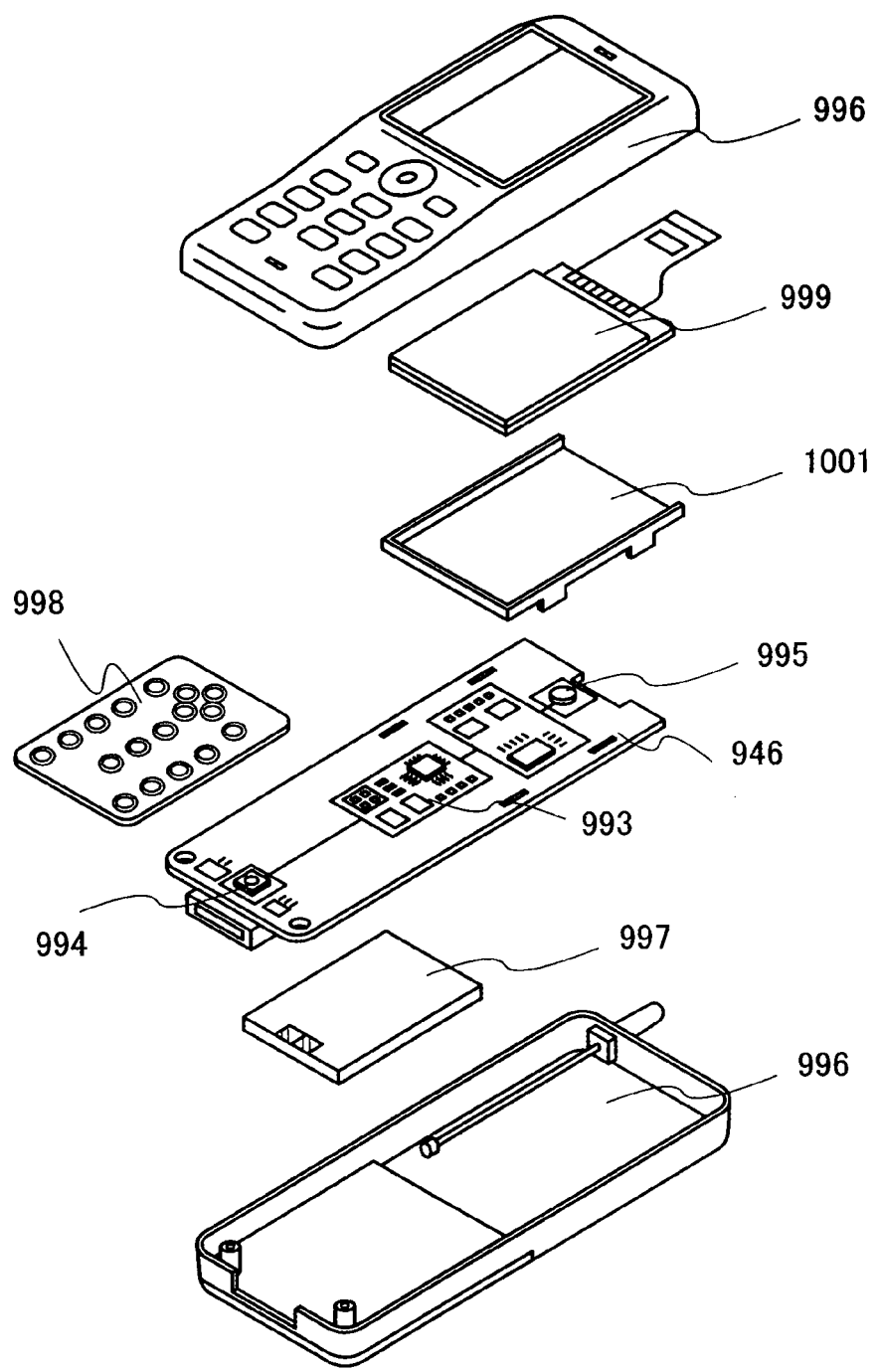
FIG. 22 is a view illustrating an electronic device to which the present invention is applied.

This embodiment mode will be described with reference to FIGS. 21A and 21B, and 22. FIG. 22 shows an example of a wireless portable compact phone (mobile phone) including a module manufactured in this embodiment mode 9. A panel 900 is incorporated into a housing 1001 to be detachable so as to be easily in combination with a module 999. The shape and size of the housing 1001 can be appropriately changed in accordance with an electronic device which is incorporated.

The housing 1001 to which the panel 900 is fixed is mounted on a printed wiring board 946 and completed as a module. Over the printed wiring board 946, a controller, a CPU, a memory, a power source circuit, and other elements such as a resistor, a buffer, and a capacitor element are mounted. Further, an audio processing circuit including a microphone 994 and a speaker 995, and a signal processing circuit 993 such as a transmission/reception circuit are provided. The panel 900 is connected to the printed wiring board 946 through an FPC 908.

Such a module 999, an input means 998, and a buttery 997 are stored in a chassis 996. A pixel portion of the panel 900 is arranged to be seen from an opening window formed in the chassis 996.

The chassis 996 shown in FIG. 22 is an example of an external appearance of a phone. However, an electronic device in accordance with this embodiment mode may be changed into various modes depending on the function and application. An example of the modes will be described in the following embodiment mode.

Embodiment Mode 10

By applying the present invention, various display devices can be manufactured. In other words, the present invention can be applied to various electronic devices into which the various display devices are incorporated as a display portion.

Such electronic devices include a camera such as a video camera or a digital camera, a projector, a head mount display (a goggle type display), a car navigation, a car stereo, a personal computer, a game machine, a mobile information terminal (a mobile computer, a mobile phone, an electronic book, or the like), an image reproducing device equipped with a recording medium (specifically, a device for reproducing a recording medium such as Digital Versatile Disc (DVD) and including a display for displaying the image), and the like. FIGS. 19A to 19D show examples thereof.

Figure 19A:
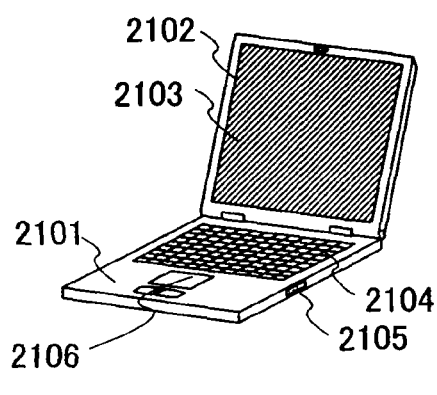
FIGS. 19A to 19D are views illustrating electronic devices to which the present invention is applied.

FIG. 19A shows a computer, which includes a main body 2101, a chassis 2102, a display portion 2103, a keyboard 2104, an external connection port 2105, a pointing mouse 2106, and the like. By the present invention, a highly reliable computer which displays an image with high quality can be manufactured even when the computer becomes compact and a pixel thereof becomes minute.

Figure 19B:
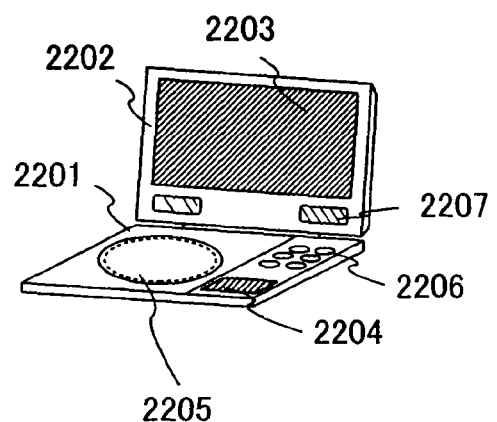

FIG. 19B shows an image reproducing device equipped with a recording medium (specifically a DVD reproducing device), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information. By the present invention, a highly reliable image reproducing device which displays an image with high quality can be manufactured even when the image reproducing device becomes compact and a pixel thereof becomes minute.

Figure 19C:
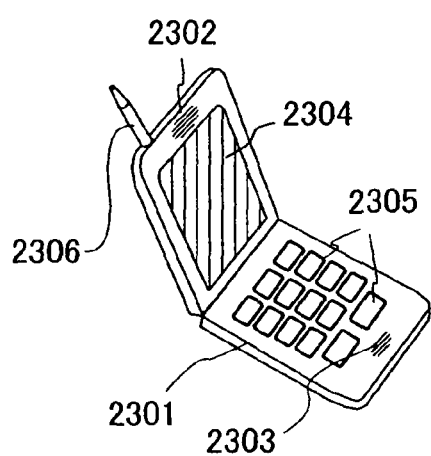

FIG. 19C shows a mobile phone, which includes a main body 2301, an audio output portion 2302, an audio input portion 2303, a display portion 2304, operation switches 2305, an antenna 2306, and the like. By the present invention, a highly reliable mobile phone which displays an image with high quality can be manufactured even when the mobile phone becomes compact and a pixel thereof becomes minute.

Figure 19D:
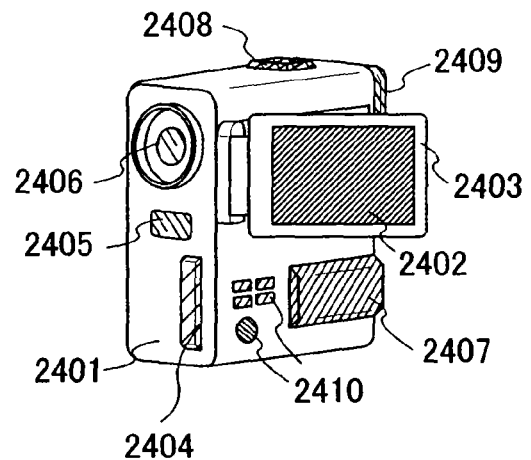

FIG. 19D shows a video camera, which includes a main body 2401, a display portion 2402, a chassis 2403, an external connection port 2404, a remote control receiving portion 2405, an image receiving portion 2406, a battery 2407, an audio input portion 2408, an eyepiece 2409, operation keys 2410, and the like. By the present invention, a highly reliable video camera which displays an image with high quality can be manufactured even when the video camera becomes compact and a pixel thereof becomes minute. This embodiment mode can be arbitrarily combined with each of the above embodiment modes.

Embodiment Mode 11

In this embodiment mode, other structures which can be applied to a light-emitting element of the present invention will be described with reference to FIGS. 29A to 29C, and 30A to 30C.

Light-emitting elements utilizing electroluminescence are classified according to whether a light-emitting material is an organic compound or an inorganic compound, and generally, the former is referred to as an organic EL element and the latter is referred to as an inorganic EL element.

Inorganic EL elements are classified into a dispersion-type inorganic EL element and a thin film inorganic EL element depending on an element structure. The elements of the both types are different in that the dispersion-type inorganic EL element has an electroluminescent layer in which particles of a light-emitting material are dispersed in a binder, and the thin film inorganic EL element has an electroluminescent layer formed by a thin film of a light-emitting material. However, there is a common point that electrons accelerated by a high electric field are required by the both elements. As a mechanism of light emission that is obtained, donor-acceptor recombination emission utilizing a donor level and an acceptor level, and localized emission utilizing an inner-shell electron transition of a metal ion are given. In general, the dispersion type inorganic EL element exhibits donor-acceptor recombination emission, and the thin film inorganic EL element exhibits localized emission.

A light-emitting material that can be used in the present invention is composed of a host material and an impurity element serving as a light-emission center. By changing an impurity element that is contained, light-emission of various colors can be obtained. As a method for manufacturing a light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a method in which the above method and high-temperature baking are combined, or a freeze-drying method can also be used.

The solid phase method is a method in which a host material and an impurity element or a compound containing an impurity element are weighed, mixed in a mortar, and reacted with each other by heating and baking in an electric furnace so that the impurity element is made to be contained in the host material. A baking temperature is preferably 700 to 1500° C. This is because solid phase reaction is not progressed at a temperature that is too low and the host material is decomposed at a temperature that is too high. Baking may be performed in a powder state; however, it is preferable to perform baking in a pellet state. This method requires baking at a temperature that is comparatively high but is simple, and thus, this method has high productivity and is suitable for mass production.

The liquid phase method (coprecipitation method) is a method in which a host material or a compound containing a host material and an impurity element or a compound containing an impurity element are reacted with each other in a solution and dried, and then, baked. In this method, particles of the light-emitting material are uniformly dispersed, the particle has a small diameter, and reaction can be progressed even when a baking temperature is low.

As a host material for the light-emitting material, sulfide, oxide, or nitride can be used. As the sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As the oxide, for example, zinc oxide (ZnO), yttrium oxide ($Y_2O_3$), or the like can be used. Further, as the nitride, for example, aluminum nitride (AlN), gallium nitride (GaN), indium nitride (InN), or the like can be used. In addition, zinc selenide (ZnSe), zinc telluride (ZnTe), or the like can also be used. A ternary mixed crystal such as calcium gallium sulfide ($CaGa_2S_4$), strontium gallium sulfide ($SrGa_2S_4$), or barium gallium sulfide ($BaGa_2S_4$) may also be used.

As a light-emission center of the localized emission, manganese (Mn), copper (Cu), samarium (Sm), terbium (Tb), erbium (Er), thulium (Tm), europium (Eu), cerium (Ce), praseodymium (Pr), or the like can be used. As charge compensation, a halogen element such as fluorine (F) or chlorine (Cl) may be added.

On the other hand, as a light-emission center of the donor-acceptor recombination emission, a light-emitting material containing a first impurity element forming a donor level and a second impurity element forming an acceptor level can be used. As the first impurity element, for example, fluorine (F), chlorine (Cl), aluminum (Al), or the like can be used. As the second impurity element, for example, copper (Cu), silver (Ag), or the like can be used.

When a light-emitting material for the donor-acceptor recombination emission is synthesized by the solid phase method, a host material, a first impurity element or a compound containing a first impurity element, and a second impurity element or a compound containing a second impurity element are each weighed, mixed in a mortar, and heated and baked in an electric furnace. As the host material, the host material as described above can be used, and as the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. A baking temperature is preferably 700 to 1500° C. This is because solid phase reaction is not progressed at a temperature that is too low and the host material is decomposed at a temperature that is too high. Baking may be performed in a powder state; however, it is preferable to perform baking in a pellet state.

In addition, as an impurity element in a case of utilizing the solid phase reaction, a compound formed of the first impurity element and the second impurity element may also be combined to be used. In such a case, the impurity element can be easily dispersed and the solid phase reaction can be easily progressed, and thus, a uniform light-emitting material can be obtained. Further, since an extra impurity element is not contained, a light-emitting material with high purity can be obtained. As the compound formed of the first impurity element and the second impurity element, for example, copper chloride (CuCl), silver chloride (AgCl), or the like can be used.

It is to be noted that a concentration of these impurity elements may be 0.01 to 10 atom % with respect to the host material, and preferably in a range of 0.05 to 5 atom %.

In a case of the thin film inorganic EL element, an electroluminescent layer is a layer containing the above light-emitting material and can be formed by a vacuum evaporation method such as a resistance heating evaporation method or an electron beam evaporation (EB evaporation) method, a physical vapor deposition (PVD) method such as a sputtering method, a chemical vapor deposition method (CVD) such as an organic metal CVD method or a hydride transfer low pressure CVD method, an atomic layer epitaxy method (ALE), or the like.

Figure 29A:
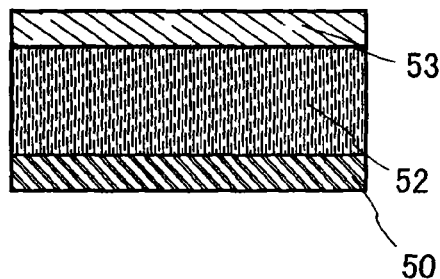
FIGS. 29A to 29C are views each illustrating a structure of a light-emitting element which can be applied to the present invention.
Figure 29B:
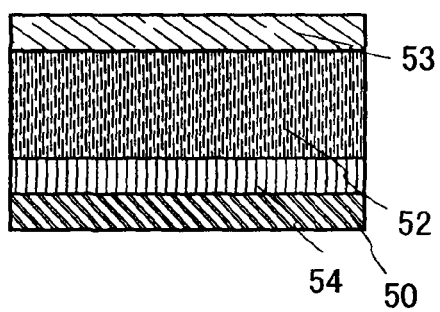
Figure 29C:
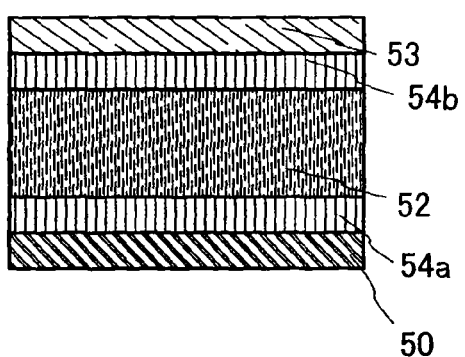

FIGS. 29A to 29C show examples of a thin film inorganic EL element that can be used as a light-emitting element. In FIGS. 29A to 29C, the light-emitting element includes a first electrode layer 50, an electroluminescent layer 52, and a second electrode layer 53.

The light-emitting elements shown in FIGS. 29B and 29C have a structure in which an insulating layer is provided between the electrode layer and the electroluminescent layer in the light-emitting element shown in FIG. 29A. The light-emitting element shown in FIG. 29B includes an insulating layer 54 between the first electrode layer 50 and the electroluminescent layer 52. The light-emitting element shown in FIG. 29C includes an insulating layer 54a between the first electrode layer 50 and the electroluminescent layer 52, and an insulating layer 54b between the second electrode layer 53 and the electroluminescent layer 52. As described above, the insulating layer may be provided between the electroluminescent layer and one of a pair of the electrode layers interposing the electroluminescent layer, or between the electroluminescent layer and both of the electrode layers. The insulating layer may be a single layer or a stacked layer including plural layers.

In addition, although the insulating layer 54 is provided to be in contact with the first electrode layer 50 in FIG. 29B, the insulating layer and the electroluminescent layer may be provided in the reversed order, and the insulating layer 54 may be provided to be in contact with the second electrode layer 53.

In a case of the dispersion type inorganic EL element, particles of a light-emitting material are dispersed in a binder to form an electroluminescent layer having a film shape. The light-emitting material is processed into particles. When a particle having a desired size cannot be sufficiently obtained by a manufacturing method of the light-emitting material or the like, the light-emitting material is crushed in a mortar or the like and processed into particles. The binder is a substance for fixing particles of the light-emitting material in a dispersed state and keeping a shape as an electroluminescent layer. The light-emitting material is uniformly dispersed and fixed in an electroluminescent layer by the binder.

In a case of the dispersion type inorganic EL element, an electroluminescent layer can be formed by using a droplet-discharge method which can selectively form an electroluminescent layer, a printing method (screen printing, offset printing, or the like), a coating method such as a spin coating method, a dipping method, a dispenser method, or the like. A thickness is not particularly limited, but is preferably in a range of 10 to 1000 nm. Further, in an electroluminescent layer containing the light-emitting material and the binder, the ratio of the light-emitting material is preferably 50 wt % or more and 80 wt % or less.

Figure 30A:
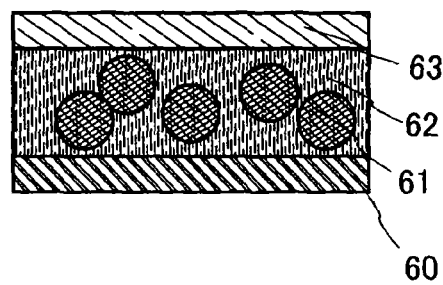
FIGS. 30A to 30C are views each illustrating a structure of a light-emitting element which can be applied to the present invention.
Figure 30B:
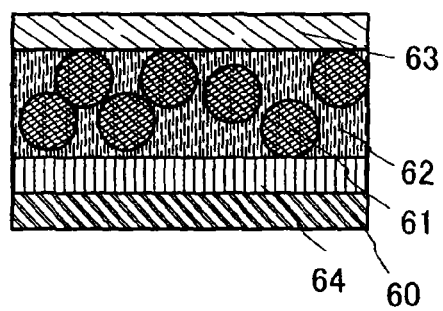
Figure 30C:
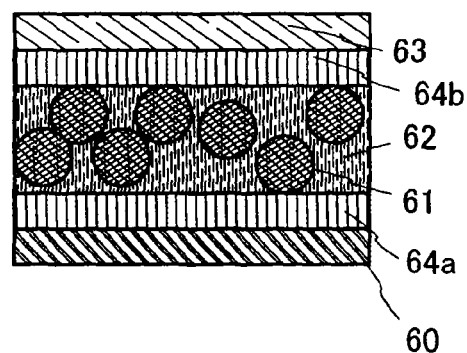

FIGS. 30A to 30C show examples of a dispersion type inorganic EL element that can be used as a light-emitting element. The light-emitting element shown in FIG. 30A has a stacked structure of a first electrode layer 60, an electroluminescent layer 62, and a second electrode layer 63, in which the electroluminescent layer 62 includes a light-emitting material 61 held by a binder.

As a binder that can be used in this embodiment mode, an insulating material can be used. More specifically, an organic material, an inorganic material, or a mixed material of an organic material and an inorganic material can be used. As an organic insulating material, the following resin materials can be used: a polymer having a comparatively high dielectric constant such as a cyanoethyl cellulose based resin, polyethylene, polypropylene, a polystyrene based resin, a silicone resin, an epoxy resin, vinylidene fluoride, or the like. In addition, a heat-resistant high-molecular material such as aromatic polyamide or polybenzimidazole, or a siloxane resin may also be used. The siloxane resin is a resin including a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. In addition, as a substituent, both of an organic group containing at least hydrogen and a fluoro group may also be used. Further, the following resin material may also be used: a vinyl resin such as poly(vinyl alcohol) or poly(vinyl butyral), a phenol resin, a novolac resin, an acrylic resin, a melamine resin, an urethane resin, an oxazole resin (polybenzoxazole), or the like. In addition, for example, a photo-curable resin or the like can be used. Fine particles having a high dielectric constant such as barium titanate ($BaTiO_3$) or strontium titanate ($SrTiO_3$) can also be mixed to these resins moderately to adjust a dielectric constant.

An inorganic insulating material contained in the binder can be formed by a material selected from silicon oxide ($SiO_x$), silicon nitride ($SiN_x$), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnO, and other substance containing an inorganic insulating material. When an inorganic material having a high dielectric constant is made to be contained in an organic material (by adding or the like), a dielectric constant of an electroluminescent layer formed of a light-emitting material and a binder can be more effectively controlled and can be much higher.

In a manufacturing process, a light-emitting material is dispersed in a solution containing a binder. As a solvent of a solution containing a binder that can be used in this embodiment mode, a solvent may be appropriately selected, which can dissolve a binder material and can form a solution having viscosity suitable for a method of forming an electroluminescent layer (various wet processes) and a desired thickness. An organic solvent or the like can be used, and when, for example, a siloxane resin is used as a binder, propylene glycol monomethyl ether, propylene glycol monomethyl ether acetate (also referred to as PGMEA), 3-methoxy-3-methyl-1-butanol (also referred to as MMB), or the like can be used.

Light-emitting elements shown in FIGS. 30B and 30C have a structure in which an insulating layer is provided between an electrode layer and an electroluminescent layer in a light-emitting element shown in FIG. 30A. The light-emitting element shown in FIG. 30B includes an insulating layer 64 between a first electrode layer 60 and an electroluminescent layer 62. The light-emitting element shown in FIG. 30C includes an insulating layer 64a between the first electrode layer 60 and the electroluminescent layer 62, and an insulating layer 64b between the second electrode layer 63 and the electroluminescent layer 62. As described above, the insulating layer may be provided between the electroluminescent layer and one of a pair of the electrode layers interposing the electroluminescent layer, or between the electroluminescent layer and both of the electrode layers. The insulating layer may be a single layer or a stacked layer including plural layers.

In addition, although the insulating layer 64 is provided to be in contact with the first electrode layer 60 in FIG. 30B, the insulating layer and the electroluminescent layer may be provided in the reversed order, and the insulating layer 64 may be provided to be in contact with the second electrode layer 63.

An insulating layer such as the insulating layer 54 in FIGS. 29B and 29C or the insulating layer 64 in FIGS. 30B and 30C has no particular limitation, but preferably has a high insulating resistant property and dense film quality, furthermore, a high dielectric constant. For example, silicon oxide ($SiO_x$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film of the material or a stacked film including two or more kinds of the materials can be used. These insulating films can be formed by sputtering, evaporation, CVD, or the like. In addition, the insulating layer may be formed by dispersing particles of the insulating material in a binder. A binder material may be formed by the same material and the same method as a binder contained in the electroluminescent layer. A thickness is not particularly limited, but is preferably in a range of 10 to 1000 nm.

The light-emitting element described in this embodiment mode emits light by applying a voltage between a pair of the electrode layers interposing the electroluminescent layer, and can be operated by either DC driving or AC driving.

In the present invention, a transparent conductive film formed of a light-transmitting conductive material may be used for one or both of a pair of the electrode layers of the light-emitting element, and indium oxide containing tungsten oxide, indium zinc oxide containing tungsten oxide, indium oxide containing titanium oxide, indium tin oxide containing titanium oxide, or the like can be used.

Further, silicon oxide may be added into indium oxide containing tungsten oxide, indium zinc oxide containing tungsten oxide, indium oxide containing titanium oxide, and indium tin oxide containing titanium oxide. In a sputtering method where a thin film is formed by sputtering a target, unevenness called a nodule is generated on a target surface to which sputtering is performed. When a target having such an uneven shape is used, a film with uniform composition cannot be formed, a large lump of a material is generated like a dust in the film, and a dense film cannot be obtained. When sputtering is performed by using a target in which silicon oxide is added into a transparent conductive material as described above, unevenness on the target surface can be reduced, and a uniform and dense film can be obtained.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

In this embodiment mode, the electrode layer is formed by using indium zinc oxide containing silicon oxide and tungsten oxide by a sputtering method using a gas containing water ($H_2O$) or $H_2$. In this embodiment mode, a gas containing 50 sccm of argon (Ar), 1.0 sccm of oxygen ($O_2$), and 0.2 sccm of $H_2$ is used. In a case of using an $H_2O$ gas, the flow rate is preferably 0.5 sccm or less. The indium zinc oxide film containing silicon oxide and tungsten oxide formed in this embodiment mode has favorable processability, and can be etched without leaving a residue by wet etching using an etchant such as weak acid.

In addition, when an insulating layer formed by a sputtering method is provided between the electroluminescent layer and the electrode layer (the first electrode layer or the second electrode layer, or both thereof) in the light-emitting element in this embodiment mode, the first electrode layer can be formed by sputtering as in the present invention and the insulating layer can also be formed continuously by sputtering. In such a case, since the first electrode layer and the insulating layer can be formed without breaking vacuum, an interface can be kept clean and contamination can be prevented. Further, since the first electrode layer is a film having high planarity with fewer etching defects, coverage of the electroluminescent layer that is stacked is favorable. Therefore, the electroluminescent layer can be thinner, and further, light extraction efficiency is improved because a light-transmitting property is enhanced.

This embodiment mode can be arbitrarily combined with the other embodiment modes described above.

When the electrode layer of the light-emitting element is manufactured by using the present invention, that is, an indium zinc oxide film containing silicon oxide and tungsten oxide that is a light-transmitting electrode is manufactured by using a gas containing an $H_2O$ gas or an $H_2$ gas, a film can be obtained, which has high transmittance in a visible light region, low resistivity, and favorable processability. By using such a film for a pixel electrode of a display device, a highly reliable display device can be manufactured, in which light extraction efficiency of a light-emitting element is favorable and defects due to an etching defect of an electrode or the like are suppressed.

Embodiment 1

In this embodiment, a measurement result of characteristics of an indium zinc oxide film containing tungsten oxide that is used as an electrode layer in the present invention will be shown.

An indium zinc oxide film containing tungsten oxide (hereafter also referred to as an IWZO film) was formed by using indium zinc oxide containing tungsten oxide as a target by sputtering. The film formation condition is as follows: pressure is 0.4 Pa, and as for a gas that is used, the flow rate of an argon gas is 50 sccm, the flow rate of oxygen is 1.0 sccm, and the flow rate of an $H_2O$ gas is changed, such as 0.5 sccm, 0.2 sccm, 0.25 sccm, and 0.1 sccm. Then, characteristics of each sample were examined.

Figure 28:
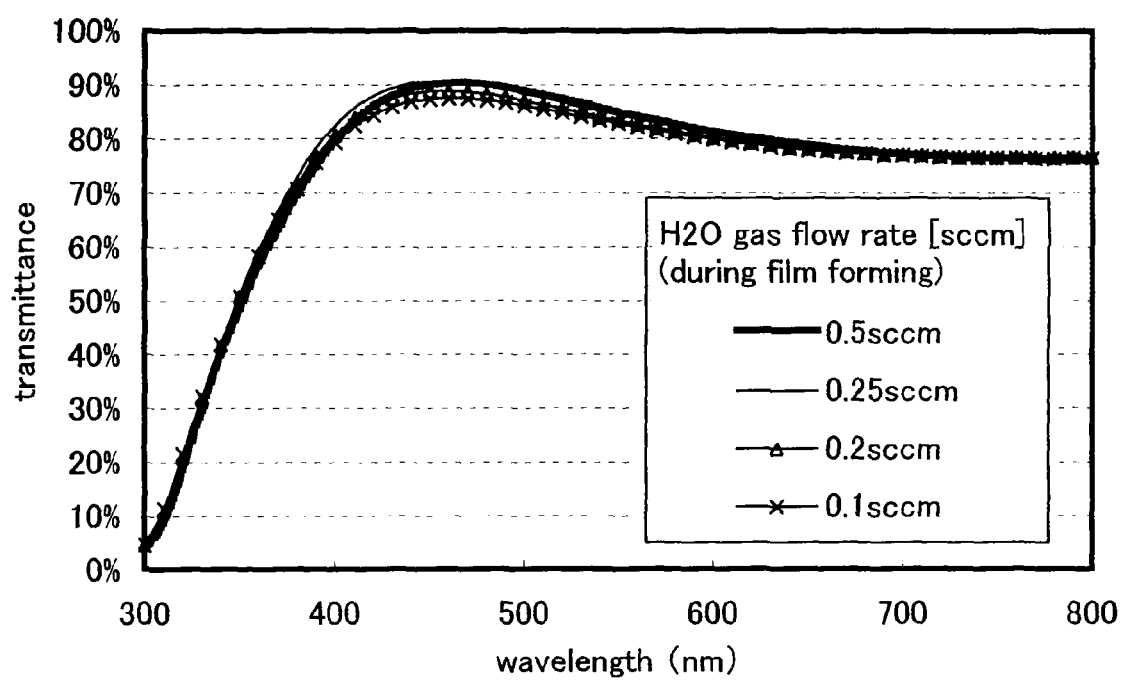
FIG. 28 is a graph showing transmittance data of a sample shown in Embodiment 1.

The samples were heated at 320° C. for one hour after being formed. This is because, by considering an actual step, there is a case of performing a heating step after a pixel electrode is formed. FIG. 28 shows transmittance with respect to a wavelength of each IWZO film formed by the condition of the $H_2O$ gas flow rate of 0.5 sccm, 0.2 sccm, 0.25 sccm, or 0.1 sccm. Each IWZO film formed by the condition of the $H_2O$ gas flow rate of 0.5 sccm, 0.2 sccm, 0.25 sccm, or 0.1 sccm showed high transmittance from 80 to 90% in a visible light wavelength region. Therefore, it was confirmed that light extraction efficiency is high without shielding or absorbing visible light when the film is used as a pixel electrode because visible light emitted from a light-emitting element can be transmitted well.

Figure 27:
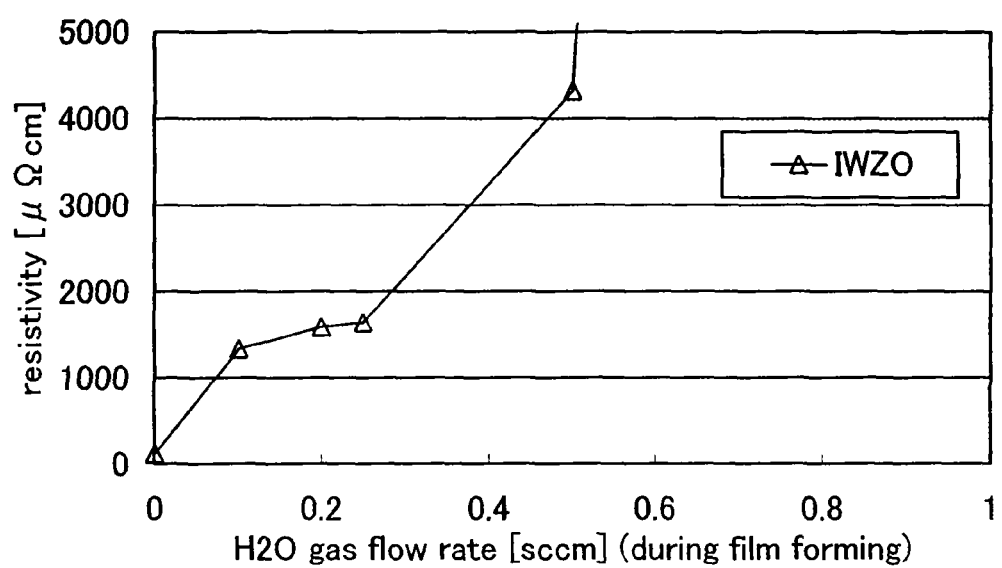
FIG. 27 is a graph showing resistivity data with respect to $H_2O$ gas flow rate of a sample shown in Embodiment 1.

FIG. 27 shows resistivity of each IWZO film formed by the condition of the $H_2O$ gas flow rate of 0.5 sccm, 0.2 sccm, 0.25 sccm, or 0.1 sccm. In the IWZO film, resistivity became higher as the $H_2O$ gas flow rate was increased. When the $H_2O$ gas flow rate is 0.25 sccm or lower, the resistivity is preferable for a pixel electrode.

Figure 25:
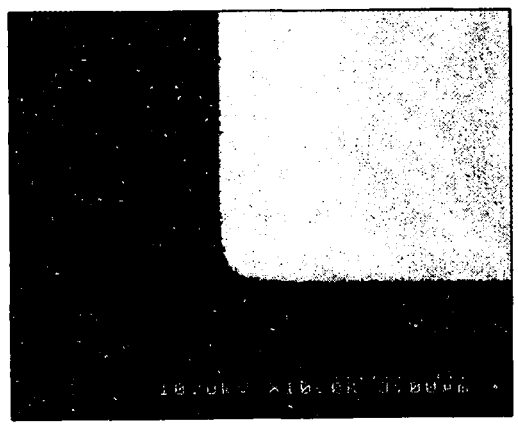
FIG. 25 is a SEM photograph of a sample shown in Embodiment 1.
Figure 26:
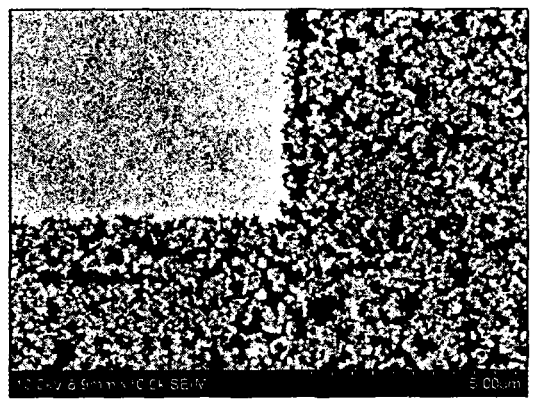
FIG. 26 is a SEM photograph of a sample shown in Embodiment 1.

An IWZO film formed without adding an $H_2O$ gas and an IWZO film formed by the condition of the $H_2O$ gas flow rate of 0.5 sccm were processed by wet etching using weak acid, and processability was examined. FIGS. 25 and 26 show SEM photographs by observation using a scanning electron microscope (SEM) after the processing. In FIG. 26, the IWZO film that was formed without adding an $H_2O$ gas is shown, and the film is not sufficiently etched and a residue is still observed. On the other hand, in FIG. 25, the IWZO film that was formed by adding an $H_2O$ gas is shown, and the film is sufficiently etched without a residue, and thus, it was confirmed that the film was precisely processed. Therefore, the IWZO film that is formed by adding an $H_2O$ gas has favorable processability.

According to the results, when an IWZO film is formed by a sputtering method, processability of the obtained IWZO film is favorable by adding an $H_2O$ gas. In a case where, as for a gas to be used, the flow rate of an argon gas is 50 sccm and the flow rate of oxygen is 1.0 sccm, resistivity can be lowered when the flow rate of an added $H_2O$ gas is made to be 0.25 sccm or lower. From the results of this experiment, it is confirmed that, in a preferable gas for forming an IWZO film by a sputtering method, the flow rate of an argon gas is 50 sccm, the flow rate of oxygen is 1.0 sccm, and the flow rate of an $H_2O$ gas is 0.2 sccm.

Therefore, when an indium zinc oxide film containing tungsten oxide is formed as a light-transmitting electrode using a gas containing an $H_2O$ gas, a film can be obtained, which has high transmittance in a visible light region, low resistivity, and favorable processability. By using such a film for a pixel electrode of a display device, a highly reliable display device can be manufactured, in which light extraction efficiency of a light-emitting element is favorable and defects due to an etching defect of an electrode or the like are suppressed.

This application is based on Japanese Patent Application serial no. 2005-141899 filed on May 13, 2005, in Japan Patent Office, the entire contents of which are hereby incorporated by reference.

What is claimed is:

1. A display device comprising:
   a first insulating layer comprising a resin;
   a second insulating layer comprising a silicon nitride oxide film over and in contact with the first insulating layer;
   a titanium nitride film over and in contact with the second insulating layer;
   a reflective electrode layer over and in contact with the titanium nitride film;
   a first electrode layer over the reflective electrode layer;
   an electroluminescent layer over the first electrode layer; and
   a second electrode layer over the electroluminescent layer,
   wherein in a cross section, outermost side end portions of the second insulating layer, the titanium nitride film, and the reflective electrode layer are aligned with one another.

2. The display device according to claim 1,
   wherein an entirety of a portion of the electroluminescent layer overlaps the reflective electrode layer, and
   wherein the portion of the electroluminescent layer is in contact with the first electrode layer.

3. The display device according to claim 1, further comprising a transistor electrically connected to the reflective electrode layer.

4. The display device according to claim 1, wherein the first electrode layer includes comprises indium zinc oxide containing tungsten oxide.

5. The display device according to claim 1, wherein the first electrode layer includes comprises indium zinc oxide containing silicon oxide and tungsten oxide.

6. The display device according to claim 1, wherein the second electrode layer includes comprises indium zinc oxide containing tungsten oxide.

7. The display device according to claim 1, wherein the second electrode layer includes comprises indium zinc oxide containing silicon oxide and tungsten oxide.

8. The display device according to claim 1, wherein the reflective electrode layer includes titanium, tungsten, nickel, gold, platinum, silver, aluminum, magnesium, calcium, lithium, or an alloy thereof.

9. The display device according to claim 1, wherein the electroluminescent layer includes a layer containing an organic compound and an inorganic compound to be in contact with the first electrode layer.

10. The display device according to claim 1, wherein a top surface of the reflective electrode layer is covered by the first electrode layer in a region where light emitted from the electroluminescent layer is extracted.

* * * * *